(12) United States Patent
Matsumoto et al.

(10) Patent No.: US 6,650,582 B2
(45) Date of Patent: Nov. 18, 2003

(54) SEMICONDUCTOR MEMORY DEVICE

(75) Inventors: Junko Matsumoto, Hyogo (JP); Tadaaki Yamauchi, Hyogo (JP); Takeo Okamoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/211,339

(22) Filed: Aug. 5, 2002

(65) Prior Publication Data

US 2003/0081479 A1 May 1, 2003

(30) Foreign Application Priority Data

Oct. 29, 2001 (JP) ........................................ 2001-331362

(51) Int. Cl.$^7$ ................................................. G11C 7/00
(52) U.S. Cl. .............. 365/201; 365/230.03; 365/189.03
(58) Field of Search ........................... 365/201, 230.03, 365/189.03, 189.01, 63, 230.06

(56) References Cited

U.S. PATENT DOCUMENTS

| 5,831,924 A | * | 11/1998 | Nitta et al. ............ 365/230.03 |
| 6,166,989 A | * | 12/2000 | Hamamoto et al. ......... 365/233 |
| 6,335,887 B1 | * | 1/2002 | Aoki et al. .................. 365/201 |
| 6,418,072 B2 | * | 7/2002 | Nakaya et al. .............. 365/201 |

* cited by examiner

Primary Examiner—Anh Phung
(74) Attorney, Agent, or Firm—McDermott, Will & Emery

(57) ABSTRACT

For a memory array, a main data bus commonly used for first and second data bit widths, and a main data bus used only for the second data bit width are disposed. According to a data bit width, connection between memory blocks and main data lines is switched. The main data buses are connected to write/read circuits, and expanding/compressing operation on data bits is performed by an expansion/compression circuit in a unit of a predetermined number of bits. Thus, with the same configuration irrespective of data bit width, compression of data bits in the multi-bit test can be performed to output the compression result to the same data terminal.

12 Claims, 26 Drawing Sheets

SEMICONDUCTOR MEMORY DEVICE

BACKGROUND OF THE INVENTION

1. Field of the Invention

The present invention relates to a semiconductor memory device and, more particularly, to a configuration of a data bus of a semiconductor memory device for allowing flexible alteration of an input/output data bit width. More particularly, the present invention relates to a configuration for carrying out a multi-bit test of compressing (degenerating) memory cell data of a plurality of bits to one-bit data.

2. Description of the Background Art

In a data processing system, the bit width of data transferred between a processor and a semiconductor memory varies according to a processor used. In order to achieve high data transfer speed and high processing speed, it is preferable that the bit width of transfer data is wide. In a semiconductor memory device, however, there is a restriction of a pitch condition of a pin terminal. Therefore, from the viewpoint of reduction in size of a package and the like, the upper limit exists in the data bit width.

It may be considered to dispose a plurality of semiconductor memory devices in parallel for use as a so-called module to widen the bit width of transfer. In this case, however, the scale of the system becomes large to be against the trend of down-sizing of the whole system.

In order to solve the problems as described above, with recent improvements in microfabrication technology, increase in memory capacity and miniaturization of a semiconductor memory device and reduction in pin terminal, a semiconductor memory device capable of inputting/outputting multi-bit data is being implemented. However, different systems to which the semiconductor memory device is applied have different bit widths of transfer data, and the semiconductor memory device is also required to maintain the compatibility with the previous generation. Thus, a semiconductor memory device having a plurality of kinds of bit widths of input/output data is fabricated on a common chip.

Specifically, when fabricating semiconductor memory devices having various bit widths of input/output data individually, since the internal configuration is the same irrespective of the data bit widths and only the data bit width of input/output data varies, the designing efficiency deteriorates and management of products also becomes complicated.

Generally, a semiconductor memory device is fabricated commonly to a plurality of kinds of data bit widths, and a data bit width is set by mask interconnection in slicing or by bonding option fixing a specific bonding pad at a predetermined voltage. The fabrication process can be made common for semiconductor memory devices of a plurality of kinds of data bit widths, common design can be used to design internal circuitry commonly to a plurality of kinds of input/output data bit widths. Thus, the design efficiency is improved.

In the case where a common semiconductor memory device is used for a plurality of kinds of data bit widths, the internal configuration is the same, and only an input/output circuit to be used is different for a different input/output data bit width. According to a data bit width to be used, connection between an internal data line and an input/output line is changed. In the case of connecting an internal data line to different input/output lines according to the data bit width to be used, the configuration for switching the connection of the internal data lines becomes complicated, and an internal interconnection is also made complicated.

When the correspondence relation between a write/read circuit for generating internal write/read data and an input/output circuit or connection between the write/read circuit and an internal data line is changed according to the data bit width to be used, switching of connection of an internal data line becomes complicated. The write/read circuit includes a preamplifier for amplifying read data from a memory cell and generating internal read data, and a write driver for generating data to a memory cell in accordance with internal data from a write data inputting circuit.

To assure reliability of a semiconductor memory device, a function test to determine whether data is accurately written/read is performed. Such function tests includes a multi-bit test in which a plurality of memory cells are tested simultaneously. Common data is first written into a plurality of memory cells, then data read from the plurality of memory cells is compressed to data of one bit, and the one-bit data is output. In such a multi-bit test, a plurality of memory cells are tested at a time, so that the test time can be shortened.

However, in the case of the configuration for adapting to a plurality of kinds of data bit widths, it is required to perform the multi-bit test according to the data bit width to be used. In addition, in the case of changing the connection of an internal bus in accordance with a data bit width to be used, in order to maintain the pattern of test data for memory cells, the positional relation between the memory cells of compression target has to be maintained for the plurality of output/output data bit widths. Specifically, the same test pattern has to be written into memory cells in each respective data bit width. It is necessary to perform writing of common data, data reading and compression on memory cells in a predetermined positional relation. In the case of changing the connection of an internal data line in accordance with the data bit width, if the connection of the compression circuit is also switched, the configuration of the compression circuit is made complicated due to implementation of switching the connection, and the circuit occupying area increases.

Irrespective of the data bit width to be used, the test contents to be performed are the same. It is therefore desirable to use a common tester. Consequently, compressed data has to be output to the same terminal/pad irrespective of the data bit width to be used. In the case of changing a path for transferring output data of the compression circuit in accordance with the data bit width to be used, a circuit for changing the path for transferring output data of the compression circuit in accordance with the data bit width used is required to increase the circuit occupying area. In addition, the switching circuit is connected to a bus used in the normal operation mode, and the load associated with the bus increases.

To write/read test data, it is preferable to use the common test data terminals for writing/reading test data irrespective of the data bit width to be used, so that a common tester can be used for the plurality of kinds of data bit widths of the semiconductor memory device.

SUMMARY OF THE INVENTION

An object of the invention is to provide a semiconductor memory device capable of implementing a plurality of data bit widths without greatly changing the internal configuration.

Another object of the invention is to provide a semiconductor memory device having a plurality of kinds of data bit widths, on which a multi-bit test can be easily performed.

Further another object of the invention is to provide a semiconductor memory device on which a multi-bit test can be performed using a common tester for a plurality of data bit widths without greatly changing an internal configuration.

A semiconductor memory device according to the invention includes first data terminals of a first bit width used in both a mode of a first data bit width and a mode of a second data bit width wider than the first bit width, and a first main data line of the first bit width disposed corresponding to the first data terminals. The correspondence relation between the first main data line and the first data terminals is the same in both the mode of the first bit width and the mode of the second bit width.

The semiconductor memory device according to the invention further includes a second data terminal that is not used in the mode of the first bit width, and a second main data line disposed corresponding to the second data terminal and has a bit width equal to that of the second data terminal. The second data terminal has a bit width equal to the difference between the first and second bit widths.

By disposing the second main data line used exclusively in the mode of the second data bit width, the same correspondence relationship between the first main data line and the data terminal can be made the same for both modes of the first and second data bit widths. Thus, the modes of the first and second bit widths can be accommodated for without changing the internal bus arrangement.

Since there is no change in the corresponding relationship between the internal bus and the input/output circuit, when internal data bits are compressed, it is sufficient to compress only data of the same main data line in the modes of both the first and second bit widths. Thus, the configuration of the compression circuit can be simplified.

In switching of the bit width, the switch of the connection between the first main data line and the memory block can be minimized to minimize the change in the configuration in association with the change in the bit width, and a change in the bit width can be easily accommodated for.

Data indicative of the compression result can be easily output to the same data terminal in both of the modes of the first and second bit widths, and a test can be performed using the common tester irrespective of the data bit width.

In the mode of the first bit width and the mode of the second bit width, the unit number of data bits to be compressed can be changed. The same data terminal can be used for outputting the compression result, and a test can be performed using the common tester.

The foregoing and other objects, features, aspects and advantages of the present invention will become more apparent from the following detailed description of the present invention when taken in conjunction with the accompanying drawings.

BRIEF DESCRIPTOIN OF THE DRAWINGS

DETAILED DESCRIPTION OF THE PREFERRED EMBODIMENTS

First Embodiment

Figure 1:
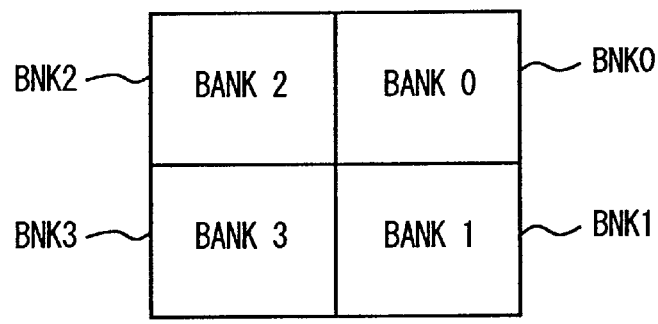
FIG. 1 is a diagram schematically showing a bank configuration of a semiconductor memory device according to the invention.

FIG. 1 is a diagram schematically showing the configuration of a memory array in a semiconductor memory device according to the invention. In FIG. 1, the memory array is divided into four banks BNK0 to BNK3. In each of banks BNK0 to BNK3, memory cells are arranged in rows and columns. In banks BNK0 to BNK3, a memory cell row can be driven to a selection state, independently of each other. By activating banks BNK0 to BNK3 in an interleaved fashion, data in banks BNK0 to BNK3 can be accessed successively to improve access efficiency.

Figure 2:
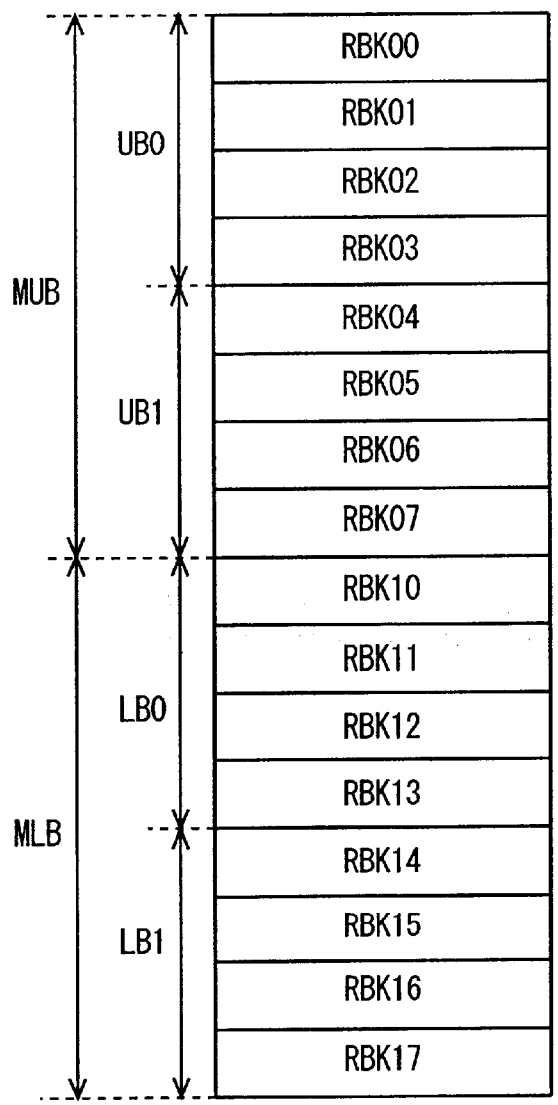
FIG. 2 is a diagram schematically showing the array configuration of the bank of the semiconductor memory device according to the invention.

FIG. 2 is a diagram schematically showing the configuration of a memory array in one of banks BNK0 to BNK3 shown in FIG. 1. In FIG. 2, the memory array is divided into, in total, 16 row blocks RBK00 to RBK07 and RBK10 to RBK17. In each of row blocks RBK00 to RBK07 and RBK10 to RBK17, memory cells are arranged in rows and columns.

Row blocks RBK00 to RBK07 form a main upper block MUB. Row blocks RBK10 to RBK17 form a main lower block MLB. Main upper block MUB is divided into a memory block UB0 constructed by row blocks RBK00 to RBK03, and a memory block UB1 constructed by row blocks RBK04 to RBK07. Main lower block MLB is divided into a memory block LB0 constructed by row blocks RBK10 to RBK13, and a memory block LB1 constructed by row blocks RBK14 to RBK17.

The semiconductor memory device can selectively implement an input/output data bit width of 16 bits or 32 bits. In the case of a ×16 bit configuration in which the data bit width is 16 bits, one row block is selected in main upper block MUB, and one row block is selected in main lower block MLB. The selected row blocks are row blocks in the same position in main upper block MUB and main lower block MLB. Data of eight bits is accessed in each of the two selected row blocks, and data of a total of 16 bits is accessed.

In the case of the ×32 bit configuration in which the data bit width is 32 bits, row blocks in the same position in memory blocks UB0 and UB1 are selected, and row blocks in the same position in memory blocks LB0 and LB1 are selected. Since 8-bit data is accessed in each of the four selected row blocks, data of 32 bits in total is accessed.

By using a block selection address of three bits, in the ×16 bit configuration, one row block can be specified in each of main upper block MUL and main lower block MLB. By degenerating, for example, the most significant block address bit in the block address of three bits, one row block can be selected in each of memory blocks UB0, UB1, LB0, and LB1.

The degeneration/validation of the block selection address bit is set by setting an aluminum switch using mask interconnection line or by a bit width designation signal generated by setting a specific bonding pad to a predetermined voltage level in accordance with a data bit width.

Figure 3:
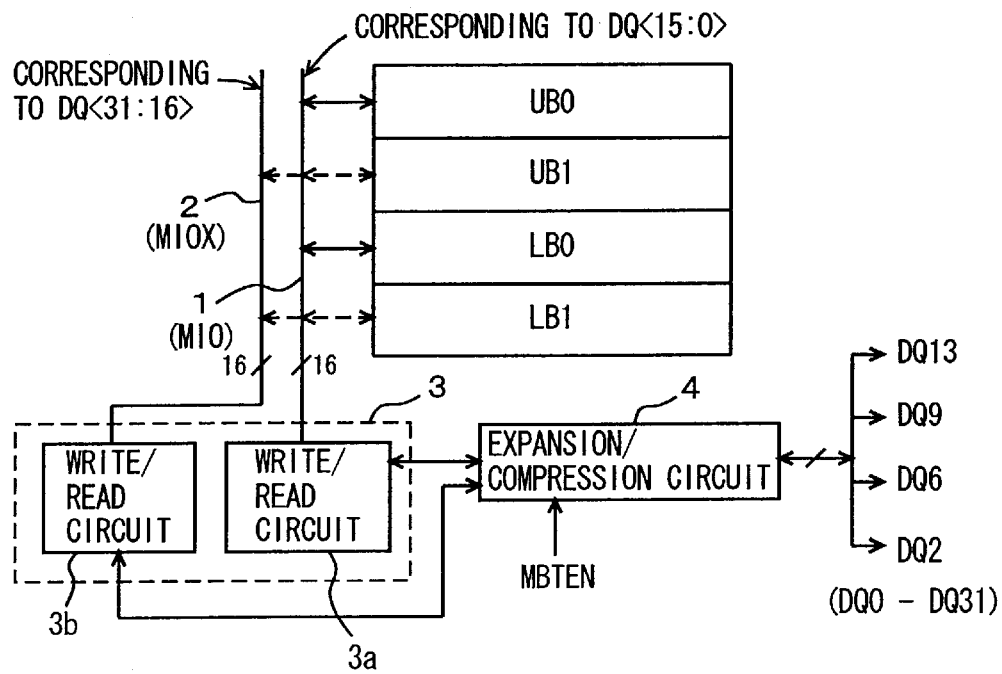
FIG. 3 is a diagram schematically showing the configuration of a data writing/reading section of the semiconductor memory device according to the invention.

FIG. 3 is a diagram schematically showing a configuration of an internal data line in the semiconductor memory device according to the first embodiment of the invention. In FIG. 3, a main data bus 1 is disposed commonly to memory blocks UB0, UB1, LB0, and LB1, and a main data bus 2 is disposed commonly to memory blocks UB1 and LB1.

Main data bus 1 is disposed for data terminals DQ<15:0>. Data terminals DQ<15:0> are used in both the ×16 bit configuration and the ×32 bit configuration. Therefore, the main data bus 1 is also used in both the ×16 bit configuration and the ×32 bit configuration. Main data bus 1 has a 16-bit width, and communicates data of eight bits with selected row blocks in memory blocks UB0 and LB0.

Main data bus 2 has similarly a 16-bit width and is disposed for data terminals DQ<31:16>. Data terminals DQ<31:16> are used in the ×32 bit configuration, but are not used in the ×16 bit configuration. Therefore, data is not transferred through main data bus 2 in the ×16 bit configuration. In the ×32 bit configuration, main data bus 2 transfers 16-bit data, and communicates data of eight bits with row blocks selected in respective memory blocks UB1 and LB1.

Therefore, the row blocks in memory blocks UB1 and LB1 are selectively connected to main data bus 1 in the ×16 bit configuration, while connected to main data bus 2 in the ×32 bit configuration. According to the data bit width, connection between the selected row blocks in memory blocks UB1 and LB1, and main data bus 1 and 2 is switched. As will be described in detail later, the connection between local data buses disposed for the row blocks and the main data bus is changed according to a selected row block.

Row blocks in memory blocks UB0 and LB0 are connected to first main data bus 1 in both of the ×16 bit configuration and ×32 bit configuration. Therefore, the connection between a row block and a main data line can be made the same for row blocks in memory blocks UB0 and LB0 irrespective of the data bit width. Thus, the configuration of the circuit required to change the bit width is simplified. In addition, the main data line of compression target in a multi-bit test can be made common irrespective of the data bit width, to minimize a change in the circuit configuration for a multi-bit test in changing the data bit width.

Main data buses 1 and 2 are connected to a write/read circuit 3 for writing/reading internal data. Write/read circuit 3 includes a write/read circuit 3a provided for main data bus 1, and a write/read circuit 3b provided for main data bus 2. In the case of the ×16 bit configuration, write/read circuit 3a is set to an operable state, and write/read circuit 3b is set to an operation inhibited (non-operative) state. Therefore, with the configuration of disposing main data bus 1 for data terminals DQ<15:0> used in both the ×16 bit configuration and ×32 bit configuration while disposing main data bus 2 for data terminals DQ<31:16> used in the ×32 bit configuration, a change in the data bit width can be accommodated for only by selectively activating write/read circuit 3b in accordance with the data bit width. In a multi-bit test, it is unnecessary to change a path associated with the write/read circuits, so that the circuit configuration is simplified.

In a multi-bit test, write/read circuits 3a and 3b are connected to an expansion/compression circuit 4 for expanding write data and compressing read data. In response to a multi-bit test enable signal MBTEN, expansion/compression circuit 4 performs a 4-bit expanding/compressing operation in the case of the ×16 bit configuration, and performs an 8-bit expanding/compressing operation in the case of the ×32 bit configuration. Specifically, in a data writing mode, expansion/compression circuit 4 expands 4-bit data supplied to predetermined data terminals DQ2, DQ6, DQ9, and DQ13 to 32-bit data, and supplies the 32-bit data to write/read circuits 3a and 3b. On the other hand, in the case of the ×16 bit configuration, expansion/compression circuit 4 expands the 4-bit data from data terminals DQ2, DQ6, DQ9, and DQ13 and supplies the expanded data to write/read circuit 3a.

Even if 16-bit data is similarly supplied to write/read circuit 3b at this time, since write/read circuit 3b is set to a non-operative state in the ×16 bit configuration, write data is not transferred to main data bus 2. Therefore, in writing test data in the multi-bit test, it is sufficient for expansion/compression circuit 4 to perform the same operation of expanding data from the same data terminals DQ2, DQ6, DQ9, and DQ13 of four bits. In both of the ×16 bit configuration and the ×32 bit configuration, by performing the same expanding operation without changing the circuit configuration, test write data can be generated.

In a data compressing operation in a multi-bit test, expansion/compression circuit 4 performs the following compressing process on data from write/read circuits 3a and 3b. In the ×16 bit configuration, a 4-bit compressing operation of compressing data of four bits into 1-bit data is performed. In the ×32 bit configuration, an 8-bit compressing operation of compressing 8-bit data into 1-bit data is performed. In any of the data bit widths, 4-bit data is obtained as a result of compression. In both of the ×16 bit configuration and the ×32 bit configuration, a result of compression can be output externally via the same pin terminals.

Also in the compressing operation, by performing the compressing operation on data from write/read circuits 3a and 3b, the compression can be performed on data of the same main data bus lines irrespective of the data bit width. In the ×16 bit configuration and the ×32 bit configuration, data in memory cells the same in positional relation can be compressed in both the ×16 bit configuration and the ×32 bit configuration. Expansion/compression circuit 4 performs the 4-bit compressing operation or 8-bit compressing operation in accordance with the data bit width. Finally, only data terminals DQ2, DQ6, DQ9, and DQ13 of four bits are used.

Figure 4:
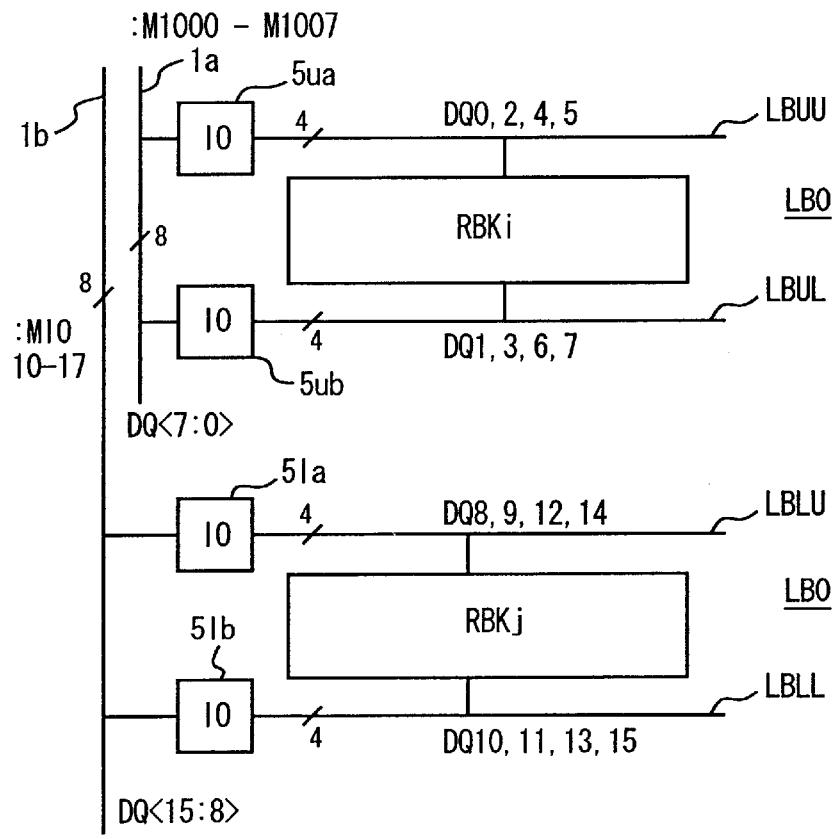
FIG. 4 is a diagram schematically showing the connection between a memory block and a main data line shown in FIG. 3.

Therefore, irrespective of the data bit width, the same data terminals are used, so that a test can be performed using the same tester. The configuration of each of the components will be described hereinbelow. Configuration of IO selection circuit FIG. 4 is a diagram schematically showing arrangement of buses for row blocks RBKi and RBKj included in memory blocks MB0 and LB0, respectively. In FIG. 4, local data buses LBUU and LBUL for transferring data of four bits are disposed to row block RBKi. Local data bus LBUU transfers data DQ0, DQ2, DQ4, and DQ5, and local data bus LBUL transfers data DQ1, DQ3, DQ6, and DQ7.

Each of local data buses LBUU and LBUL is disposed for a sense amplifier band arranged for row block RBKi and shared by adjacent row blocks. In the row block on the lower side of and adjacent to row block RBKi, data DQ1, DQ3, DQ6, and DQ7 is transferred to the upper local data bus, and data DQ0, DQ2, DQ4, and DQ5 is transferred to the lower local data bus.

In any of the ×16 bit configuration and ×32 bit configuration, a row block in memory block UB0 is connected to a data bus 1a of eight bits of main data bus 1. Local data buses LBUU and LBUL and data bus 1a are connected to each other via IO selection circuits 5ua and 5ub, respectively. IO selection circuits 5ua and 5ub are made conductive, when corresponding row block RBKi is selected, to connect 4-bit local data buses LBUU and LBUL to different bus lines of data bus 1a of eight bits in parallel. Local data bus LBLU transfers data DQ8, DQ9, DQ12, and DQ14 and local data bus LBLL transfers data DQ10, DQ11, DQ13, and DQ15. Since each of local data buses LBLU and LBLL is shared by adjacent row blocks, the relations of data bits transferred via the upper and lower local data buses are in reverse between row blocks adjacent to row block RBKj. 8-bit data DQ<7:0> is transferred to data bus 1a. For emphasizing a data bit, the symbol "<>" is used. There is no significant technical difference between data bit DQ<n> and data bit DQn.

For row block RBKj included in memory block LB0, local data buses LBLU and LBLL each for transferring 4-bit data are disposed. Local data bus LBLU transfers data DQ8, DQ9, DQ12, and DQ14, and local data bus LBLL transfers data DQ10, DQ11, DQ13, and DQ15. Since each of local data buses LBLU and LBLL is shared between adjacent row blocks, the relations of data bits transferred via the upper and lower local data buses are in reverse between row blocks adjacent to row block RBKj.

In any of the ×16 bit configuration and ×32 bit configuration, local data buses LBLU and LBLL are connected to a data bus 1b of eight bits via IO selection circuits 51a and 51b, respectively. In any of the ×16 bit configuration and ×32 bit configuration, data DQ<15:8> is transferred to data bus 1b. IO selection circuits 51a and 51b are set to a conductive state when a corresponding sense amplifier band is activated or row block RBKj is selected.

By disposing the main data bus for transferring data used only in the ×32 bit configuration dedicatedly to the ×32 bit configuration, data buses to which row blocks RBKi and RBKj included in memory blocks UB0 and LB0, respectively, are connected can be uniquely determined, so that the configuration of the IO selection circuits can be simplified.

Figure 5:
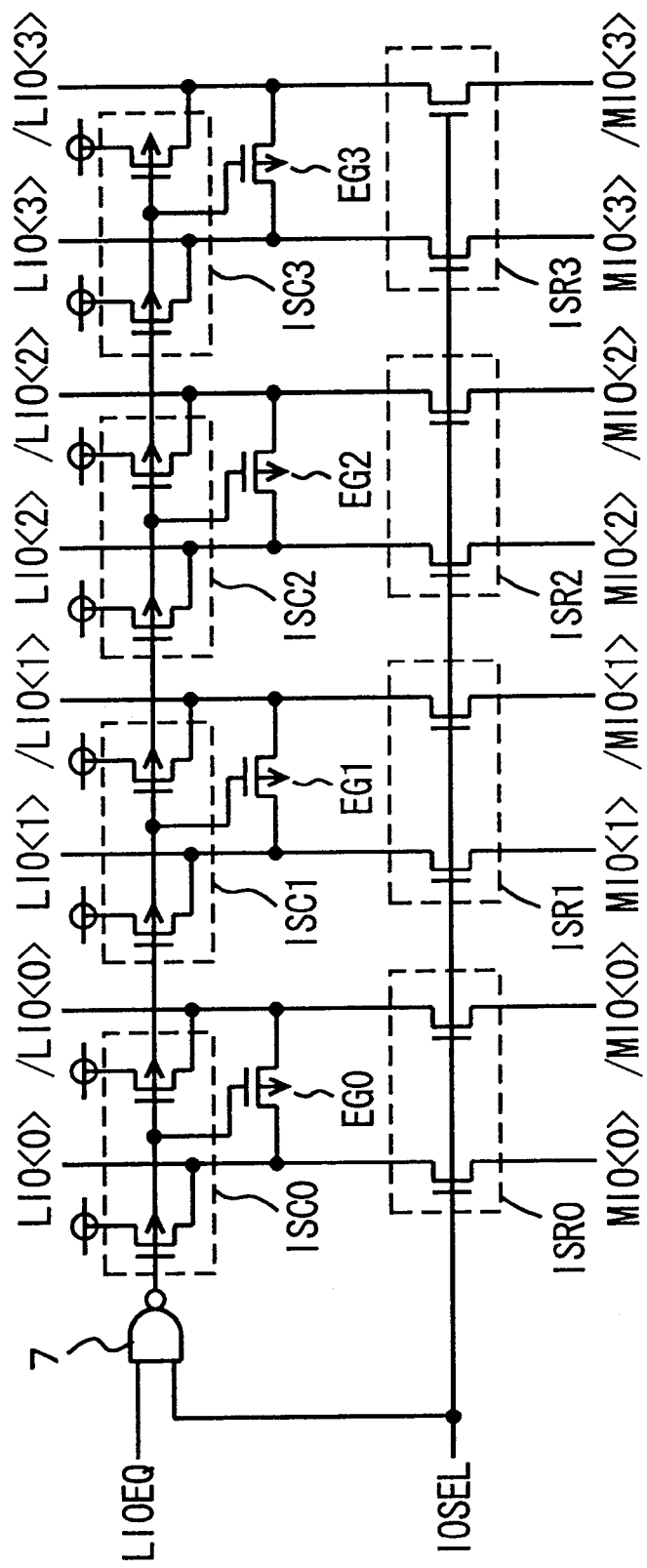
FIG. 5 is a diagram showing an example of the configuration of an IO selection circuit shown in FIG. 4.

FIG. 5 is a diagram showing an example of the configuration of IO selection circuits (IO) 5ua, 5ub, 51a, and 51b shown in FIG. 4. As IO selection circuits 5ua, 5ub, 51a, and 51b have the same configuration, in FIG. 5, one IO selection circuit 5 is shown representatively.

In FIG. 5, IO selection circuit 5 includes: an NAND gate 7 receiving an IO selection signal IOSEL and an equalize instruction signal LIOEQ; pull-up gates ISC0 to ISC3 provided corresponding to local data lines LIO<0> and LIO<0> to LIO<3> and /LIO<3>; equalize transistors EG0 to EG3 provided corresponding to local data lines LIO<0> and LIO<0> to LIO<3> and /LIO<3>, and selectively made conductive in response to an output signal of NAND gate 7; and selection gates ISR0 to ISR3 selectively made conductive, in accordance with IO selection signal IOSEL, to connect local data lines LIO<0> and LIO<0> to LIO<3> and /LIO<3> to main data lines MIO<0> and /MIO<0> to MIO<3> and /MIO<3>, respectively. Each of pull-up gates ISC0 to ISC3 is formed of a P-channel MOS transistor (insulated gate field effect transistor) and precharges corresponding local data lines LIO and /LIO to an array power supply voltage level, when activated. Each of equalize transistors EG0 to EG3 is formed of a P-channel MOS transistor and electrically short-circuits corresponding local data lines LIO and /LIO to equalize corresponding local data lines LIO and /LIO, when made conductive.

Local IO data lines LIO<0> and /LIO<0> to LIO<3> and /LIO<3> construct a local data bus of four bits. Main data lines MIO<0> and /MIO<0> to MIO<3> and /MIO<3> construct a main data bus of four bits.

In a standby state, local data lines LIO<0> and /LIO<0> to LIO<3> and /LIO<3> are precharged to the array power supply voltage level by pull-up gates ISC0 to ISC3, respectively. On the other hand, in a standby state, main data lines MIO<0> and /MIO<0> to MIO<3> and /MIO<3> are precharged to a peripheral power supply voltage level by a not-shown circuit.

In row selection, when a corresponding row block is selected according to a row related signal that will be described later, IO selection signal IOSEL attains an H level at a high voltage Vpp level higher than the peripheral power supply voltage level, and selection gates ISR0 to ISR3 are made conductive. In column selection, equalize instruction signal LIOEQ are driven to an L level. IO selection signal IOSEL is set to the high voltage level, a write voltage is transferred and an H level signal of the local data line is transmitted to the main data line, without causing a threshold voltage loss in selection gates ISR0 to ISR3.

Therefore, when the row selecting operation is performed and a sensing operation by a sense amplifier circuit in a sense amplifier band is performed, equalize instruction signal LIOEQ is at the H level. For the memory block including a selected row, IO selection signal IOSEL attains the H level, and local data lines LIO<0> and LIO<0> to LIO<3> and /LIO<3> are connected to main data lines MIO<0> and /MIO<0> to MIO<3> and /MIO<3>, respectively.

On the other hand, since IO selection signal IOSEL disposed corresponding to a non-selected sense amplifier band maintains the L level, an output signal of NAND gate 7 is at the H level, and precharging/equalizing local data lines LIO<0> and /LIO<0> to LIO<3> and /LIO<3> is not performed. Therefore, in this state, the main data bus line precharged (pulled up) to the peripheral power supply voltage level is isolated from the local data line. Selection gates ISR0 to ISR3 disposed corresponding to the selected sense amplifier band are made conductive to connect main data lines MIO<3:0> and /MIO<3:0> and local data lines LIO<3:0> and /LIO<3:0>, respectively.

When a column selecting operation is performed, equalize instruction signal LIOEQ goes low (attains L level), an output signal of NAND gate 7 goes high (attains H level), pull-up gates ISC0 to ISC3 and equalize transistors EG0 to EG3 turn non-conductive, a pulling-up/equalization on local data lines LIO<0> and /LIO<0> to LIO<3> and /LIO<3> is completed, and local data lines LIO<0> and /LIO<0> to LIO<3> and /LIO<3> have the voltage level change to a voltage level transmitted from selected sense amplifiers and electrically coupled to main data lines MIO<0> and /MIO<0> to MIO<3> and /MIO<3>. With the configuration, data transferred from a selected memory cell is transmitted to main data lines MIO and /MIO (generically referring to main data lines MIO<3:0> and /MIO<3:0>).

In a data reading mode, each of main data lines MIO and /MIO is pulled up to the peripheral power supply voltage level. A load of local data lines LIO<0> and /LIO<0> to LIO<3> and /LIO<3> is sufficiently smaller than that of main data lines MIO<0> and /MIO<0> to MIO<3> and /MIO<3>. In main data lines MIO and /MIO, a voltage level of a data line through which L level data is transferred goes low a little, a signal of a small amplitude is generated, and data is transferred at high speed.

Figure 6:
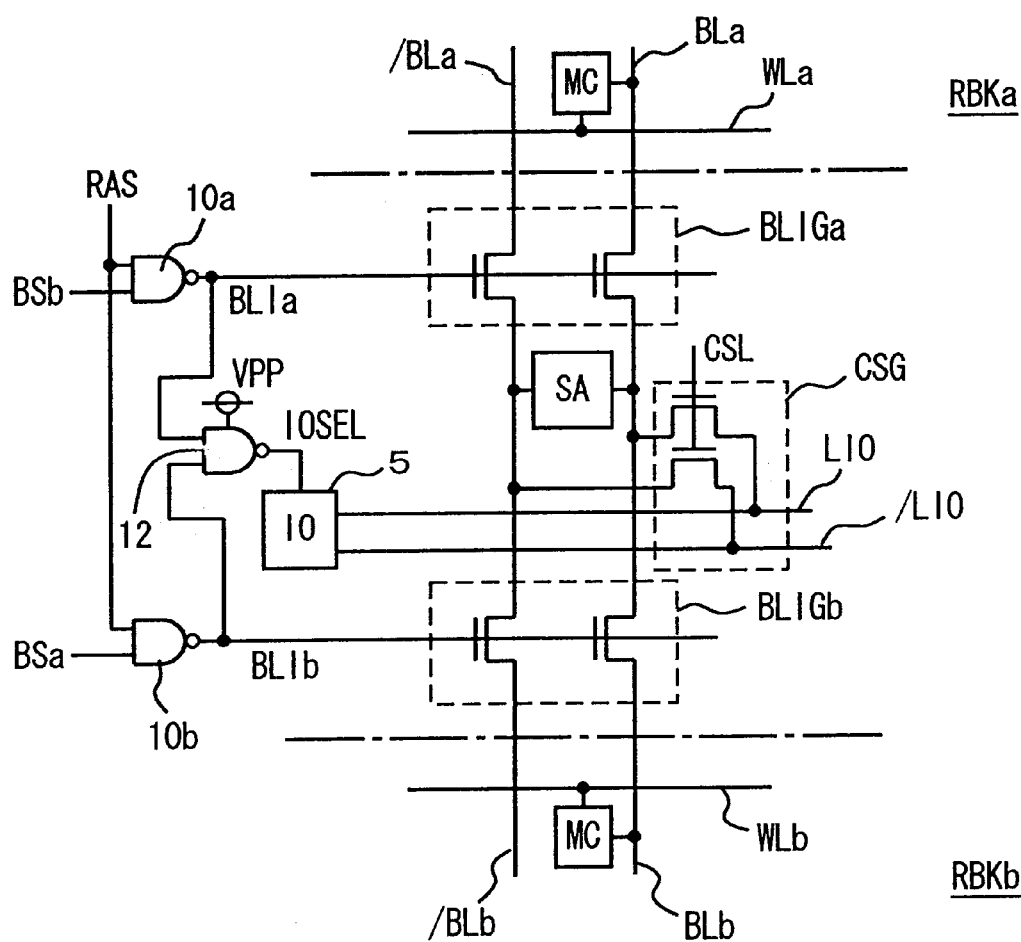
FIG. 6 is a diagram schematically showing the configuration of a section for generating the IO selection signal shown in FIG. 5.

FIG. 6 is a diagram schematically showing the configuration of a section for generating IO selection signal IOSEL. FIG. 6 shows the configuration of the section for generating an IO selection signal to local data lines LIO and /LIO shared by row blocks RBKa and RBKb. In row block RBKa, bit lines BLa and /BLa for transferring complementary data are disposed, and a word line WLa is disposed in the direction crossing the bit lines BLa and /BLa. Bit lines BLa and /BLa are disposed in a pair, and a memory cell MC is disposed at an intersection between one of bit lines BLa and /BLa and word line WLa. In FIG. 6, memory cell MC disposed in the intersection between word line WLa and bit line BLa is representatively shown.

In row block RBKb, bit lines BLb and /BLb are disposed, and a word line WLb is disposed in the direction crossing bit lines BLb and /BLb. A memory cell MC is disposed in an intersection portion between word line WLb and one of bit lines BLb and /BLb. In FIG. 6, memory cell MC disposed in the intersection portion between word line WLb and bit line BLb is representatively shown.

Bit lines BLa and /BLa are connected to sense amplifier SA via a bit line isolation gate BLIGa, and bit lines BLb and /BLb are connected to sense amplifier SA via a bit line isolation gate BLIGb. Bit line isolation gate BLIGa is selectively made conductive in response to a bit line isolation instruction signal BLIa outputted from a bit line isolation control circuit 10a, and bit line isolation gate BLIGb is selectively made conductive in response to a bit line isolation instruction signal BLIb outputted from a bit line isolation control circuit 10b.

Bit line isolation control circuit 10a is formed of an NAND circuit that receives an array activating signal RAS and a block selection signal BSb. Bit line isolation control circuit 10b is formed of an NAND circuit that receives array activating signal RAS for activating a row selecting operation and a block selection signal BSa. Block selection signals BSa and BSb are activated when row blocks RBKa and RBKb are selected, respectively.

Bit line isolation control circuits 10a and 10b have a level converting function, and the H level of bit line isolation instruction signals BLIa and BLIb is set to a high voltage VPP level for the following reason. Each of bit line isolation gates BLIGa and BLIGb includes N-channel MOS transistors arranged corresponding to bit lines as components thereof, and can transmit a voltage lower, by its threshold voltage, than its gate voltage. Consequently, by setting bit line isolation instruction signals BLIGa and BLIGb to the high voltage Vpp level higher than an operation power supply voltage of sense amplifier SA, H data sensed and latched by sense amplifier SA is written into selected memory cell MC without causing a threshold voltage loss.

Sense nodes of sense amplifier SA are connected to local data lines LIO and /LIO via a column selection gate CSG. Column selection gate CSG includes N-channel MOS transistors disposed to local data lines LIO and /LIO, and is selectively made conductive in response to a column selection signal CSL. Local data lines LIO and /LIO are connected to IO selection circuit 5.

IO selection signal IOSEL to IO selection circuit 5 is generated by an NAND circuit 12 which receives bit line isolation instruction signals BLIa and BLIb. NAND circuit 12 receives a high voltage VPP as an operation power supply voltage. When row block RBKa is selected, block selection signal BSa is at the H level, and block selection signal BSb is at the L level. In this state, array activate signal RAS attains the H level in row selection, and bit line isolation instruction signal BLIa output from bit line isolation control circuit 10a turns H level at the high voltage VPP level, and bit line isolation instruction signal BLIb from bit line isolation control circuit 10b turns L level at the ground voltage level. Accordingly, bit line isolate gate BLIGb enters an off state, bit line isolation gate BLIGa enters an on state, bit lines BLb and /BLb are isolated from sense amplifier SA and bit lines BLa and /BLa are connected to sense amplifier SA.

When bit line isolation instruction signal BLIB attains the L level, IO selection signal IOSEL output from NAND circuit 12 attains the H level, and selection gates ISR0 to ISR3 of IO selection circuit 5 are turned on. In this state, selection gates ISC0 to ISC3 are in an off state, and local data lines LIO and /LIO are precharged to an intermediate voltage level.

Subsequently, in accordance with activation of array activate signal RAS, a row selecting operation is performed, word line WLa disposed corresponding to a selected row is driven to the high voltage VPP level, and storage data in memory cell MC is read onto bit line BLa. Complementary bit line /BLa is charged to an intermediate voltage by a not-shown precharge/equalize circuit in a standby state. In this state, complementary bit line /BLa is in an electrically floating state at the intermediate voltage level.

When activated, sense amplifier SA amplifies and latches the voltage difference between bit lines BLa and /BLa. After completion of the sensing operation of sense amplifier SA, bit lines BLa and /BLa are held at the H and L levels in accordance with the storage data in memory cell MC.

Subsequently, when a column selecting operation is performed, equalize instruction signal LIOEQ shown in FIG. 5 attains the H level, column selection signal CSL also attains the H level, column selection gate CSG is made conductive, and sense amplifier SA is coupled to local data lines LIO and /LIO precharged to and equalized at the array power supply voltage level. Data of local data lines LIO and /LIO is transmitted to corresponding main data lines MIO and /MIO (not shown) via IO selection circuit 5 shown in FIG. 5. Local data lines LIO and /LIO change in voltage level according to data from bit lines BL and /BL. A load of main data lines MIO and /MIO is heavy. Main data lines MIO and /MIO generate small amplitude signals in accordance with the signals transferred from corresponding local data lines LIO and /LIO, for transmission to a not-shown preamplifier. The preamplifier amplifies the small amplitude signals transferred via the main data line pair to generate internal read data.

Figure 7:
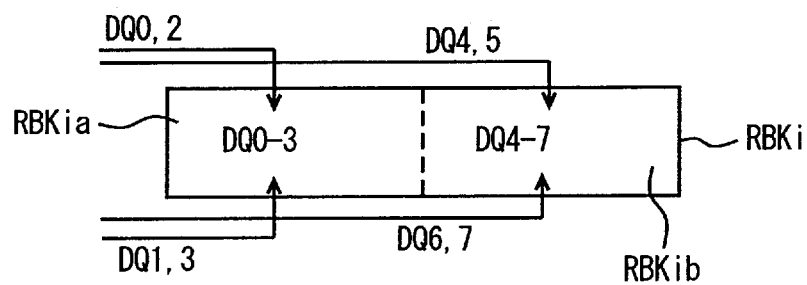
FIG. 7 is a diagram schematically showing a distribution of storage data in a row block.

FIG. 7 is a diagram schematically illustrating the relation between write data for row block RBKi and that for RBKj. Row block RBKi is divided into two sub row blocks RBKia and RBKib in the row direction. To sub row block RBKia, data DQ0 and DQ2 are written from the local data line in the sense amplifier band on one side, and data DQ1 and DQ3 are written from the local data line in the sense amplifier band on the other side. According to column selection signal CSL, the two adjacent column selection gates in the sense amplifier band on the upper side in FIG. 7 are simultaneously selected, and the two adjacent column selection gates in the sense amplifier band on the lower side are simultaneously selected.

As will be described in detail later, sense amplifier SA is disposed in a shared sense amplifier configuration. Therefore, data bits DQ0 to DQ3 are written into memory cells of four bits disposed successively.

To sub row block RBKib, data bits DQ4 and DQ5 are transferred from the local data line disposed in the sense amplifier band on one slide, and data bits DQ6 and DQ7 are written from the local data line in the sense amplifier band on the other side. In sub row block RBKib, therefore, data bits DQ4 to DQ7 are written into memory cells of four bits disposed successively.

Row block RBKj is similarly divided into sub row blocks RBKja and RBKjb. To sub row block RBKja, data bits DQ12 and DQ14 are written from the local data line in the sense amplifier band on one side, and data bits DQ13 and DQ15 are written from the local data line in the sense amplifier band on the other side. In sub row block RBKja, data bits DQ12 to DQ15 are stored into adjacent memory cells of four bits.

To sub row block RBKjb, data bits DQ8 and DQ9 are transferred from the local data line in the sense amplifier band on one side, and data bits DQ10 and DQ11 are transferred from the local data line in the sense amplifier band on the other side. In sub row block RBKjb, therefore, data bits DQ8 to DQ11 are transferred and written into adjacent memory cells of four bits.

The positional relation of bits stored in the sub row blocks of row block RBKi and that of row block RBKj are different from each other for the following reason. In the semiconductor memory device, data terminals DQ0 to DQ7 are disposed in this order on one side of a package, and data terminals DQ15 to DQ8 are disposed in this order on the other side of the package. Corresponding to the data terminals, data buses are disposed. Therefore, in terms of the positional relation of the terminals, data bits DQ0 to DQ3 correspond to data bits DQ15 to DQ12, and data bits DQ4 to DQ7 correspond to data bits DQ11 to DQ8. Since the main data buses are disposed in accordance with the arrangement order of the data bits, as shown in FIG. 7, the arrangement order of the data bits in row block RBKi and that in row block RBKj are different from each other.

Figure 8:
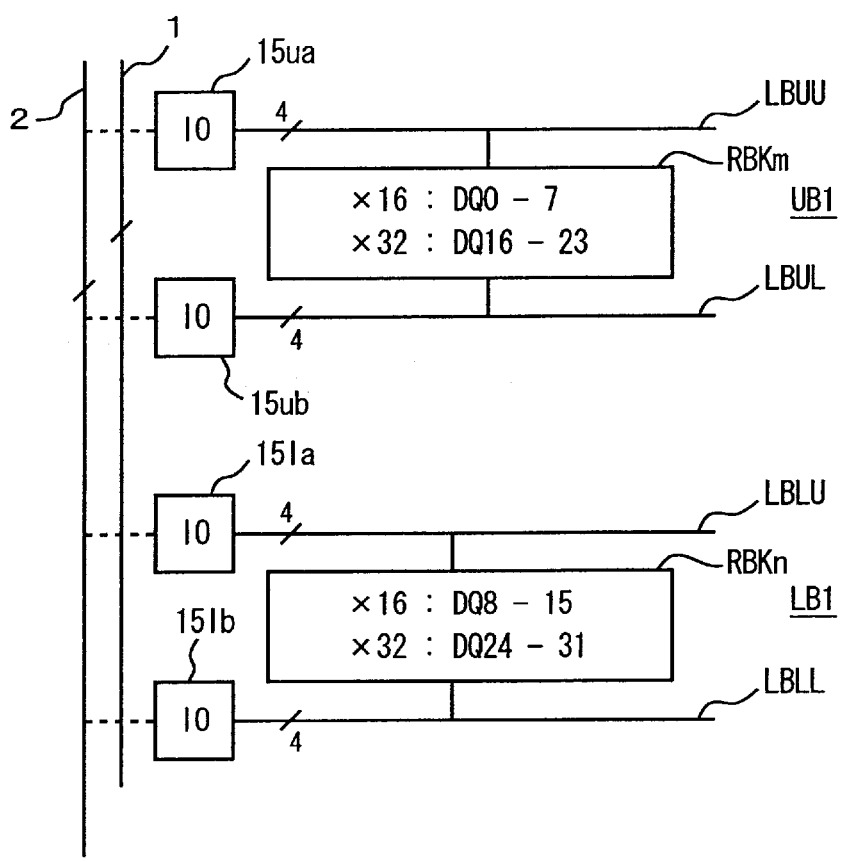
FIG. 8 is a diagram showing a storage data bit according to a data bit width of a row block.

FIG. 8 is a diagram schematically illustrating the connection between row blocks RBKm and RBKn included in memory blocks UB1 and LB1, respectively, shown in FIG. 2 and main data buses 1 and 2. For row block RBKm, local data buses LBUU and LBUL are disposed. For row block RBKn, local data buses LBLU and LBLL are disposed. Corresponding to local data buses LBUU and LBUL, IO selection circuits 15ua and 15ub are disposed. IO selection circuits 15la and 15lb are disposed corresponding to local data buses LBLU and LBLL.

In the case of the ×16 bit configuration, IO selection circuits 15ua and 15ub connect local data buses LBUU and LBUL to main data bus 1. In the case of the ×32 bit configuration, IO selection circuits 15ua and 15ub connect local data buses LBUU and LBUL to main data bus lines for data terminals DQ16 to DQ23 in main data bus 2.

In the case of the ×16 bit configuration, IO selection circuits 15*la* and 15*lb* connect local data buses LBLU and LBLL to main data lines corresponding to data terminals DQ8 to DQ15 in main data bus 1. In the case of the ×32 bit configuration, IO selection circuits 15*la* and 15*lb* connect local data buses LBLU and LBLL to main data bus lines for data terminals DQ24 to DQ31 in second main data bus 2. In the case of the ×16 bit configuration, the correspondence relation of connection of row blocks RBKm and RBKn to main data lines is the same as that shown in FIG. 4. In the case of the ×32 bit configuration as well, with the same connecting relation as the connection to the first main data bus 1 with respect to the upper and lower bytes, local data buses LBUU, LBUL, LBLU, and LBLL are connected to the second main data bus 2 for transferring data of 16 bits.

Therefore, on the upper bit side, the connecting paths are switched in IO selection circuits 15*ua*, 15*ub*, 15*la*, and 15*lb*.

Figure 9:
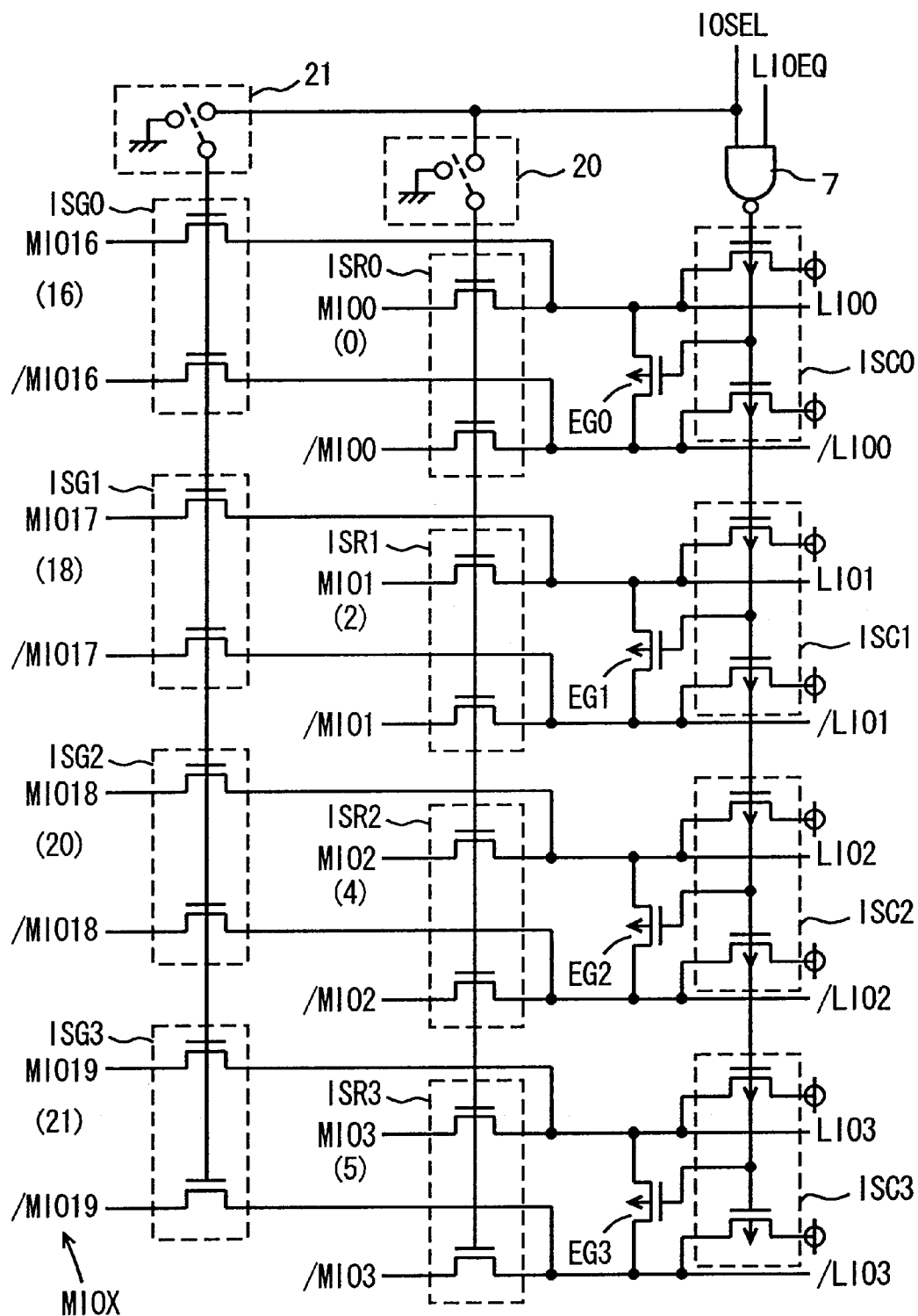
FIG. 9 is a diagram showing the configuration of an IO selection circuit shown in FIG. 8.

FIG. 9 is a diagram showing the configuration of IO selection circuits 15*ua*, 15*ub*, 15*la*, and 15*lb* shown in FIG. 8. In FIG. 9, since IO selection circuits 15*ua*, 15*ub*, 15*la*, and 15*lb* have the same configuration, one IO selection circuit 15 is representatively shown.

In FIG. 9, IO selection circuit 15, similarly to the IO selection circuit shown in FIG. 5, includes: pull-up gates ISC0 to ISC3 provided corresponding to local data lines LIO0 and /LIO0 to LIO3 and /LIO3, respectively; equalize transistors EG0 to EG3 provided corresponding to pull-up gates ISC0 to ISC3, respectively, and made conductive in the same phase as corresponding pull-up gates ISC0 to ISC3; selection gates ISR0 to ISR3 provided corresponding to local data lines LIO0 and /LIO0 to LIO3 and /LIO3, respectively and rendered conductive to connect corresponding local data lines to main data lines MIO0 and /MIO0 to MIO3 and /MIO3; selection gates ISG0 to ISG3 rendered conductive to connect local data lines LIO0 and /LIO0 to LIO3 and /LIO3 to main data lines MIO16 and /MIO16 to MIO19 and /MIO19; an aluminum switch 20, having a connection path selectively formed according to the data bit width, for transmitting IO selection signal IOSEL or a ground voltage to selection gates ISR0 to ISR3; and an aluminum switch, having a connection path set according to the data bit width, for transmitting the ground voltage or IO selection signal IOSEL to selection gates ISG0 to ISG3.

The IO selection circuit shown in FIG. 9 is a representative of IO selection circuits 15*ua*, 15*ub*, 15*la*, and 15*lb* shown in FIG. 8, and the numbers (Nos.) of local data lines and main data lines do not correspond to data bits. For example, when main data lines MIO0, MIO1, MIO2, and MIO3 are disposed corresponding to data bits DQ0, DQ2, DQ4, and DQ5, respectively, main data lines MIO16, MIO17, MIO18, and MIO19 are disposed corresponding to data bits DQ16, DQ18, DQ20, and DQ21.

The arrangement order of data bits DQ16 to DQ31 is the same as that of data bits DQ7 to DQ15, and the order of data transfer of data bits DQ16 to DQ31 is the same as that of data bits DQ0 to DQ15. Main data lines MIO16 to MIO19 are data bus lines arranged dedicatedly to the ×32 bit configuration. To clarify the arrangement order in the second main data bus 2, bus lines of second main data bus 2 are expressed as main data lines MIOX0 to MIOX7 of lower bytes and main data bus lines MIOX10 to MIOX17 of upper bytes. In this notation, main data lines MIO16 to MIO19 correspond to main data lines MIOX0 to MIOX3, respectively.

An output signal of NAND gate 7 receiving IO selection signal IOSEL and equalize instruction signal LIOEQ is supplied to pull-up gates ISC0 to ISC3 and equalize transistors EG0 to EG3.

In the case of the ×16 bit configuration, aluminum switch 20 selects IO selection signal IOSEL for transmission to selection gates ISR0 to ISR3. In this case, aluminum switch 21 transmits the voltage of the ground node to selection gates ISG0 to ISG3. In the case of the ×32 bit configuration, aluminum switch 20 transmits the voltage of the ground node to selection gates ISR0 to ISR3, and aluminum switch 21 transmits IO selection signal IOSEL to selection gates ISG0 to ISG3. With the configuration, connection between the local data line and the main data line can be changed between memory blocks UB1 and LB1 according to the data bit width.

Figure 10:
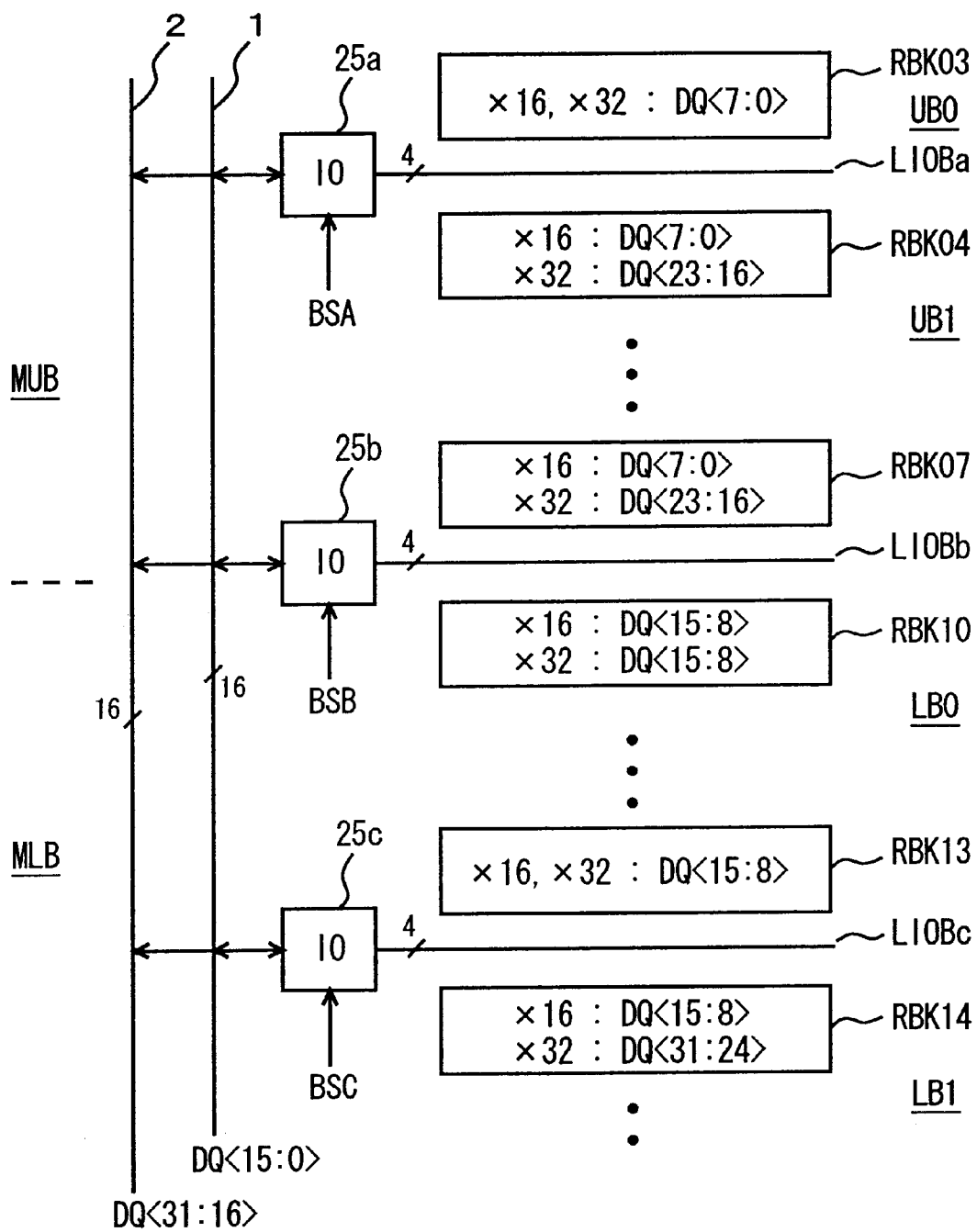
FIG. 10 is a diagram schematically showing storage data in a memory block in a block boundary area.

FIG. 10 is a diagram schematically showing the configuration of local data buses and IO selection circuits disposed corresponding to a boundary of memory blocks of the memory array.

As shown in FIG. 10, in the case of the ×32 bit configuration, a main data bus connected to row block RBK03 included in memory block UB0 is different from a main data bus connected to row block RBK04 included in memory block UB1. Specifically, in both of the ×16 bit configuration and the ×32 bit configuration, row block RBK03 is connected to the same main data lines of first main data bus 1 and stores data DQ<7:0>. Row block RBK04 stores data DQ<7:0> in the case of the ×16 bit configuration, and is connected, in the case of the ×32 bit configuration, to the main data lines of second main data bus 2 and stores data DQ<23:16>. Therefore, local data bus LIOBa provided commonly to row blocks RBK03 and RBK04 is connected to the main data lines of eight bits of main data bus 1 or 2 by an IO selection circuit 25*a* in accordance with block selection signal BS and the data bit width.

Row block RBK07 included in the boundary area of main upper block MUB stores data DQ<7:0> in the case of the ×16 bit configuration, and stores data DQ<23:16> in the case of the ×32 bit configuration.

Memory block RBK10 adjacent to row block RBK07 is included in main lower block MLB. In main lower block MLB, in both of the ×16 bit configuration and the ×32 bit configuration, the row block in memory block LB0 is connected to main data lines MIO8 to MIO16 (or MIO10 to MIO17 in another notation) of upper eight bits of the same first main data bus 1. Therefore, in both of the ×16 bit configuration and the ×32 bit configuration, row block RBK10 stores data DQ<15:8>. Local data bus LIOBb provided commonly to row blocks RBK07 and RBK10 is selectively connected to either the upper byte main data line of main data bus 1, the lower byte main data line of first main data bus 1, or the lower byte main data line of second main data bus 2 by an IO selection circuit 25*b*.

In main lower block MLB, row block RBK13 included in memory block LB0 stores data DQ<15:8> irrespective of the data bit width. On the other hand, row block RBK14 included in memory block LB1 stores data DQ<15:8> in the case of the ×16 bit configuration, and stores data DQ<31:24> in the case of the ×32 bit configuration. Therefore, local data bus LIOBc provided commonly to row blocks RBK13 and RBK14 is selectively connected to main data bus 1 or main data bus 2 by an IO selection circuit 25*c* in accordance with the selected memory block and the data bit width.

FIG. 10 shows block selection signals BSA to BSC applied to IO selection circuits 25*a* to 25*c*. Each of block selection signals BSA to BSC contains block selection signals to corresponding two row blocks.

Figure 11:
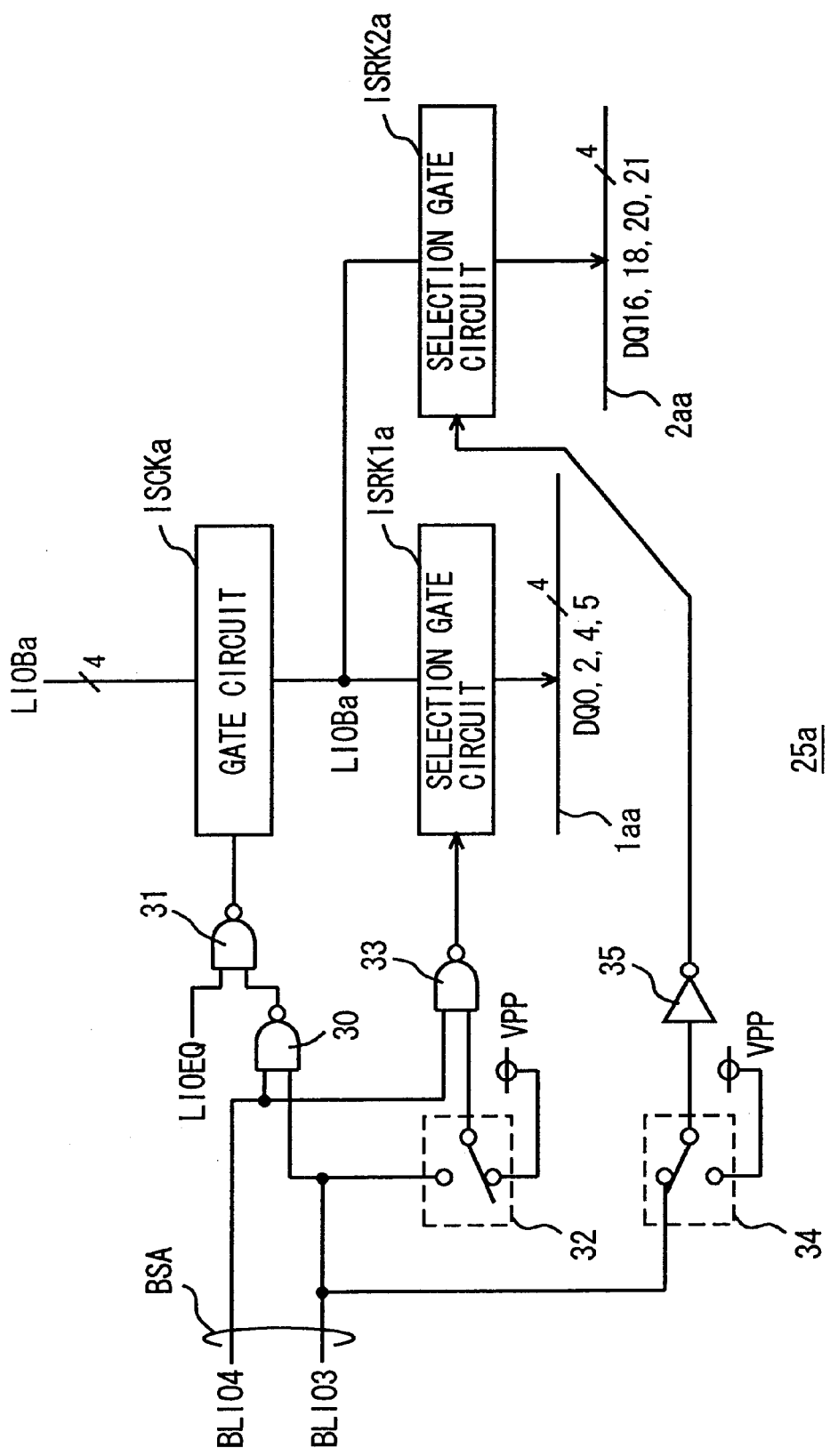
FIG. 11 is a diagram schematically showing the configuration of an IO selection circuit shown in FIG. 10.

FIG. 11 is a diagram schematically showing the configuration of IO selection circuit 25*a* shown in FIG. 10. In FIG.

11, IO selection circuit 25a includes: an NAND circuit 30 receiving bit line isolation instruction signals BLI04 and BLI03; an NAND circuit 31 receiving an output signal of NAND circuit 30 and equalize instruction signal LIOEQ; a gate circuit ISCKa selectively made conductive according to an output signal of NAND circuit 31, to precharge and equalize local data bus LIOBa of four bits to the array power supply voltage level; an aluminum switch 32 for transmitting one of bit line isolation instruction signal BLI03 and high voltage VPP by mask interconnection; an NAND circuit 33 receiving an output signal of aluminum switch 32 and bit line isolation instruction signal BLI04; a selection gate circuit ISRK1a selectively made conductive according to an output signal of NAND circuit 33, to connect local data bus LIOa to a main data bus 1aa of four bits included in first main data bus 1; an aluminum switch 34 for transmitting one of bit line isolation instruction signal BLI03 and the high voltage in accordance with mask interconnection; and a selection gate circuit ISRK2a selectively made conductive according to an output signal of aluminum switch 34 supplied via an inverter 35, to connect local data bus LIOa to a main data bus 2aa of four bits in second main data bus 2.

Gate circuit ISCKa includes: pull-up gates ISC0 to ISC3 formed of P-channel MOS transistors arranged corresponding to data lines of local data bus LIOb of four bits; and equalize transistors EG0 to EG3 for equalizing the corresponding local data lines. Selection gate circuit ISRK1a includes selection gates ISR0 to ISR3 formed of N-channel MOS transistors arranged corresponding to main data lines of main data bus 1aa of four bits. Selection gate circuit ISRK2a includes selection gates ISR0 to ISR3 formed of N-channel MOS transistors arranged corresponding to data lines of main data bus 2aa of four bits.

In the case of the ×16 bit configuration, aluminum switch 32 applies bit line isolation instruction signal BLI03 to NAND circuit 33, and aluminum switch 34 supplies high voltage VPP to selection gate ISRK2a via inverter 35. Therefore, selection gate circuit ISRK2a is normally held in a non-conductive state.

Bit line isolation instruction signal BLI04 attains the L level to the L level when row block RBK03 is selected. On the other hand, bit line isolation instruction signal BLI03 falls to L level when row block RBK04 is selected. Therefore, bit line isolation instruction signals BLI03 and BLI04 can be used as block selection signals BSA. In the 32×bit configuration, aluminum switch 32 transmits high voltage VPP to NAND circuit 33, and aluminum switch 34 transmits bit line isolation instruction signal BLI03 to selection gate circuit ISRK2a via inverter 35.

Main data bus 1aa transmits data bits DQ0, DQ2, DQ4, and DQ5. Main data bus 2aa transmits data bits DQ16, DQ18, DQ20, and DQ21.

In the ×16 bit configuration, aluminum switch 34 applies a high voltage to selection gate circuit ISRK2a via inverter 35, and selection gate circuit ISRK2a is normally set in a non-conductive state. Therefore, when one of row blocks RBK03 and RBK04 is selected and one of bit line isolation instruction signals BLI04 and BLI03 attains the L level, output signals of NAND circuits 30 and 33 attain the high voltage VPP level, selection gate circuit ISRK1a is made conductive, and local data bus LIOa is connected to main data bus 1aa. Equalize instruction signal LIOQ attains the H level, an output signal of NAND circuit 31 attains the L level, gate circuit ISCKa is activated, and local data bus LIOBa is precharged to equalized at the array power supply voltage level.

When equalize instruction signal LIOEQ attains the L level, gate circuit ISCKa is made inactive according to an output signal of NAND circuit 31, and memory cell data of local data bus LIOBa of four bits read by the column selecting operation is transmitted to main data bus 1aa of four bits.

In the ×32 bit configuration, aluminum switch 32 transmits the high voltage VPP to NAND circuit 33, and aluminum switch 34 transmits bit line isolation instruction signal BI03 to selection gate circuit ISRK2a via inverter 35. Therefore, when row block RBK03 is selected and bit line isolation instruction signal BLI04 attains the L level, output signals of NAND circuits 30 and 33 attain the H level, and selection gate ISRK1a is made conductive. When equalize instruction signal LIOEQ attains the L level, an output signal of NAND circuit 31 attains the H level, gate circuit ISCKa is made inactive, and memory cell data latched by the sense amplifier is transferred to local data bus LIOBa and subsequently to main data bus 1aa.

On the other hand, when row block RBK04 is selected and bit line isolation instruction signal BI03 attains the L level, an output signal of NAND circuit 30 attains the H level, and an output signal of inverter 35 attains the H level. Since bit line isolation instruction signal BLI04 maintains the H level, an output signal of NAND circuit 33 is at the L level. Therefore, in this case, selection gate circuit ISRK2a is made conductive, and local data bus LIOBa is connected to main data bus 2aa.

By using the IO selection circuit shown in FIG. 11, local data bus LIOBa disposed in the boundary area of memory blocks UB0 and UB1 can be connected to the main data lines of the corresponding main data bus in accordance with a selected row block.

Figure 12:
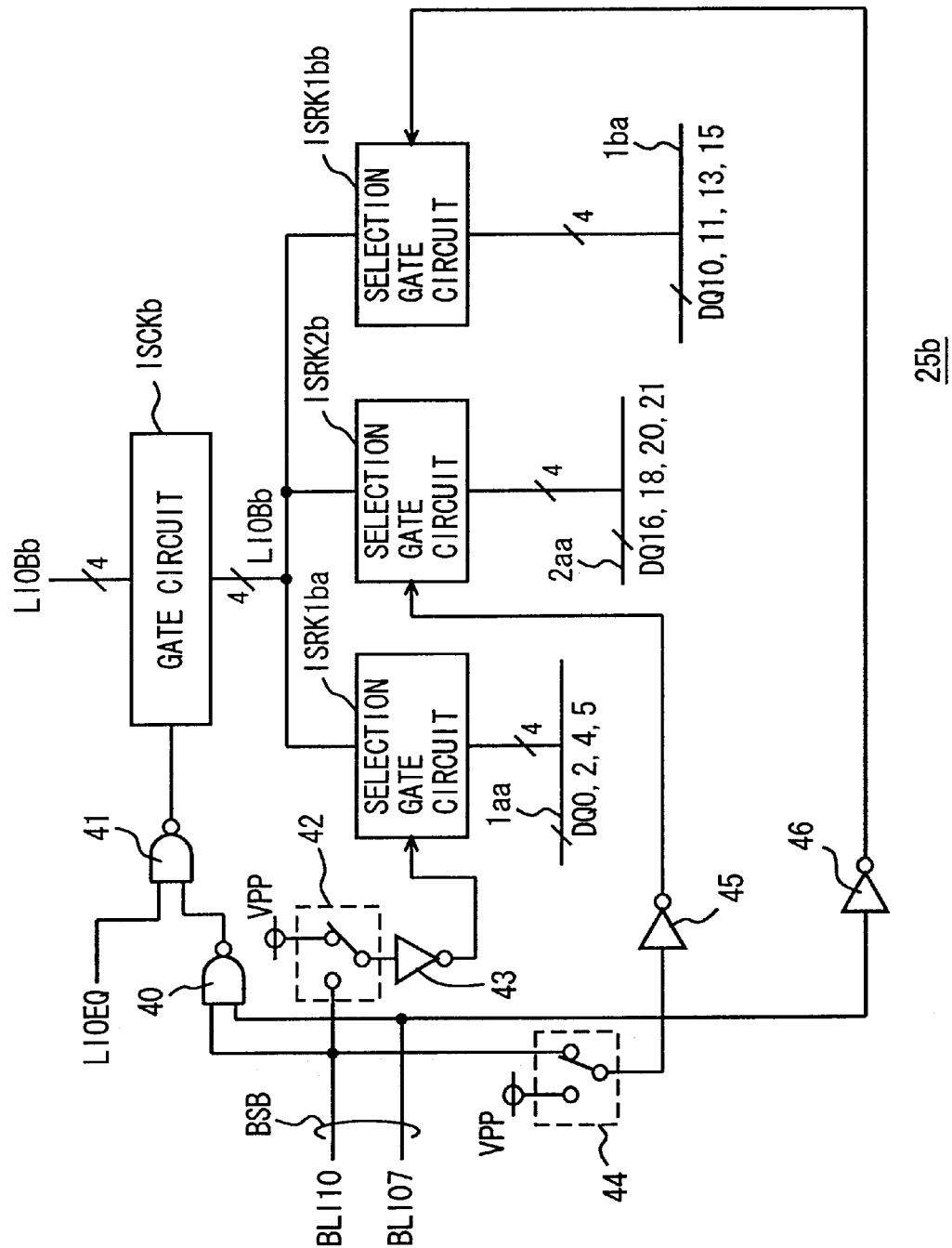
FIG. 12 is a diagram schematically showing the configuration of the IO selection circuit shown in FIG. 10.

FIG. 12 is a diagram schematically showing the configuration of IO selection circuit 25b shown in FIG. 10. In FIG. 12, IO selection circuit 25b includes: a gate circuit ISCKb for precharging and equalizing local data bus LIOBb of four bits to the array power supply voltage level when activated; a selection gate circuit ISRK1ba for storing local data bus LIOBb to first main data bus 1aa of four bits, when made conductive; a selection gate circuit ISRK2b for connecting local data bus LIOBb to second main data bus 2aa of four bits, when made conductive; and a selection gate circuit ISRK1bb for connecting local data bus LIOBb to first main data bus 1ba of four bits, when made conductive.

Gate circuit ISCKb includes: pull-up gates ISC0 to ISC3 formed of P-channel MOS transistors provided corresponding to data lines of four bits; and an equalize transistor formed of a P-channel MOS transistor. Selection gate circuits ISRK1ba, ISRK2b, and ISRKb include selection gates ISR0 to ISR3, respectively, formed of N-channel MOS transistors provided corresponding to data lines of the main data bus of four bits.

Selection gate circuit ISRK1ba transmits data bits DQ0, DQ2, and DQ5, when made conductive. Selection gate circuit ISRK2b transmits data bits DQ16, DQ18, DQ20, and DQ21, when made conductive. Selection gate circuit ISRK1ba transmits data bits DQ10, DQ11, DQ13, and DQ15, when made conductive.

In order to control the activation of the gate circuits and conduction of the selection gate circuits, there are provided: an NAND circuit 40 receiving bit line isolation instruction signals BLI10 and BLI07; an NAND circuit 41 receiving an output signal of NAND circuit 40 and equalize instruction signal LIOEQ and supplying an output signal thereof to selection gate circuit ISCKb; an aluminum switch 42 for transmitting one of bit line isolation instruction signal BLI10 and high voltage VPP; an inverter 43 for inverting and transmitting a signal transmitted by aluminum switch 42 to selection gate circuit ISRK1*ba;* an aluminum switch 44 for transmitting one of high voltage VPP and bit line isolation instruction signal BLI10; an inverter 45 for inverting and transmitting signal/voltage from aluminum switch 44 to selection gate circuit ISRK2*b;* and an inverter 46 for inverting and transmitting bit line isolation instruction signal BLI07 to selection gate circuit ISRK1*bb.*

In the case of the ×16 bit configuration, aluminum switch 42 selects bit line isolation instruction signal BLI10. In the case of the ×32 bit configuration, aluminum switch 42 selects the high voltage VPP. In the ×32 bit configuration, aluminum switch 44 selects bit line isolation instruction signal BLI10. In the ×16 bit configuration, aluminum switch 44 selects the high voltage VPP. The connection path of aluminum switches 42 and 44 is set by metal mask interconnection lines in accordance with the data bit width. FIG. 12 shows the connection paths of aluminum switches 42 and 40 in the case of the ×32 bit configuration, as an example.

When row block RBK07 is selected, bit line isolation instruction signal BLI10 attains the L level. When row block RBK10 is selected, bit line isolation instruction signal BLI107 attains the L level.

In the ×16 bit configuration, when row block RBK07 is selected and bit line isolation instruction signal BLI10 falls to the L level, an output signal of inverter 43 attains the H level in response to the fall of bit line isolation instruction signal BLI07, and selection gate circuit ISRK1*ba* is made conductive. In the ×16 bit configuration, aluminum switch 44 selects the high voltage VPP, an output signal of inverter 45 is fixed to the L level, and selection gate circuit ISRK2*b* is normally held in a non-conductive state. Bit line isolation instruction signal BLI07 is at the H level, an output signal of inverter 46 is at the L level, and selection gate circuit ISRK1*bb* is made non-conductive. Therefore, in the ×16 bit configuration, when row block RBK07 is selected, local data bus LIOBb is connected to main data bus 1*aa* of four bits via selection gate circuits ISCKb and ISRK1*b.*

On the other hand, in the ×16 bit configuration, when row block RBK10 is selected, bit line isolation instruction signal BLI07 falls to the L level, and an output signal of inverter 46 attains the H level. Since bit line isolation instruction signal BLI10 maintains the H level, output signals of inverters 43 and 45 are at the L level, and selection gate circuits ISRK1*ba* and ISRK2*b* maintain the non-conductive state. Therefore, when equalize instruction signal LIOEQ attains the L level, data of a memory cell is read to local data bus LIOBb and subsequently transferred to main data bus 1*ba* of four bits in the first main data bus via selection gate circuits ISRK1*bb* and ISCKb.

In the ×32 bit configuration, aluminum switch 42 transmits the high voltage VPP, and aluminum switch 44 transmits bit line isolation instruction signal BI10. In the ×32 bit configuration, when row block RBK10 is selected, according to bit line isolation instruction signal BLI07, selection gate circuit ISRK1*bb* is made conductive, and local data bus LIOBb is connected to main data bus 1*ba.*

On the other hand, when row block RBK07 is selected, bit line isolation instruction signal BI10 attains the L level, selection gate circuit ISRK2*b* is made conductive by aluminum switch 44 and inverter 45, and local data bus LIOBb is connected to main data bus 2*aa* of four bits of the second main data bus. In the ×32 bit configuration, an output signal of inverter 43 is fixed to the L level, and selection gate circuit ISRK1*ba* is maintained non-conductive.

Figure 13:
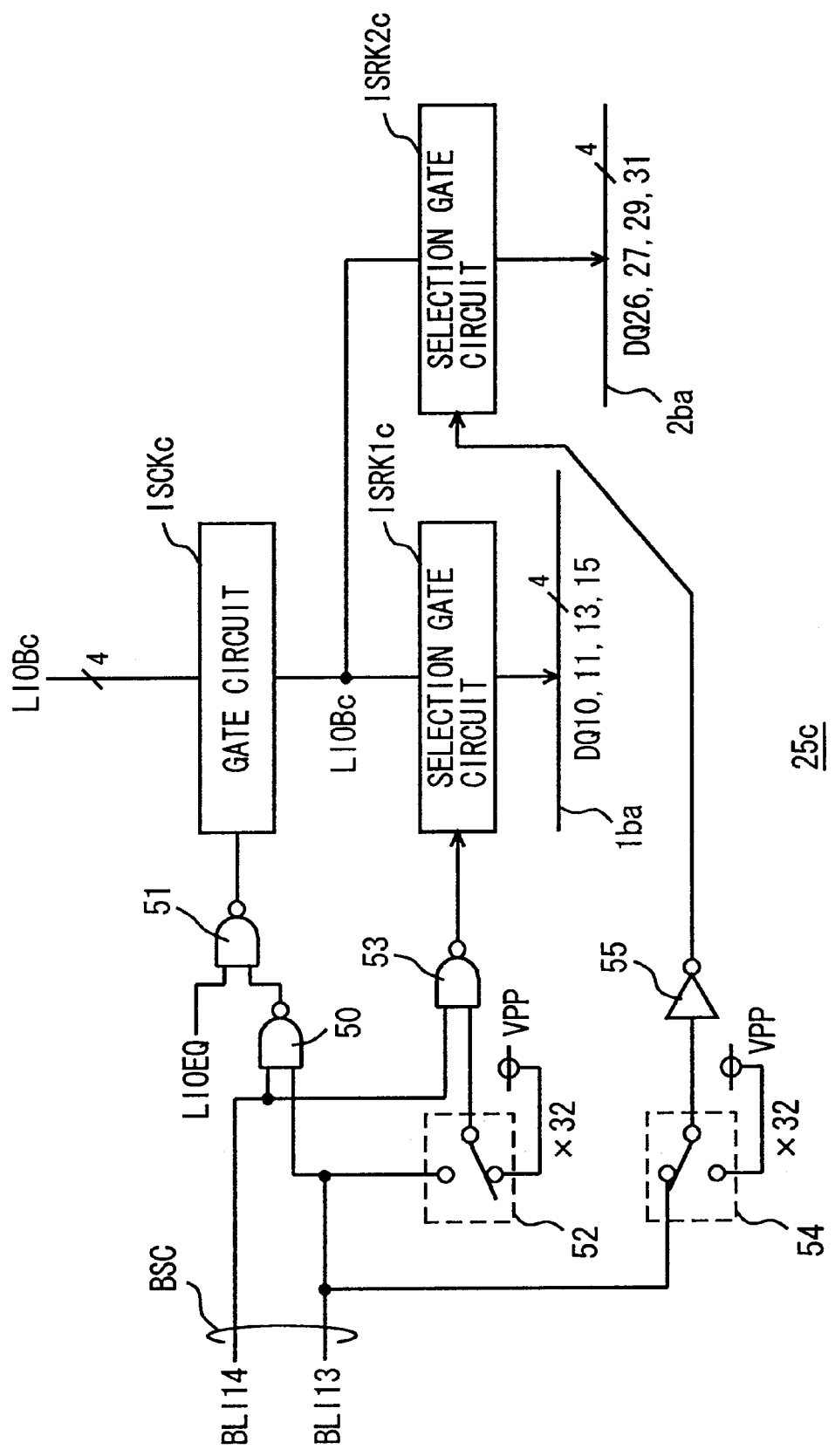
FIG. 13 is a diagram schematically showing the configuration of the IO selection circuit shown in FIG. 10.

FIG. 13 is a diagram schematically showing the configuration of IO selection circuit 25*c* shown in FIG. 10.

In FIG. 13, local data bus LIOBc of four bits is coupled to main data bus 1*ba* of four bits via selection gate circuit ISRK1*c,* and coupled to main data bus 2*ba* of four bits via selection gate circuit ISRK2*c.* Selection gate circuits ISRK1*c* and ISRK2*c* each include selection gates ISR0 to ISR3 provided corresponding to local data lines of four bits of the local data bus.

Gate circuit ISCKc includes pull-up gates ISC0 to ISC3 and equalize transistors EG0 to EG3 disposed corresponding to the bus lines of local data bus LIOBc of four bits.

To main data bus 1*ba,* data of four bits DQ10, DQ11, DQ13, and DQ15 is transmitted. To main data bus 2*ba,* data bits DQ26, DQ27, DQ29, and DQ31 are transmitted.

IO selection circuit 25*c* further includes: an NAND circuit 50 receiving bit line isolation instruction signals BLI13 and BLI14; an NAND circuit 51 receiving an output signal of NAND circuit 50 and equalize instruction signal LIOEQ; an aluminum switch 52 for selecting one of high voltage VPP and bit line isolation instruction signal BLI13; an NAND circuit 53 receiving signal/voltage transmitted by aluminum switch 52 and bit line isolation instruction signal BLI14; an aluminum switch 54 for selecting one of high voltage VPP and bit line isolation instruction signal BLI13; and an inverter 55 for inverting signal/voltage transmitted from aluminum switch 54.

An output signal of NAND circuit 51 is applied to gate circuit ISCKc, an output signal of NAND circuit 53 is applied to selection gate ISRK1*c,* and an output signal of inverter 55 is applied to selection gate circuit ISRK2*c.*

When row block RBK13 is selected, bit line isolation instruction signal BLI14 attains the L level. When row block RBK14 is selected, bit line isolation instruction signal BLI13 attains the L level.

The connection path of each of aluminum switches 52 and 54 is set by metal mask interconnection lines. FIG. 13 shows the connection paths of aluminum switches 52 and 50 in the case of the ×32 bit configuration by way of example.

In the case of the ×16 bit configuration, aluminum switch 54 selects high voltage VPP, an output signal of inverter 55 is at the L level, and selection gate circuit LSRK2*c* maintains a non-conductive state. On the other hand, NAND circuit 53 receives bit line isolation instruction signals BLI13 and BLI14. Therefore, when one of row blocks RBK13 and RBK14 is selected, an output signal of NAND circuit 53 attains the H level, and selection gate circuit ISRK1*c* is made conductive. In the case of the ×16 bit configuration, therefore, local data bus LIOBc of four bits is connected to main data bus 1*ba* of four bits.

On the other hand, in the case of the ×32 bit configuration, bit line isolation instruction signal BLI13 is applied to inverter 55 via aluminum switch 54. Aluminum switch 52 transmits high voltage VPP to NAND circuit 53. When row block RBK14 is selected and bit line isolation instruction signal BLI13 attains the L level, therefore, an output signal of inverter 55 attains the H level, selection gate circuit ISRK2*c* is responsively made conductive, and local data bus LIOBc is connected to main data bus 2*ba* of four bits. On the other hand, when row block RBK13 is selected, bit line isolation instruction signal BLI14 attains the L level, an output signal of NAND circuit 53 attains the H level, and selection gate circuit ISRK1*c* is made conductive. In this state, local data bus LIOBc of four bits is connected to main data bus 1*ba* of four bits.

As described above, by providing a plurality of connection paths in the IO selection circuits disposed corresponding to the row blocks in the boundary area and by switching the connection path between the local data bus and the main data bus in accordance with the data bit width and the selected row block, a selected row block can be easily connected to the corresponding main data line. The connection path is merely switched for the whole local data bus, and the configuration of the circuit for switching the bus connection is also simplified.

Modification

Figure 14:
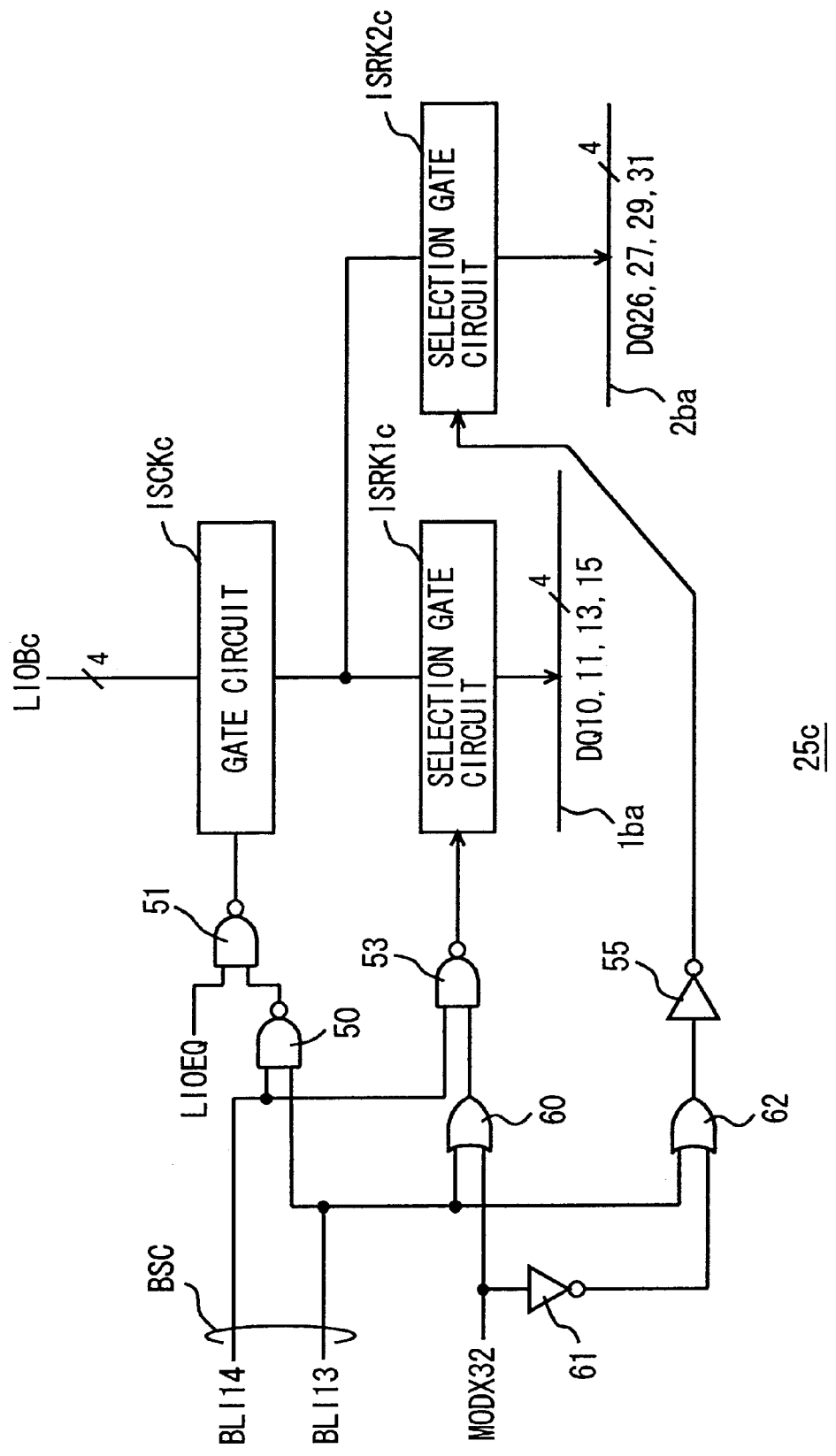
FIG. 14 is a diagram schematically showing a modification of the IO selection circuit shown in FIG. 10.

FIG. 14 shows a modification of IO selection circuit 25c in FIG. 13. In IO selection circuit 25c shown in FIG. 14, in place of aluminum switch 52, an OR circuit 62 which receives bit line isolation instruction signal BLI13 and a bit width instruction signal MODX32 is provided.

In place of aluminum switch 54, an inverter 61 receiving bit width instruction signal MODX32 and OR circuit 62 receiving an output signal of inverter 61 and bit line isolation instruction signal BLI13 are provided. The other configuration of IO selection circuit 25c shown in FIG. 14 is the same as that of the IO selection circuit shown in FIG. 13. The same reference numerals are designated to corresponding parts, and the detailed description will not be repeated.

In the case of the ×16 bit configuration, bit width instruction signal MODX32 is at the L level, an output signal of inverter 61 is set to the H level, and OR circuit 62 outputs an H-level signal irrespective of the state of bit line isolation instruction signal BLI13. In this state, therefore, an output signal of inverter 55 is fixed to the L level, and selection gate circuit ISRK2c is normally non-conductive. On the other hand, OR circuit 60 operates as a buffer circuit to apply bit line isolation instruction signal BLI13 to NAND circuit 53. Therefore, when one of row blocks RBK13 and RBK14 is selected, an output signal of NAND gate 53 attains the H level, and local data bus LIOBc is connected to main data bus 1ba of four bits by selection gate circuit ISRK1c.

In the case of the ×32 bit configuration, bit width instruction signal MODX32 is set to the H level. In this state, an output signal of OR circuit 60 is at the H level, and NAND circuit 53 operates as an inverter. An output signal of inverter 61 is at the L level, and OR circuit 62 operates as a buffer circuit and transmits bit line isolation instruction signal BLI13. Therefore, according to a selected row block, one of selection gate circuits ISRK1c and ISRK2c is made conductive, and local data bus LIOBc is connected to a corresponding main data bus of four bits.

Bit width instruction signal MODX32 is generated by, for example, fixing the voltage of a specific pad by programming of a fuse element, metal mask interconnection, or bonding wire. According to which of the ×16 bit configuration or ×32 bit configuration is set, connection between the main data bus and the local data bus can be set by fixing the voltage of the bonding pad. Particularly, in the case of fixing the voltage of the pad with a bonding wire, bit width instruction signal MODX32 can be generated by bonding upon packaging. Therefore, in a test before packaging, by performing a test in accordance with a certain data bit width, the reliability of a semiconductor memory device before packaging can be guaranteed. After the packaging, a test can be performed according to a set data bit width. In this case, the test can be performed while changing the voltage of the specific pad by a tester to implement the plurality of data bit widths.

In FIG. 14, data bit width instruction signal MODX32 is applied to IO selection circuit 25c. However, in the case of using bit width instruction signal MODX32, also in the IO selection circuits shown in FIGS. 11 and 12, a connection fashion may be set according to data bit width instruction signal MODX32 in place of the aluminum switch.

Figure 15:
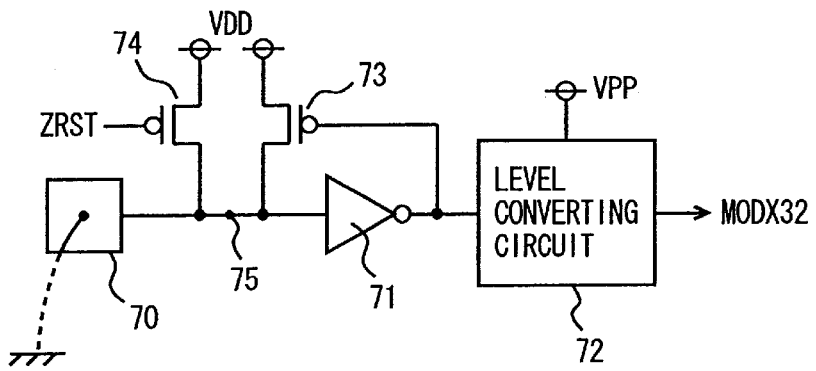
FIG. 15 is a diagram schematically showing the configuration of a section for generating a bit width instruction signal shown in FIG. 14.

FIG. 15 is a diagram showing an example of the configuration of a circuit for generating bit width instruction signal MODX32. In FIG. 15, a bit width instruction signal generating section includes: an inverter 71 for inverting a signal of a node 75 connected to a pad 70; a level converting circuit 72 for converting an amplitude of an output signal of inverter 71 to a signal of an amplitude of the high voltage VPP level; a P-channel MOS transistor 73 for holding node 75 at the power supply voltage VDD level in accordance with an output signal of inverter 71; and a P-channel MOS transistor 74 for precharging node 75 to the power supply voltage VDD level in accordance with a reset signal ZRST. In the case of the ×32 bit configuration, pad 70 is set to the ground voltage level. Reset signal ZRST is generated in the form of a one-shot pulse upon power up or upon system reset.

When pad 70 is bonded to the ground voltage level through a bonding wire, even if MOS transistor 74 charges node 75 for a predetermined time in response to reset signal ZRST, node 75 is discharged by the ground terminal via the bonding wire and attains the L level, and an output signal of inverter 71 attains the H level. An output signal of the H level of inverter 71 is converted to a signal of the high voltage VPP level by level converting circuit 72, and bit width instruction signal MODX32 attains the H level of the high voltage VPP level.

On the other hand, when pad 70 is in an electrically floating state, after power up or system reset, node 75 is precharged to the power supply voltage VDD level by MOS transistor 74 in response to reset signal ZRST, an output signal of inverter 71 attains the L level, MOS transistor 73 is turned on, and node 75 is maintained at the power supply voltage VDD level. In this state, level converting circuit 72 outputs a signal of the L level without logic level conversion, and bit width instruction signal MODX32 becomes the L level.

In the configuration of the bit width instruction signal generating section shown in FIG. 15, when the data bit width is 32 bits, pad 70 is wired to the ground voltage level through a bonding wire. However, when the data bit width is 16 bits, a configuration of wiring the bonding pad 70 to the power supply voltage level through a bonding wire may be employed. In the case of this configuration, MOS transistors 73 and 74 are connected between node 75 and the ground node.

Outline of Compressing Operation

Figure 16:
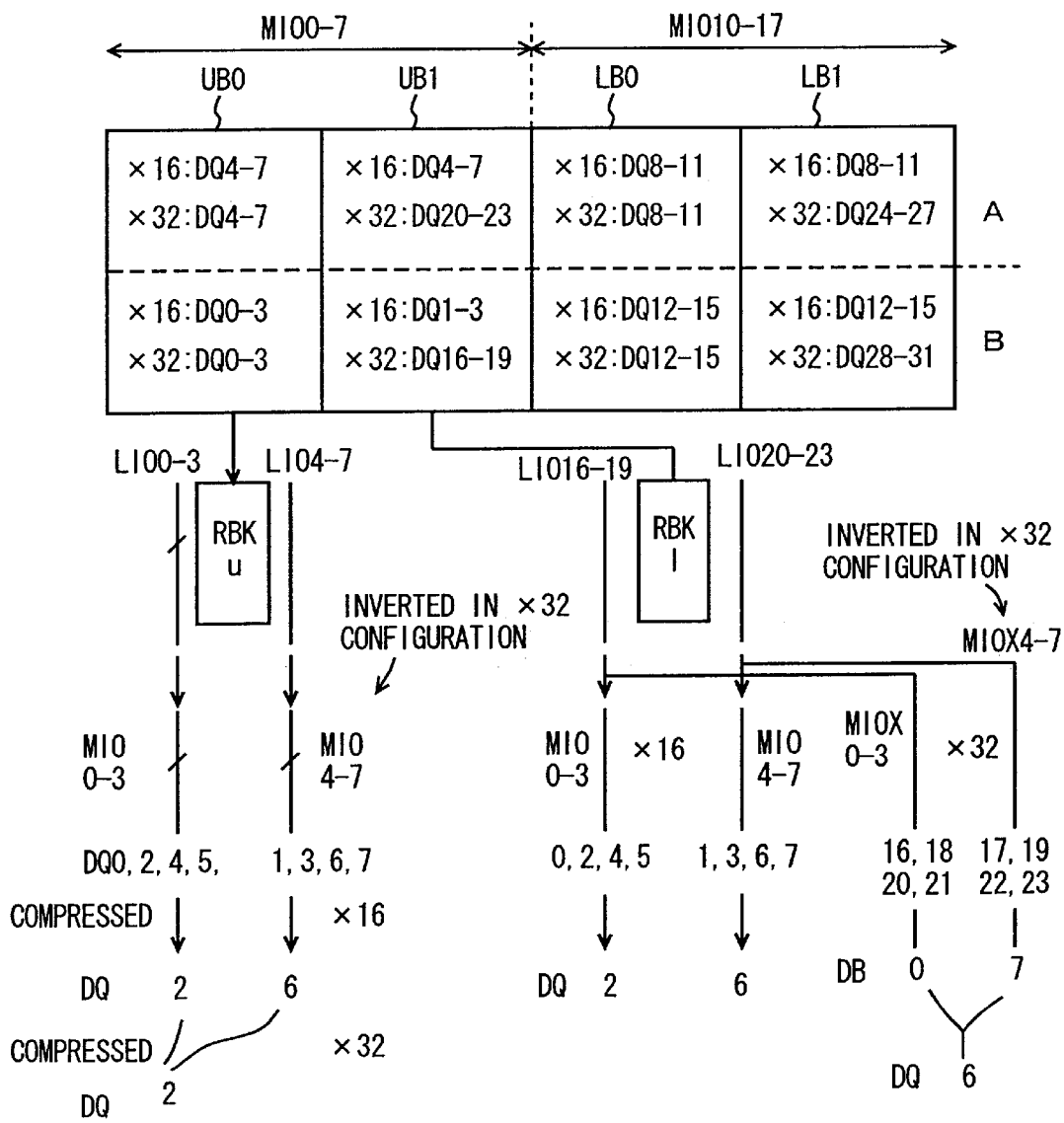
FIG. 16 is a diagram schematically illustrating a manner of data compression according to the invention.

FIG. 16 is a diagram schematically illustrating a data compressing manner in a multi-bit test according to the present invention. In a memory array, each of memory blocks UB0, UB1, LB0, and LB1 is divided into two sub blocks A and B. In block A of memory block UB0, in both of the ×16 bit configuration and ×32 bit configuration, data bits DQ4 to DQ7 are stored. In block B of memory block UB0, in both of the ×16 bit configuration and ×32 bit configuration, data bits DQ0 to DQ3 are stored.

Similarly, in block A of memory block LB0, in both of the ×16 bit configuration and ×32 bit configuration, data bits DQ8 to DQ11 are stored. In block B of memory block LB0, in both of the ×16 bit configuration and ×32 bit configuration, data bits DQ12 to DQ15 are stored.

Therefore, memory blocks UB0 and LB0 are connected to the first main data bus in both of the ×16 bit configuration and ×32 bit configuration.

On the other hand, in block A of memory block UB1, in the case of the ×16 bit configuration, data bits DQ4 to DQ7 are stored. In the case of the ×32 bit configuration, data bits DQ20 to DQ23 are stored. In block B of memory block UB1, in the case of the ×16 bit configuration, data bits DQ0 to DQ3 are stored. In the case of the ×32 bit configuration, data bits DQ16 to DQ19 are stored.

In block A of memory block LB1, in the configuration of the ×16 bit configuration, data bits DQ8 to DQ11 are stored. In the configuration of the ×32 bit configuration, data bits DQ24 to DQ27 are stored. In block B of memory block LB1, in the case of the ×16 bit configuration, data bits DQ12 to DQ15 are stored. In the case of the ×32 bit configuration, data bits DQ28 to DQ31 are stored. In memory blocks UB1 and LB1, as described above, the main data bus to which the row block is connected in the ×16 bit configuration is different from that in the ×32 bit configuration.

First, data compression (degeneration) in memory blocks UB0 and UB1 will be described. Data compression on memory blocks LB0 and LB1 is similar to the above except for that as data terminals for outputting compression results, data terminals DQ9 and DQ13 are used. In the following description, input/output data bit and a corresponding data terminal are designated by the same reference numeral.

In memory block UB0, for one row block RBKu, local data lines LIO0 to LIO3 and local data lines LIO4 to LIO7 are connected to main data lines MIO0 to MIO3 and MIO4 to MIO7 of the first main data bus, respectively. Although main data lines MIO and local data lines LIO are constructed into complementary signal pairs for transferring complementary data signals, for the purpose of simplification of the description, unless otherwise specified, each of data lines MIO and LIO is described as a single-end signal line.

On main data lines MIO0 to MIO3, data bits DQ0, DQ2, DQ4, and DQ5 are transmitted. On main data lines MIO4 to MIO7, data bits DQ1, DQ3, DQ6, and DQ7 are transmitted. Data bits DQ0, DQ2, DQ4, and DQ5 of four bits transmitted to main data lines MIO0 to MIO3 are compressed to one-bit data. In the ×16 bit configuration, a compression result is output to data terminal DQ2.

On the other hand, in main data lines MIO4 to MIO7, data bits DQ1, DQ3, DQ6, and DQ7 are compressed to one-bit data, and a compression result is output to data terminal DQ6. In the ×32 bit configuration, the compression results to be outputted to data terminals DQ2 and DQ6 in the ×16 bit configuration are further compressed to be outputted from data terminal DQ2. Therefore, with respect to row block RBKu included in memory block UB0, the same compressing operation is performed in the ×16 bit configuration and ×32 bit configuration. In the ×32 bit configuration, finally, by further compressing compression result data of two bits into compressed data of one bit, the compressed data of one bit in the ×32 bit configuration is generated and outputted.

On the other hand, in the case where row block RBK1 is selected in memory block UB1, a main data line connected in the ×16 bit configuration is different from that connected in the ×32 bit configuration. For row block RBK1, for example, local data lines LIO16 to LIO19 and local data lines LIO20 to LIO23 are disposed in corresponding sense amplifier bands. In the ×16 bit configuration, local data lines LIO16 to LIO19 are connected to main data lines MIO0 to MIO3, and local data lines LIO20 to LIO23 are connected to main data lines MIO4 to MIO7. Four-bit data of each of main data lines MIO0 to MIO3 and main data lines MIO4 to MIO7 is compressed to one-bit data, and two one-bit data are outputted to respective data terminals DQ2 and DQ6.

On the other hand, in the ×32 bit configuration, local data lines LIO16 to LIO19 and LIO20 to LIO23 are connected to main data lines MIOX0 to MIOX3 and MIOX4 to MIOX7, respectively. Main data lines MIOX0 to MIOX7 are main data lines included in the second main data bus, and main data lines MIO16 to MIO19 in the configuration shown in FIG. 9 correspond to main data lines MIOX0 to MIOX3. In the following description, to clarify the correspondence between the main data lines in the ×16 bit configuration and those in the ×32 bit configuration, reference numerals of main data lines MIO0 to MIO7 and MIO10 to MIO17 of the first main data bus and main data lines MIOX0 to MIOX7 and MIOX10 to MIOX17 of the second main data bus are used.

Data bits DQ16, DQ18, DQ20, and DQ21 are transmitted through main data lines MIOX0 to MIOX3, and data bits DQ17, DQ19, DQ22, and DQ23 are transmitted through main data lines MIOX4 to MIOX7. These four-bit data are each compressed to one-bit data, and these one-bit data are output to data terminals DQ0 and DQ7. In the ×32 bit configuration, the row blocks are simultaneously selected in memory blocks UB0 and UB1. In order to prevent collision between compression result data of row block RBKu and that of row block RBKl, upon compression in the ×32 bit configuration, compression results are transmitted through global data lines provided corresponding to data terminals DQ2, DQ6, DQ0, and DQ7, respectively. In such a manner, collision of compression result data is prevented. The compression results transmitted to global data buses DB0 and DB7 corresponding to data terminals DQ0 and DQ7 are further compressed to be output through data terminal DQ6.

Therefore, in compression in the ×32 bit configuration, 8-bit compressed data is output to each of data terminals DQ2 and DQ6. In the ×16 bit configuration, the 4-bit compressing result is output to each of data terminals DQ2 and DQ6. Therefore, irrespective of the data bit width, the compression results are output to data terminals DQ2 and DQ6.

With respect to memory blocks LB0 and LB1, a compressing operation similar to that illustrated in FIG. 16 is executed with respect to data terminals DQ9 and DQ13 by using main data lines MIO10 to MIO17 and MIOX10 to MIOX17.

Consequently, compression result data in the ×16 bit configuration and that in the ×32 bit configuration are output to data terminals DQ2, DQ6, DQ9, and DQ13. With such configuration, irrespective of the data bit width, the compression result data are output to the same data terminals. Thus, a multi-bit test can be performed using the common tester in both the ×16 bit configuration and ×32 bit configuration.

Figure 17A:
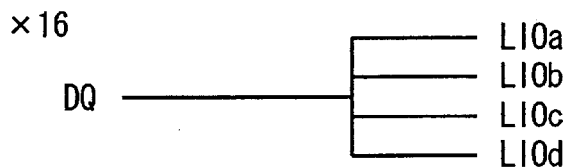
FIG. 17A is a diagram schematically showing the correspondence relationship between data bits and local data lines in the case of a ×16 bit configuration.

FIG. 17A is a diagram showing the correspondence between data of one bit and local data lines in the ×16 bit configuration. As shown in FIG. 17A, in the ×16 bit configuration, local data lines LIOa to LIOd of four bits arranged in one sense amplifier band correspond to data DQ of one bit. In a writing mode, data from data terminal DQ is commonly transferred to local data lines LIOa to LIOd.

Figure 17B:
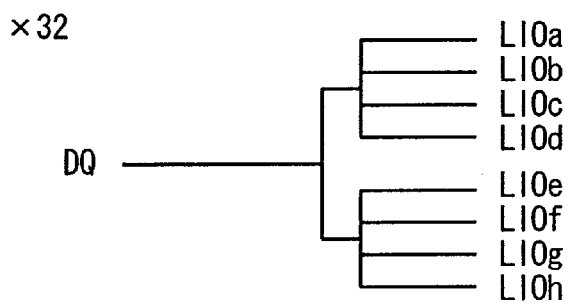
FIG. 17B is a diagram schematically showing the correspondence relationship between data bits and local data lines of a ×32 bit configuration.

In the ×32 bit configuration, as shown in FIG. 17B, data DQ of one bit corresponds to eight local data lines LIOa to LIOh. To one row block, local data lines LIOa to LIOd are arranged in one of sense amplifier bands, and local data lines LIOe to LIOh are arranged in the other sense amplifier band.

Figure 18:
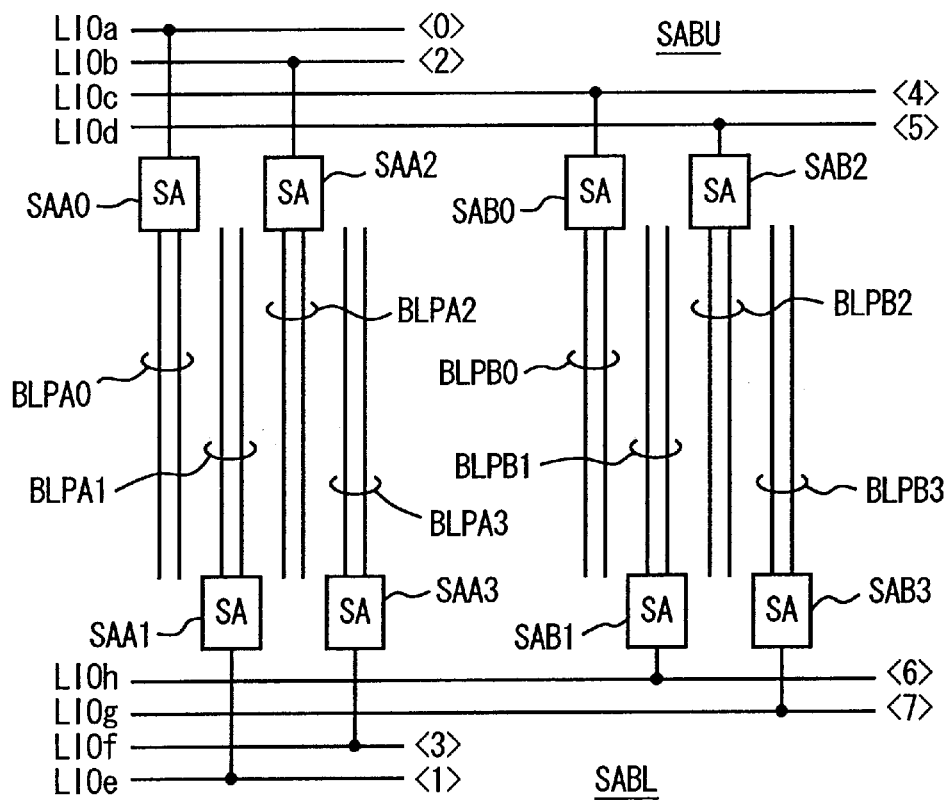
FIG. 18 is a diagram schematically showing the connection between a local data line and a bit line in a row block.

FIG. 18 is a diagram schematically showing the connection between sense amplifiers and local data lines in one basic block. In FIG. 18, local data lines LIOa to LIOd are disposed in sense amplifier band SABU. Local data lines LIOa to LIOd transmit, for example, data bits DQ0(<0>) and DQ2(<2>), and local data lines LIOc and LIOb transmit data bits DQ4(<4>) and DQ5(<5>), respectively.

In sense amplifier band SABL on the other side, local data lines LIOe to LIOh are disposed. Local data lines LIOe and LIOf transmit data bits DQ1(<1>) and DQ3(<3>), respectively. Local data lines LIOg and LIOh transmit data bits DQ7(<7>) and DQ6(<6>), respectively.

In a row block, sense amplifiers SA are alternately disposed to bit line pairs BLP. Specifically, in each of sense amplifier bands SABU and SABL, sense amplifiers are disposed every other bit line pair. In sense amplifier band SABU, sense amplifiers SAA0, SAA2, SAB0, and SAB2 are disposed. In sense amplifier band SABL, sense amplifiers SAA1, SAA3, SAB1, and SAB3 are disposed. Sense amplifiers SAA0 to SAA3 are disposed corresponding to bit line pairs BLPA0 to BLPA3, respectively, and sense amplifiers SAB0 to SAB3 are disposed corresponding to bit line pairs BLPB0 to BLPB3, respectively.

In a block A, sense amplifiers SAA0 and SAA2 are coupled to local data lines LIOa and LIOb, respectively, and sense amplifiers SAA1 and SAA3 are coupled to local data lines LIOe and LIOf, respectively. To simplify the drawing, column selection gates are not shown.

In a block B, sense amplifiers SAB0 and SAB2 are coupled to local data lines LIOc and LIOd, respectively, and sense amplifiers SAB1 and SAB3 are coupled to local data lines LIOh and LIOg, respectively. In the ×16 bit configuration, local data lines LIOa to LIOd and LIOe to LIOh can transfer data supplied from different data terminals. Therefore, in the case of the ×16 bit configuration, by inverting the logic levels of data bits transferred to local data lines LIOa to LIOd with respect to the logic levels of data bits transferred to local data lines LIOe to LIOh, data having different logic levels can be stored in adjacent memory cells, a leakage between adjacent cells (leak between storage nodes of adjacent memory cells) can be detected.

In the case of the ×32 bit configuration, data supplied from one data terminal is transferred to local data lines LIOa to LIOh. In the case of the ×32 bit configuration, the logic level of data bits transferred to local data lines LIOe to LIOh can be converted with a configuration described later. Consequently, in both of the ×16 bit configuration and ×32 bit configuration, the presence or absence of a leakage between adjacent cells can be detected.

Figure 19:
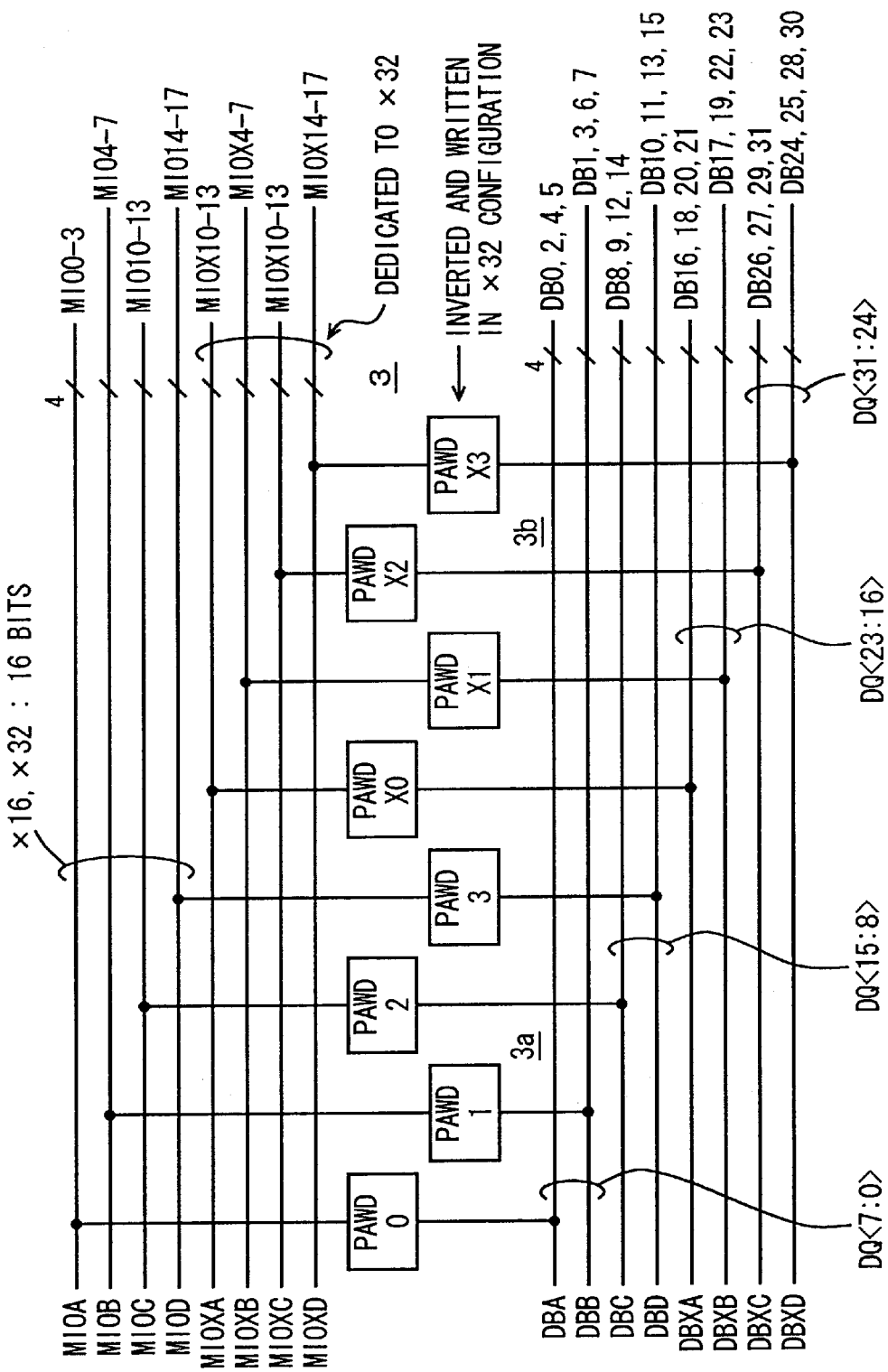
FIG. 19 is a diagram schematically showing the connections among a preamplifier/write drive circuit, a data line, and a global data line in the semiconductor memory device according to the invention.

FIG. 19 is a diagram schematically showing the correspondence relation between write/read circuits 3 for writing/reading internal data and data buses. In FIG. 19, write/read circuit 3a disposed for the first main data bus includes preamplifier/write drive circuits PAWD0 to PAWD3 disposed corresponding to main data lines MIOA to MIOD, respectively. Each of preamplifier/write drive circuits PAWD0 to PAWD3 reads and writes data of four bits.

Write/read circuit 3b disposed for the second main data bus includes preamplifier/write drive circuits PAWDX0 to PAWDX3 disposed corresponding to main data buses MIOXA to MIOXD, respectively. Each of main data buses MIOXA to MIOXD has a 4-bit width and is used only in the ×32 bit configuration. Each of preamplifier/write drive circuits PAWDX0 to PAWDX3 reads and writes data of four bits in the case of the ×32 bit configuration.

Main data bus MIOA includes main data lines MIO0 to MIO3. Main data bus MIOB includes main data lines MIO4 to MIO7. Main data bus MIOC includes main data lines MLO8 to MLO11. Main data bus MIOD includes main data lines MIO12 to MIO15. Main data line MIOXA includes main data lines MIOX0 to MIOX3. Main data bus MIOXB includes main data lines MIOX4 to MIOX7. Main data bus MIOXC includes main data lines MIOX8 to MIOX11. Main data bus MIOXD includes main data lines MIOX12 to MIOX15.

Main data buses MIOA to MIOD and MIOXA to MIOXD are each coupled to 4-bit local data buses disposed in one sense amplifier band. In the ×16 bit configuration, the 4-bit local data bus transfers data bits arranged discontinuously, such as data bits DQ0, DQ2, DQ4, and DQ5 or data bits DQ1, DQ3, DQ6, and DQ7. By transferring discontinuous data bits, an influence by mutual interference between data lines at the time of internal data transfer is prevented.

To achieve transfer of a set of discontinuous data bits, preamplifier/write drive circuits PAWD0 to PAWD3 and PAWDX0 to PAWDX3 are coupled to global data buses each constructed by de-successively arranged global data lines. The global data bus includes global data lines disposed corresponding to data terminals in a one-to-one correspondence. Therefore, the global data bus includes global data lines used in both the ×16 bit configuration and ×32 bit configuration and global data lines used only in the ×32 bit configuration.

Preamplifier/write drive circuit PAWD0 is coupled to a global data bus DBA, and preamplifier/write drive circuit PAWD1 is coupled to a global data bus DBB. Preamplifier/write drive circuit PAWD2 is coupled to a global data bus DBC. Preamplifier/write drive circuit PAWD3 is coupled to a global data bus DBD. Preamplifier/write drive circuit PAWDX0 is coupled to a global data bus DBXA, and preamplifier/write drive circuit PAWDX1 is coupled to a global data bus DBXB. Preamplifier/write drive circuit PAWDX2 is coupled to a global data bus DBXC. Preamplifier/write drive circuit PAWDX3 is coupled to a global data bus DBXD.

Global data bus DBA includes data lines DB0, DB2, DB4, and DB5 coupled to data terminals DQ0, DQ2, DQ4, and DQ5, respectively. Global data bus DBB includes data lines DB1, DB3, DB6, and DB7 coupled to data terminals DQ1, DQ3, DQ6, and DQ7, respectively. Global data bus DBC includes data lines DB8, DB9, DB12, and DB14 coupled to data terminals DQ8, DQ9, DQ12, and DQ14, respectively. Global data bus DBD includes data lines DB10, DB11, DB13, and DB15 coupled to data terminals DQ10, DQ11, DQ13, and DQ15, respectively.

Global data bus DBXA includes data lines DB16, DB18, DB20, and DB21 coupled to data terminals DQ16, DQ18, DQ20, and DQ21, respectively. Global data bus DBXB includes data lines DB17, DB19, DB22, and DB23 coupled to data terminals DQ17, DQ19, DQ22, and DQ23. Global data bus DBXC includes data lines DB26, DB27, DB29, and DB31 coupled to data terminals DQ26, DQ27, DQ29, and DQ31, respectively. Global data bus DBXD includes data lines DB24, DB25, DB28, and DB30 coupled to data terminals DQ24, DQ25, DQ28, and DQ30, respectively.

Through global data buses DBA and DBB, 8-bit data DQ<7:0> is transferred. Via global data buses DBC and DBD, 8-bit data DQ<15:8> is transferred. Via global data buses DBXA and DBXB, 8-bit data DQ<23:16> is transferred. Via global data buses DBXC and DBXC, 8-bit data DQ<31:24> is transferred.

In each of preamplifier/write drive circuits PAWD0 to PAWD3 and PAWDX0 to PAWDX3, compression to 4-bit data as well as expansion to 4-bit data are performed. In writing test data in the ×32 bit configuration, therefore, in each of preamplifier/write drive circuits PAWD1, PAWD3, PAWDX1, and PAWDX3, a write driver inverts supplied test data and transfers the inverted test data to a corresponding main data line.

Preamplifier/write drive circuits PAWD0 and PAWD1 transfer data to local data buses disposed for the same row block, and preamplifier/write drive circuits PAWD2 and PAWD3 transfer write data to local data buses disposed for the same row block. Preamplifier/write drive circuits PAWDX0 and PAWDX1 transfer write data to local data buses provided for the same row block. Preamplifer/write drive circuits PAWDX2 and PAWDX3 transfer write data to local data buses disposed for the same row block.

In the 32-bit configuration, each of preamplifier/write drive circuits PAWD1, PAWD3, PAWDX1 and PAWDX3 inverts write data. Consequently, inverted data are transferred to the local data bus disposed in one of the sense amplifier bands arranged to the same row block as shown in FIG. 18, data of different logic levels can be written into adjacent memory cells, and the presence of a leakage between adjacent memory cells can be detected.

Figure 20:
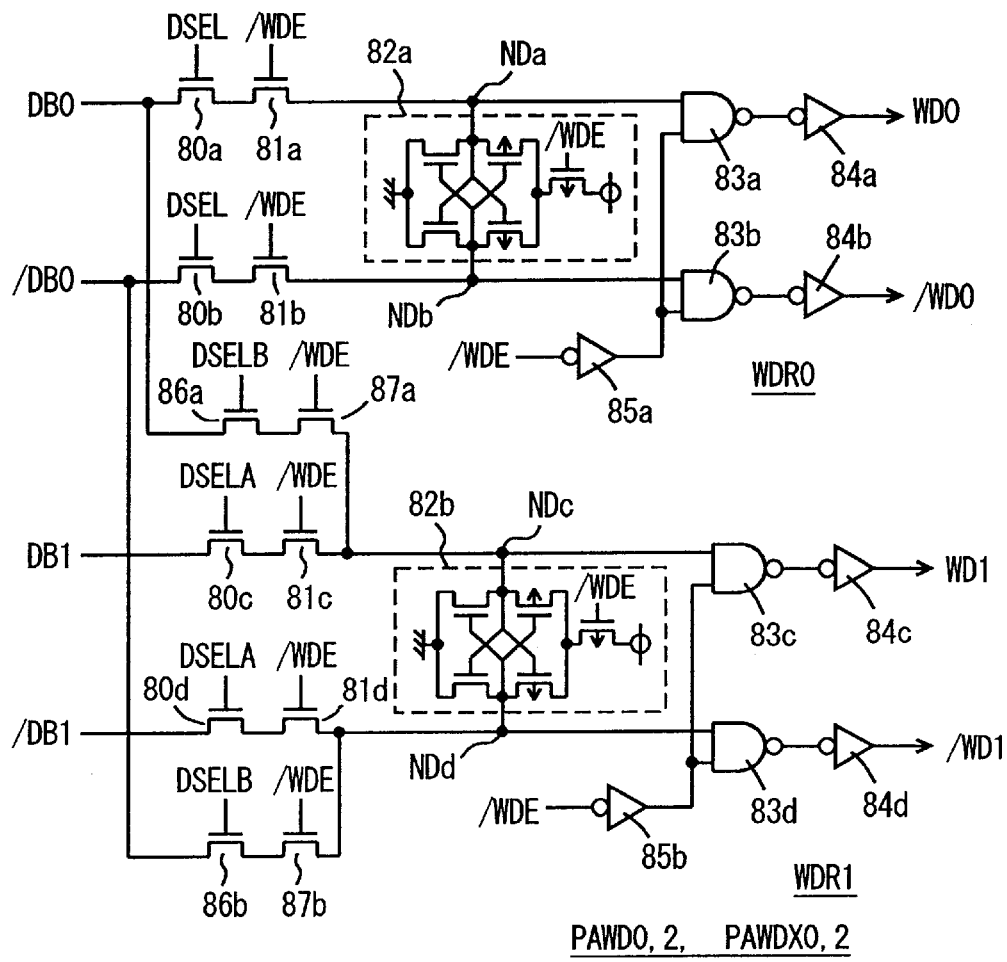
FIG. 20 is a diagram schematically showing the configuration of a write driver included in the preamplifier/write drive circuit shown in FIG. 19.

FIG. 20 is a diagram showing the configuration of write drive circuits in preamplifier/write drive circuits PAWD0, PAWD2, PAWDX0, and PAWDX2 shown in FIG. 19. In FIG. 20, write drivers WDR0 and WDR1 for generating write data of two bits in a single preamplifier/write drive circuit are representatively shown.

Write driver WDR0 includes: N-channel MOS transistors 80a and 80b that are coupled to complementary global data lines DB0 and /DB0 and are made conductive in accordance with data line selection signal DSEL; N-channel MOS transistors 81a and 81b that enter a non-conductive state when write driver enable signal /WDE is activated, to isolate nodes NDa and NDb from global data lines DB0 and /DB0; an amplifying circuit 82a that is activated when write driver enable signal /WDE is activated, to amplify the difference between voltages at nodes NDa and NDb; an inverter 85a receiving write driver enable signal /WDE; an NAND circuit 83a receiving an output signal of inverter 85a and a signal at node NDa; an NAND circuit 83b receiving an output signal of inverter 85a which inverts an output signal of NAND circuit 83a, to generate internal write data WE0; an NAND circuit 83b receiving an output signal of inverter 85a and a signal at node NDb; and an inverter 84b receiving an output signal of NAND circuit 83b to generate write data /WD0.

Global data lines DB0, /DB0 and DB1 and /DB1 shown in the figure are, different from global data lines disposed corresponding to data terminal DQ<0>, generic global data lines and represent data bus for transferring data of two bits out of corresponding data of four bits.

By inverters 84a and 84b, complementary write data WD0 and /WD0 is transmitted to the data lines of the corresponding main data line pair. Write driver enable signal /WDE is at an L level when activated.

When data line selection signal DSEL is made active, MOS transistors 80a and 80b are made conductive to transmit data transferred via data lines DB0 and /DB0 to nodes NDa and NDb. When write driver enable signal /WDE is made active, MOS transistors 81a and 81b are turned off, and amplifying circuit 82a performs a differential amplifying operation in accordance with charges confined on nodes NDa and NDb.

Amplifying circuit 82a includes cross-coupled P-channel MOS transistors, cross-coupled N-channel MOS transistors, and an activating transistor for supplying a power supply voltage to the cross-coupled P-channel MOS transistors in response to write driver enable signal /WDE. When amplifying circuit 82a is inactive, current supply from the power supply node is stopped. When amplifying circuit 82a is active, the node at the higher voltage level out of nodes NDa and NDb is driven to the power supply voltage level by the cross-coupled P-channel MOSS transistors. When write driver enable signal /WDE is inactive, nodes NDa and NDb are set to the ground voltage level.

When write driver enable signal /WDE is in the inactive state, an output signal of inverter 85a is at the L level, and NAND circuits 83a and 83b each output a signal of the H level. In a standby state, therefore, write data WD0 and /WD0 is at the L level. In a data writing mode, data line selection signal DSEL is activated and then, write driver enable signal /WDE is activated. Amplifying circuit 82a amplifies and latches a voltage difference between nodes NDa and NDb. Since the output signal of inverter 85a is at the H level, NAND circuits 83a and 83b each operate as an inverter. Therefore, as write data WD0 and /WD0, data having the same logic level as that transmitted through data lines DB0 and /DB0 is transferred.

Write driver WDR1 includes: N-channel MOS transistors 80c and 80d which are coupled to global data lines DB1 and /DB1 and are made selectively conductive in accordance with data line selection signal DSELA; N-channel MOS transistors 81c and 81d which are made conductive when write driver enable signal /WDE is made inactive, to couple MOS transistors 80c and 80d to nodes NDc and NDd; N-channel MOS transistors 86a and 86b which are coupled to data lines DB0 and /DB0 and selectively made conductive in accordance with test mode data line selection signal DSELB; N-channel MOS transistors 87a and 87b which are made active when write driver enable signal /WDE is inactivated, to couple MOS transistors 86a and 86b to nodes NDc and NDd; an amplifying circuit 82b which is activated when write driver enable signal /WDE is activated, to amplify the difference between voltages at nodes NDa and NDb; an inverter 85b receiving write driver enable signal /WDE; an NAND circuit 83c receiving an output signal of inverter 85b and a signal at node NDc; an inverter 84c for inverting an output signal of NAND circuit 83c to generate internal write data WD1; an NAND circuit 83d receiving an output signal of inverter 85b and a signal of node NDd; and an inverter 84d for inverting an output signal of NAND circuit 83d to generate internal write data /WD1.

Test mode data line selection signal DSELB is activated according to data line selection signal DSEL in a multi-bit test mode. Data line selection signal DSELA is generated according to a data line selection signal in an operation mode other than the multi-bit test mode. In the multi-bit test mode, data line selection signal DSELA is set to the L level of the non-selected state.

In the multi-bit test mode, data line selection signal DSEL supplied to write driver WDR1 is maintained in an inactive state. Therefore, in the multi-bit test mode, according to data on data lines DB0 and /DB0, internal write data WD1 and /WD1 are generated.

In a normal operation mode, test mode data line selection signal DSELB is maintained in an inactive state of the L level. In this state, according to data line selection signal DSELA (DSEL), data lines DB1 and /DB1 are coupled to internal nodes NDc and NDd. Therefore, in the normal operation mode, according to data on global data lines DB1 and /DB1, internal write data WD1 and /WD1 are generated.

On the other hand, in the multi-bit test mode, according to data on data lines DB0 and /DB0, write data WD1 and WD1 are generated. Each of the write drives of remaining two bits has the configuration similar to that of write driver WDR1. Therefore, in the multi-bit test mode, according to data on data lines DB0 and /DB0, write data of four bits is generated and transferred to corresponding main data lines.

Figure 21:
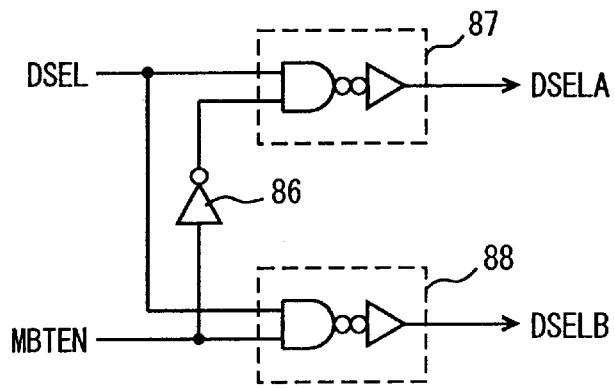
FIG. 21 is a diagram showing an example of the configuration of a section for generating a data line selection signal shown in FIG. 20.

FIG. 21 is a diagram showing an example of the configuration of a circuit for generating data line selection signals DSELA and DSELB for write driver WDR1 shown in FIG. 20. In FIG. 21, the data line write signal generating circuit includes an inverter 86 receiving a multi-bit test enable signal MBTEN, an AND circuit 87 receiving an output signal of inverter and data line selection signal DSEL and generating data line selection signal DSELA, and an AND circuit 88 receiving data line selection signal DSEL and multi-bit test enable signal MBTEN and generating test mode data line selection signal DSELB.

Multi-bit test enable signal MBTEN is set either by fixing the potential of a specific pad by a tester or according to a timing relationship between specific signals. In the data write operation mode, data line selection signal DSEL is activated at a predetermined timing, earlier than activation of write driver enable signal /WDE.

When multi-bit test enable signal MBTEN is set to the H level and the multi-bit test mode is set, data line selection signal DSELA output from AND circuit 87 is fixed to the L level. On the other hand, AND circuit 88 generates test mode data line selection signal DSELB in accordance with data line selection signal DSEL.

When multi-bit test enable signal MBTEN is at the L level, an output signal of inverter 86 is at the H level, and normal mode data line selection signal DSELA is generated according to data line selection signal DSEL. In this state, test mode data line selection signal DSELB is fixed to the L level.

In the configuration of the write driver shown in FIG. 20, inverters 85a and 85b receiving write driver enable signal /WDE may be disposed being formed into a common single inverter in the preamplifier/write drive circuit.

Figure 22:
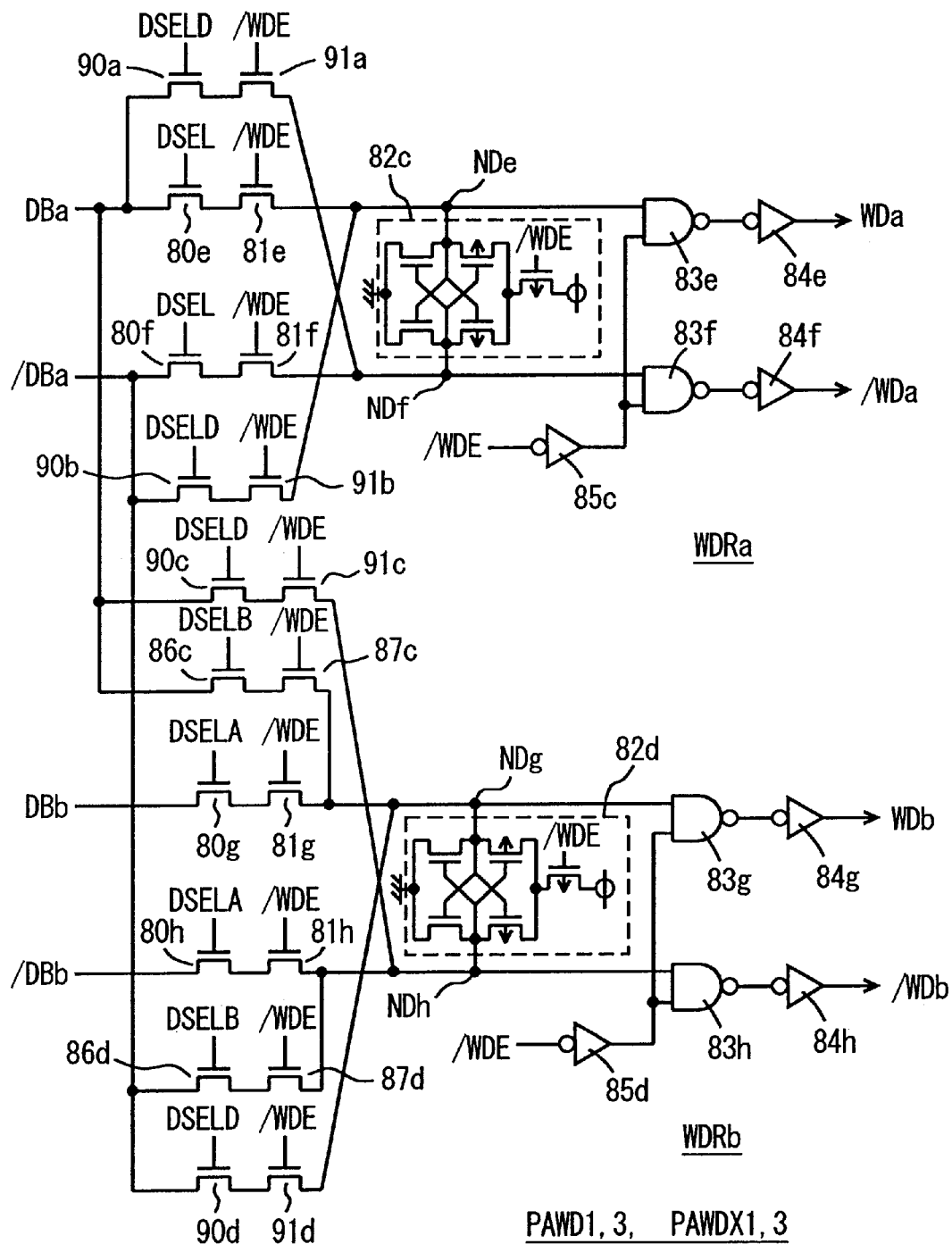
FIG. 22 is a diagram showing the configuration of a write driver having a write data inverting function in the preamplifier/write drive circuit shown in FIG. 19.

FIG. 22 is a diagram showing the configuration of preamplifier/write drive circuits PAWD1, PAWD3, PAWDX1, and PAWDX3 shown in FIG. 19. Since preamplifier/write drive circuits PAWD1, PAWD3, PAWDX1, and PAWDX3 have the same configuration, FIG. 22 shows, as a representative, write drivers WDRa and WDRb of two bits included in the preamplifier/write drive circuit.

Write driver WDRa includes: N-channel MOS transistors 80e and 80f which are connected to global data lines DBa and /DBa and selectively made conductive according to normal mode data line selection signal DSELA; N-channel MOS transistors 81e and 81f which are made conductive when write driver enable signal /WDE is inactivated to couple MOS transistors 80e and 80f to nodes NDe and NDf, respectively; N-channel MOS transistors 90a and 90b which are coupled to global data lines DBa and /DBa, respectively, and selectively made conductive in accordance with an inversion mode data line selection signal DSELD; N-channel MOS transistors 91a and 91b which are made conductive in response to write driver enable signal /WDE to couple MOS transistors 90a and 90b to nodes NDe and NDf, respectively; an amplifying circuit 82c which is activated when write driver enable signal /WDE is activated, to amplify and latch the voltage difference between nodes NDe and NDf; an inverter 85c which receives write driver enable signal /WDE; an NAND circuit 83e which receives an output signal of inverter 85c and a signal on node NDe; an inverter 84e which receives an output signal of NAND circuit 83e and generates internal write data WDa; an NAND circuit 83f which receives an output signal of inverter 85c and signal on node NDf; and an inverter 84f for inverting an output signal of NAND circuit 83f to generate complementary internal write data /WDa.

Inversion mode data line selection signal DSELD is activated according to data line selection signal DSEL when inversion of a bit is designated in a multi-bit test mode of the ×32 bit configuration.

Write driver WDRb includes: N-channel MOS transistors 80g and 80h which are connected to global data lines DBb and /DBb and selectively made conductive according to normal mode data line selection signal DSELA; N-channel MOS transistors 81g and 81h which are made conductive according to write driver enable signal /WDE to couple MOS transistors 80g and 80h to nodes NDg and NDh, respectively; N-channel MOS transistors 86c and 86d which are connected to global data lines DBa and /DBa, respectively, and selectively made conductive in accordance with test mode data line selection signal DSELB; N-channel MOS transistors 87c and 87d which are made conductive when write driver enable signal /WDE is activated, to couple MOS transistors 86c and 86d to nodes NDg and NDh, respectively; N-channel MOS transistors 90c and 90d which are connected to global data lines DBa and /DBa and made conductive in accordance with inversion mode data line selection signal DSELD; N-channel MOS transistors 91c and 91d which are selectively made conductive in response to write driver enable signal /WDE, to couple MOS transistors 90c and 90d to nodes NDh and NDg, respectively; an amplifying circuit 82d which is activated when write driver enable signal /WDE is activated, to amplify and latch the difference between nodes NDg and NDh; an inverter 85d which receives write driver enable signal /WDE; an NAND circuit 83g which receives an output signal of inverter 85d and a signal on node NDh; an inverter 84g for inverting an output signal of NAND circuit 83g and generates internal write data WDb; an NAND circuit 83h which receives an output signal of inverter 85d and a signal on node NDh; and an inverter 84h for inverting an output signal of NAND circuit 83h to generate internal write data /WDb.

In a normal operation mode, in write driver WDRa, data line selection signal DSEL is driven to an active state, and global data lines DBa and /DBa are coupled to internal nodes ND3 and NDf by MOS transistors 80e and 80f, respectively. In write driver WDRb as well, global data lines DBb and /DBb are coupled to internal nodes NDg and NDh. Therefore, when write driver enable signal /WDE is activated, according to data on global data lines DBa and /DBa, internal write data WDa and /WDa are generated. Similarly, also in the write driver WDRb, according to data on global data lines DBb and /DBb, internal write data WDb and /WDb are generated.

In the multi-bit test mode, in the case where write data bit inversion is not performed, test mode data line selection signal DSELB is activated according to data line selection signal DSEL. In this state, therefore, in write driver WDRa, global data lines DBa and /DBa are coupled to internal nodes NDe and NDf, respectively and, simultaneously, coupled to internal nodes NDg and NDh, respectively, by MOS transistors 86c, 87c, 86d, and 87d. Therefore, according to data on global data lines DBa and /DBa, internal write data WDa and /WDa and internal write data WDb and /WDb are generated. When inversion mode data line selection signal BSELD is activated, global data line DBa is coupled to node NDf via MOS transistors 90a and 91a, and global data line DBa is coupled to node NDe via MOS transistors 90b and 9ab. Thus, internal write data WDa and /WDa becomes inverted data of data on global data lines DBa and /DBa.

In write driver WDRb as well, inversion mode data line selection signal DSELD is made active, global data line DBa is coupled to node NDh via MOS transistors 90c and 91c, and global data line /DBa is coupled to node NDg via MOS transistors 90b and 91g. Amplifying circuit 82d is made active to amplify and latch data on nodes NDg and NDh. The latched data is inversion data of data on global data lines DBa and /DBa. According to the data produced by inverting the data on global data lines DBa and /DBa, internal write data WDb and /WDb are generated.

Each of the write drives of remaining two bits has a configuration similar to that of write driver WDRb. Therefore, in the ×32 bit configuration, by activating inversion mode data line selection signal DSELD in the multi-bit test mode, to invert supplied data of one bit, data of four bits of the same logic level can be generated and transferred to corresponding local data bus of four bits.

Figure 23:
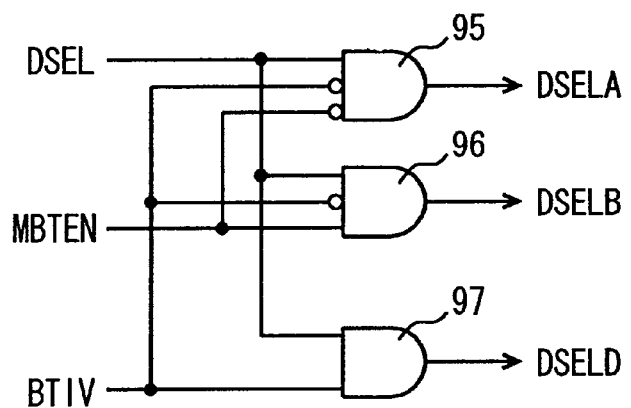
FIG. 23 is a diagram showing an example of the configuration of a section for generating a data line selection signal shown in FIG. 22.

FIG. 23 is a diagram showing an example of the configuration of a section for generating the data line selection signal shown in FIG. 22. In FIG. 23, the data line selection signal generating portion includes: a gate circuit 95 which receives data line selection signal DSEL, multi-bit test enable signal MBTEN, and bit inversion mode instruction signal BTIV and generates test mode data line selection signal DSELA; a gate circuit 96 which receives data line selection signal DSEL, multi-bit test enable signal MBTEN, and bit inversion mode instruction signal BTIV and generates test mode data line selection signal DSELB; and a gate circuit 97 which receives data line selection signal DSEL and bit inversion mode instruction signal BTIV and generates inversion mode data line selection signal DSELD.

When both multi-bit test enable signal MBTEN and bit inversion mode instruction signal BTIV are at the L level, gate circuit 95 generates test mode data line selection signal DSELA in accordance with data line selection signal DSEL. When at least one of multi-bit test enable signal MBTEN and bit inversion mode instruction signal BTIV is at the H level, gate circuit 95 fixes test mode data line selection signal DSELA to the L level.

When bit inversion mode instruction signal BTIV is at the L level and multi-bit test enable signal MBTEN is at the H level, gate circuit 96 generates test mode data line selection signal DSELB in accordance with data line selection signal DSEL.

When bit inversion mode instruction signal BTIV is at the H level, gate circuit 97 generates inversion mode data line selection signal DSELD in accordance with data line selection signal DSEL.

Bit inversion mode instruction signal BTIV is set according to a test by a tester in the multi-bit test mode.

Figure 24:
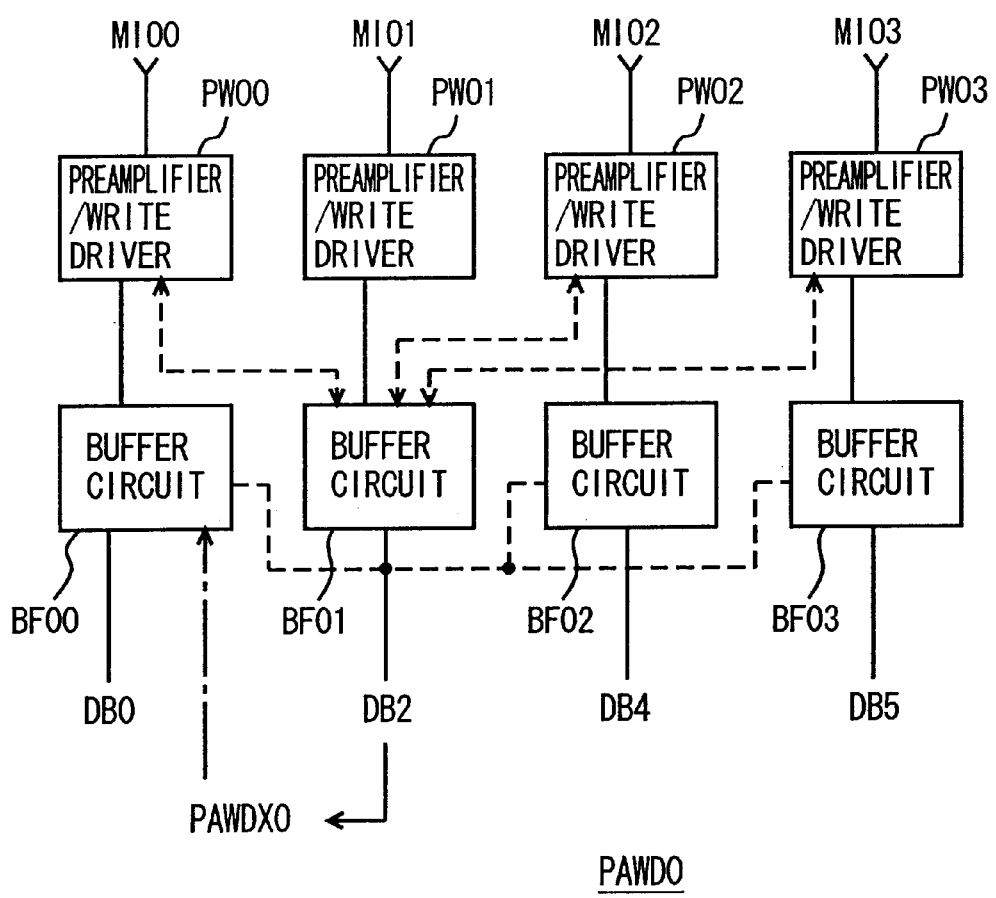
FIG. 24 is a diagram schematically showing the configuration of the preamplifier/write drive circuit shown in FIG. 19 and a compression path.

FIG. 24 is a diagram schematically showing the configuration of preamplifier/write drive circuit PAWD0 shown in FIG. 19. Preamplifier/write drive circuit PAWD0 includes: preamplifier/write drivers PW00 to PW03 provided corresponding to main data lines MIO0 to MIO3, respectively; and buffer circuits BF00 to BF03 provided corresponding to preamplifier/write drivers PW00 to PW03, respectively.

Buffer circuits BF00, BF01, BF02, and BF03 are coupled to global data lines DB0, DB2, DB4, and DB5, respectively.

In FIG. 24, a broken line indicates a transmission path of expansion/compression data in the ×16 bit mode, and an alternate long and short dash line indicates a transmission path of data in the ×32 bit mode. In a compressing operation in the ×16 bit configuration, buffer circuit BF01 is coupled to preamplifier/write drivers PW00 to PW03. Therefore, in the multi-bit test mode in the ×16 bit configuration, write data DQ<2> transmitted onto global data line DB2 is transmitted to preamplifier/write drivers PW00 to PW03 through buffer circuit BF01. At the time of data compression, read data from preamplifier/write drivers PW00 to PW03 are transmitted to buffer circuit BF01 and compressed to 1-bit data, and the 1-bit data is transmitted through global data line DB2.

In the multi-bit test mode in the ×32 bit configuration, data bit DQ<2> on global data line DB2 is further transferred to preamplifier/write drive circuit PAWDX0 shown in FIG. 19 which generates 4-bit data in accordance with the transferred data. Therefore, in data expanding operation in the ×32 bit configuration, according to data DQ<2> transmitted onto global data line DB2, write data is generated in each of preamplifier/write drivers PW00 to PW03 and further, 4-bit data is generated according to data bit DQ<2> transmitted to preamplifier/write drive circuit PAWDX0, so that write data of a total of eight bits is generated.

In data compression, buffer circuit BF00 compresses the 4-bit data from preamplifier/write drive circuit PAWDX0 into 1-bit data, and outputs data of the compression result onto global data line DB0.

Figure 25:
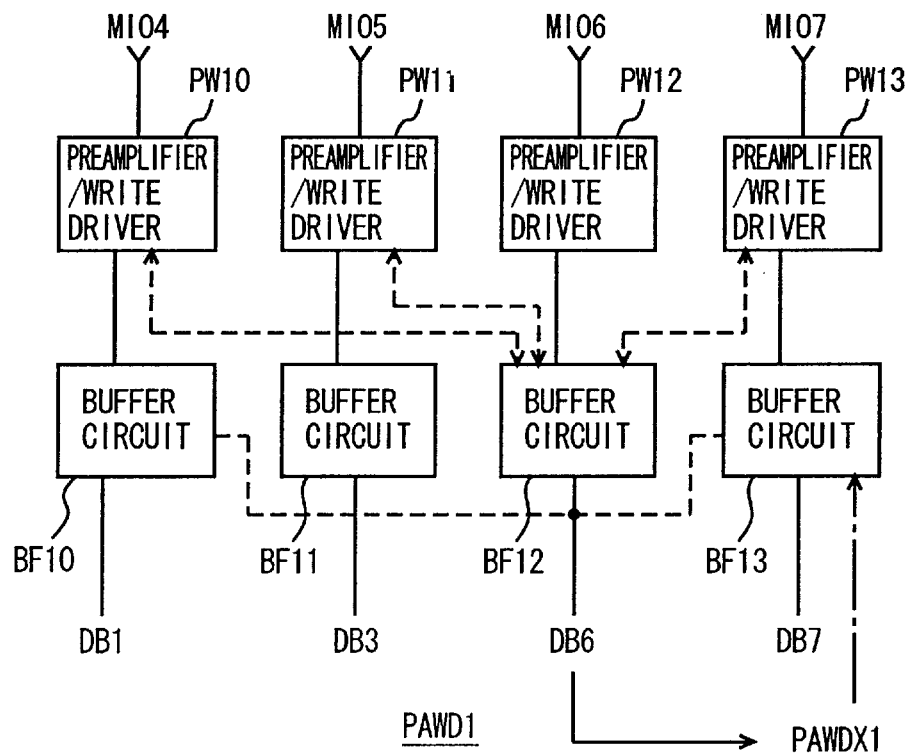
FIG. 25 is a diagram schematically showing the configuration of the preamplifier/write drive circuit PAWD1 shown in FIG. 19, and a compression/expansion path.

FIG. 25 is a diagram schematically showing a data transfer path of preamplifier/write drive circuit PAWD1 shown in FIG. 19. In FIG. 25, preamplifier/write drives PW10 to PW13 are disposed corresponding to main data lines MIO4 to MIO7, respectively. Corresponding to preamplifier/write drivers PW10 to PW13, buffer circuits BF10 to BF13 are disposed, respectively. Buffer circuits BF10, BF11, BF12, and BF13 are disposed corresponding to global data lines DB1, DB3, DB6, and DB7, respectively.

In the multi-bit test mode in each of the ×16 bit and ×32 bit configurations, data bit DQ<6> supplied to buffer circuit BF12 is supplied to preamplifer/write drivers PW10 to PW13 in a data writing mode. In a data reading mode, data read from preamplifier/write drivers PW10 to PW13 are supplied to buffer circuit BF12 and compressed to 1-bit data, and the 1-bit data is transmitted to global data line DB6.

In the multi-bit test mode in the ×32 bit configuration, further, in data compression, buffer circuit BF13 compresses the 4-bit data transferred from preamplifier/write drive circuit PAWDX into 1-bit data, and transfers the 1-bit data to global data line DB7.

In the multi-bit test mode in the ×32 bit configuration, further, data on global data line DB6 is transferred to preamplifier/write drive circuit PAWDX1, which in turn generates data of four bits in accordance with the supplied data. Therefore, in the multi-bit test mode of the ×32 bit configuration, in preamplifier/write drive circuits PAWD1 and PAWDX1, according to data bit DQ<6> transmitted on global data line DB6, test write data is generated.

In data compression, buffer circuit BF12 compresses supplied 4-bit data into 1-bit data, and outputs the 1-bit data to global data line DB6. Buffer circuit BF13 compresses 4-bit data from preamplifier/write drive circuit PAWDX1 into 1-bit data, and outputs the 1-bit data to global data line DB7.

Figure 26:
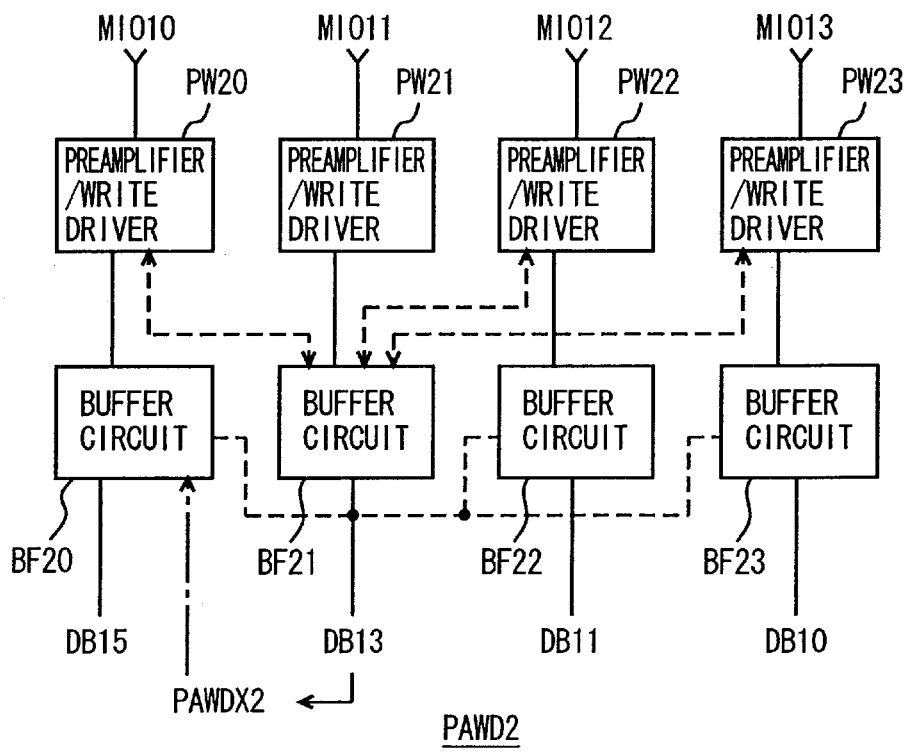
FIG. 26 is a diagram schematically showing the configuration of the preamplifier/write drive circuit PAWD2 shown in FIG. 19, and a compression/expansion path.

FIG. 26 is a diagram schematically showing the configuration of preamplifier/write drive circuit PAWD2 shown in FIG. 19. In FIG. 26, preamplifier/write drive circuit PAWD2 includes preamplifier/write drivers PW20 to PW23 disposed corresponding to main data lines MIO10 to MIO13, respectively. Main data lines MIO10 to MIO13 correspond to the 4-bit data bus of second main data bus 2. Corresponding to preamplifier/write drives PW20 to PW23, buffer circuits BF20 to BF23 are disposed, respectively. Buffer circuits BF20, BF21, BF22, and BF23 are coupled to global data lines DB15, DB13, DB11, and DB10, respectively.

In the ×32 bit and ×16 bit configurations, preamplifier/write drives PW20 to PW23 are coupled to buffer circuit BF21, and a multi-bit test is performed. Therefore, according to data DQ<13> transmitted to global data line DB13, test write data is generated onto main data lines MIO10 to MIO13. Compressed data of data read onto main data lines MIO10 to MIO13 is transmitted from buffer circuit BF21 to global data line DB13.

In the multi-bit test mode in the ×32 bit configuration, further, buffer circuit BF20 compresses the 4-bit data transferred from preamplifier/data drive circuit PAWDX2 into 1-bit data, and outputs the 1-bit data to global data line DB15. In the multi-bit test, preamplifier/write drive circuit PAWDX2 generates write data of four bits in accordance with data transmitted through global data line DB13. Therefore, in the ×32 bit configuration, in the multi-bit test mode, test data of eight bits is generated according to data DQ<13> of global data line DB13, 4-bit data from each of preamplifier/write drive circuits PAWD2 and PAWDX2 is compressed to 1-bit data, and the respective 1-bit compressed data are transmitted to global data lines DB13 and DB15.

Figure 27:
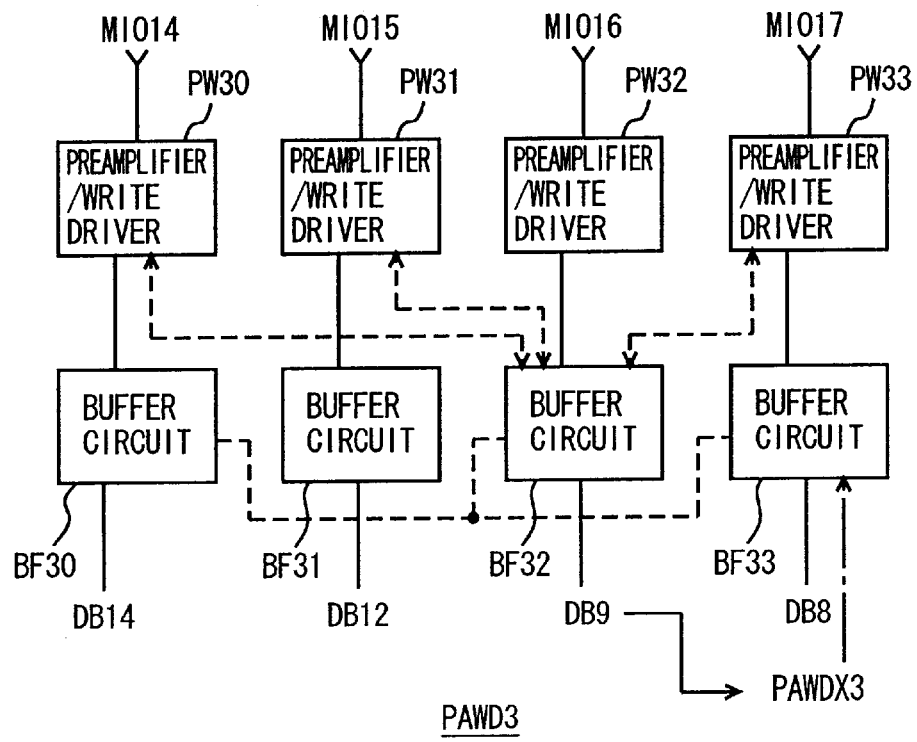
FIG. 27 is a diagram schematically showing the configuration of the preamplifier/write drive circuit PAWD3 shown in FIG. 19, and a compression/expansion path.

FIG. 27 is a diagram schematically showing the configuration of preamplifier/write drive circuit PAWD3 shown in FIG. 19. In FIG. 27, preamplifier/write drive circuit PAWD3 includes preamplifier/write drivers PW30 to PW33 disposed corresponding to main data lines MIO14 to MIO17, respectively, and buffer circuits BF30 to BF33 disposed corresponding to preamplifier/write drivers PW30 to PW33, respectively.

Buffer circuits BF30, BF31, BF32, and BF33 are coupled to global data lines DB14, DB12, DB9, and DB8, respectively.

In the multi-bit test mode, buffer circuit BF32 is coupled to preamplifier/write drivers PW30 to PW33. Therefore, test data transmitted onto global data line DB9 is transmitted to preamplifier/write drivers PW30 to PW33, and transmitted to main data lines MIO14 to MIO17. In a data reading mode, pre-amplified data read from preamplifier/write drivers PW30 to PW33 is compressed to 1-bit data, and the 1-bit data is transmitted to global data line DB9.

In the ×32 bit configuration, further, data on global data line DB9 is transmitted to preamplifier/write drive circuit PAWDX3, which in turn generates test write data of four bits in accordance with the received data, and the test write data is transmitted to corresponding main data lines. In a data reading mode, 4-bit data read from preamplifier/write drive circuit PAWDX3 is supplied to buffer circuit BF33, and compressed to 1-bit data, and the 1-bit data is transmitted to global data line DB8.

In the ×32 bit configuration, therefore, compressed data are transmitted onto global data lines DB9 and DB8.

Figure 28:
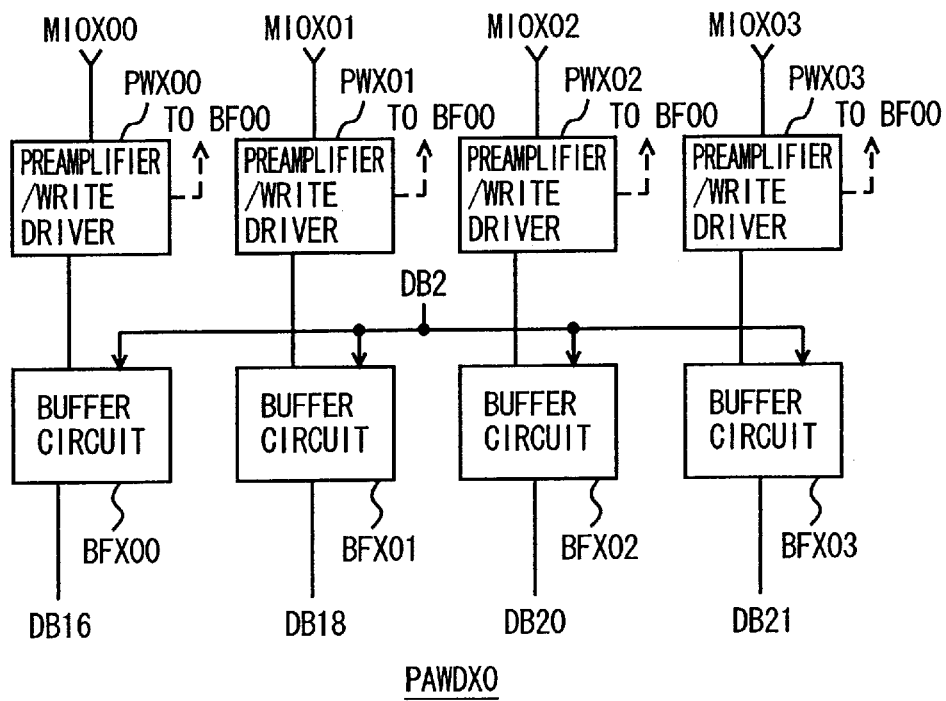
FIG. 28 is a diagram schematically showing the configuration of a preamplifier/write drive circuit PAWDX0 shown in FIG. 19, and a compression/expansion path.

FIG. 28 is a diagram schematically showing the configuration of preamplifier/write drive circuit PAWDX0 shown in FIG. 19. In FIG. 28, preamplifier/write drive circuit PAWDX0 includes preamplifier/write drivers PWX00 to PWX03 disposed corresponding to main data lines MIOX00 to MIOX03, respectively. In the multi-bit test mode of the ×32 bit configuration, internal read data output from preamplifier/write drivers PWX00 to PWX03 are transferred to buffer circuit BF00 in preamplifier/write drive circuit PAWD0 and compressed to 1-bit data. Corresponding to preamplifier/write drivers PWX00 to PWX03, buffer circuits BFX00 to BFX03 are disposed, respectively. Buffer circuits BFX00, BFX01, BFX02, and BFX03 are disposed corresponding to global data lines DB16, DB18, DB20, and DB21, respectively. To perform a multi-bit test, each of buffer circuits BFX00 to BFX03 is coupled to global data line DB2. In the multi-bit test mode of the ×32 bit configuration, according to data on global data line DB2, data of four bits is generated, and test data at the same logic level is transferred to each of main data lines MIOX00 to MIOX03.

Figure 29:
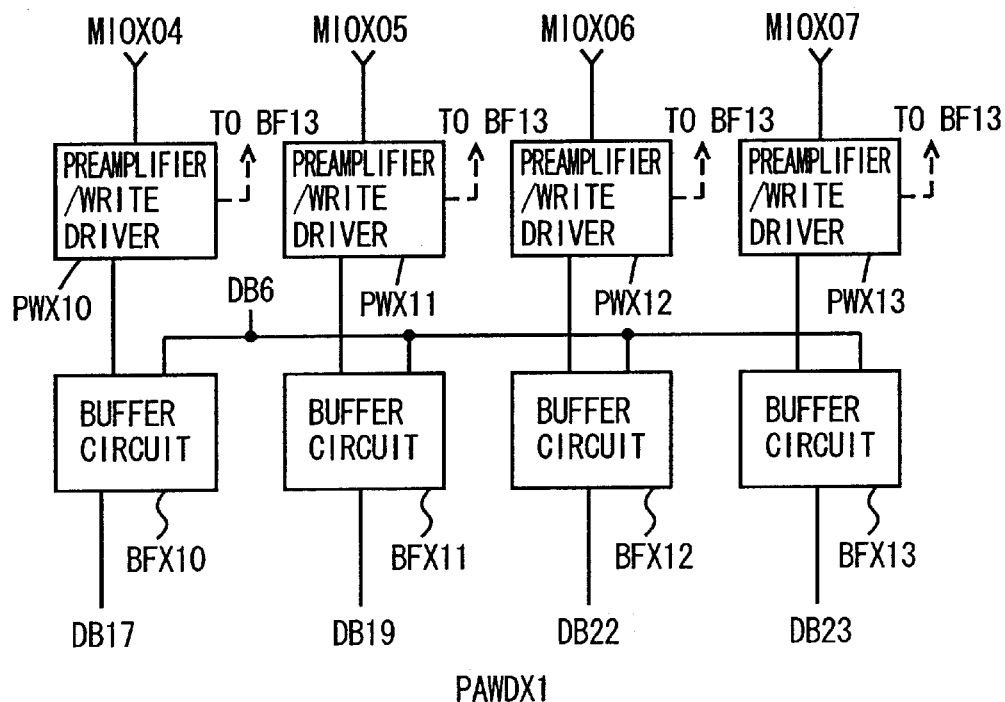
FIG. 29 is a diagram schematically showing the configuration of the preamplifier/write drive circuit PAWDX1 shown in FIG. 19, and a compression/expansion path.

FIG. 29 is a diagram schematically showing the configuration of preamplifier/write drive circuit PAWDX1 shown in FIG. 19. In FIG. 29, preamplifier/write drive circuit PAWDX1 includes preamplifier/write drivers PWX10 to PWX13 disposed corresponding to main data lines MIOX04 to MIOX07, respectively. In the multi-bit test mode, preamplifier/write drivers PWX10 to PWX13 transfers internal read data to buffer circuit BF13 in preamplifier/write drive circuit PAWD1, which in turn compresses the received data to 1-bit data.

Corresponding to preamplifier/write drivers PWX10 to PWX13, buffer circuits BFX10 to BFX13 are disposed, respectively. Buffer circuits BFX10, BFX11, BFX12, and BFX13 are connected to global data lines DB17, DB19, DB22, and DB23, respectively. In order to write test data in the multi-bit test mode, buffer circuits BFX10 to BFX13 are coupled to global data line DB6. In the multi-bit test mode, preamplifer/write drive circuit PAWDX1 generates data of four bits of the same logic level in accordance with data DQ<6> transmitted through global data line DB6.

Figure 30:
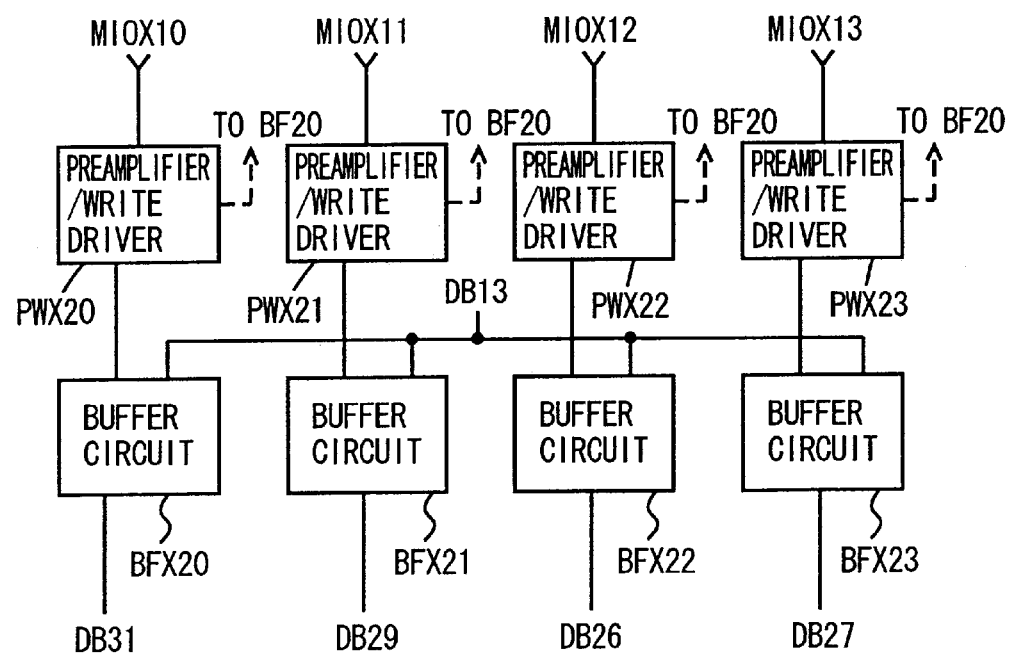
FIG. 30 is a diagram schematically showing the configuration of a preamplifier/write drive circuit PAWDX2 shown in FIG. 19, and a compression/expansion path.

FIG. 30 is a diagram schematically showing the configuration of preamplifier/write drive circuit PAWDX2 shown in FIG. 19. In FIG. 30, preamplifier/write drive circuit PAWDX2 includes preamplifier/write drivers PWX20 to PWX23 disposed corresponding to main data lines MIOX10 to MIOX13, respectively. In performing compression in the multi-bit test mode, preamplifier/write drivers PWX20 to PWX23 transfer internal read data to buffer circuit BF20 included in preamplifier/write drive circuit PAWD2.

Corresponding to preamplifer/write drivers PWX20 to PWX23, buffer circuits BFX20 to BFX23 are disposed, respectively. Buffer circuits BFX20, BFX21, BFX22, and BFX23 are coupled to global data lines DB31, DB29, DB26, and DB27, respectively. In the multi-bit test mode, buffer circuits BFX20 to BFX23 are coupled to global data line DB13. Therefore, in the multi-bit test mode, according to test write data DQ<13> transmitted onto global data line DB13, test write data of the same logic level are generated and transmitted to main data lines MIOX10 to MIOX13.

Figure 31:
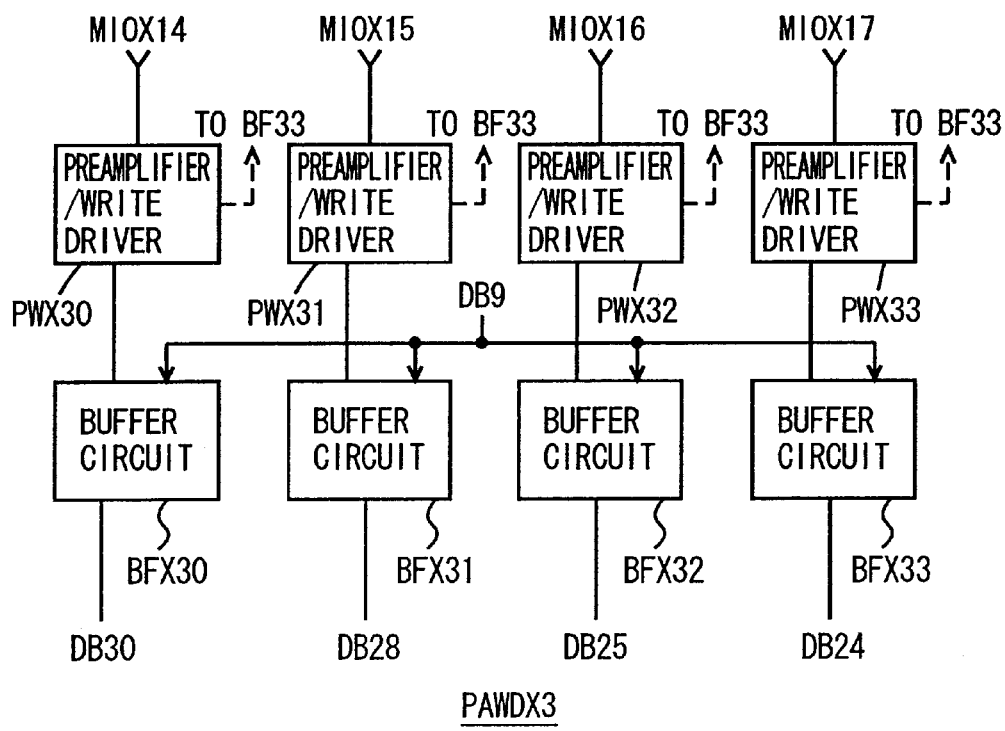
FIG. 31 is a diagram schematically showing the configuration of a preamplifier/write drive circuit PAWDX3 shown in FIG. 19, and a compression/expansion path.

FIG. 31 is a diagram schematically showing the configuration of preamplifier/write drive circuit PAWDX3 shown in FIG. 19. Preamplifier/write drive circuit PAWDX3 includes preamplifier/write drivers PWX30 to PWX33 disposed corresponding to main data lines MIOX14 to MIOX17, respectively. In the multi-bit test mode, preamplifier/write drivers PWX30 to PWX33 transmit internal read data to buffer circuit BF33 disposed in preamplifier/write drive circuit PAWD3, and the data are compressed to 1-bit data by buffer circuit BF33.

Corresponding to preamplifier/write drivers PWX30 to PWX33, buffer circuits BFX30 to BFX33 are disposed, respectively. Buffer circuits BFX30, BFX31, BFX32, and BFX33 are coupled to global data lines DB30, DB28, DB25, and DB24, respectively.

To implement the multi-bit test, buffer circuits BFX30 to BFX33 are commonly coupled to global data line DB9. Therefore, in the multi-bit test mode in the ×32 bit configuration, according to write data DB<9> supplied onto global data line DB9, buffer circuits BFX30 to BFX33 transfer internal write data to write drivers included in preamplifier/write drivers PWX30 to PWX33.

In the data compressing operation, internal read data read from preamplifier/write driver PWX30 to PWX33 are supplied to buffer circuit BF33 included in preamplifier/write drive circuit PAWD3, and compressed to 1-bit data, and the 1-bit data is transmitted onto global data bus DB8.

Figure 32:
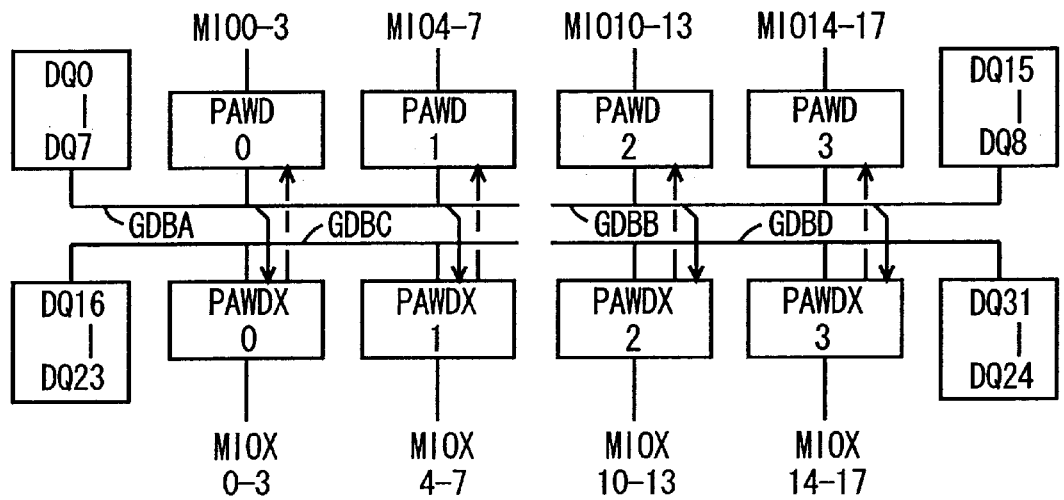
FIG. 32 is a diagram schematically showing arrangement of the preamplifier/write drive circuit shown in FIG. 19.

FIG. 32 is a diagram schematically showing arrangement of external data terminals, global data lines, and preamplifier/write drive circuits. In FIG. 32, in neighborhood of preamplifier/write drive circuits PAWD0 to PAWD3, preamplifier/write drive circuits PAWDX0 to PAWDX3 are disposed. Preamplifier/write drive circuits PAWD0 and PAWD1 are coupled to data terminals DQ0 to DQ7 via a global data bus GDBA. Preamplifier/write drive circuits PAWDX0 and PAWDX1 are coupled to data terminals DQ16 to DQ23 via a global data bus GDBC. Preamplifier/write drive circuits PAWD2 and PAWD3 are coupled to data terminals DQ15 to DQ8 via a global data bus GDBB. Preamplifier/write drive circuits PAWDX2 and PAWDX3 are coupled to data terminals DQ31 to DQ24 via a global data bus GDBB.

Data terminals DQ0 to DQ7 and DQ16 to DQ23 are disposed in this order on one side of the semiconductor memory device, and data terminals DQ15 to DQ8 and DQ31 to DQ24 are disposed in this order on the other side of the semiconductor memory device.

In a compression mode in the ×32 bit configuration, 4-bit data of preamplifier/write drive circuit PAWDX0 is transmitted to corresponding preamplifier/write drive circuit PAWD0 and compressed. 4-bit data from preamplifier/write drive circuits PAWDX1 to PAWDX3 is transmitted to preamplifier/write drive circuits PAWD1 to PAWD3, respectively, and each 4-bit data is compressed to 1-bit data therein.

Data on main data lines MIOX0 to MIOX3, MIOX4 to MIOX7, MIOX10 to MIOX13, and MIOX14 to MIOX17 arranged dedicatedly to the ×32 bit configuration are finally combined with 4-bit data on main data lines MIO0 to MIO3, MIO4 to MIO7, MIO11 to MIO13, and MIO14 to MIO17, respectively, to be compressed into one-bit data. As data of a total of four bits, data bits are output from data terminals DQ2, DQ6, DQ9, and DQ13.

Data to be compressed are just transferred to the preamplifier/write drive circuits disposed neighboring to each other. Thus, without making interconnection complicated, 4-bit data from preamplifier/write drive circuits PAWDX0 to PAWDX3 can be easily transmitted to corresponding preamplifier/write drive circuits PAWD0 to PAWD3.

Figure 33:
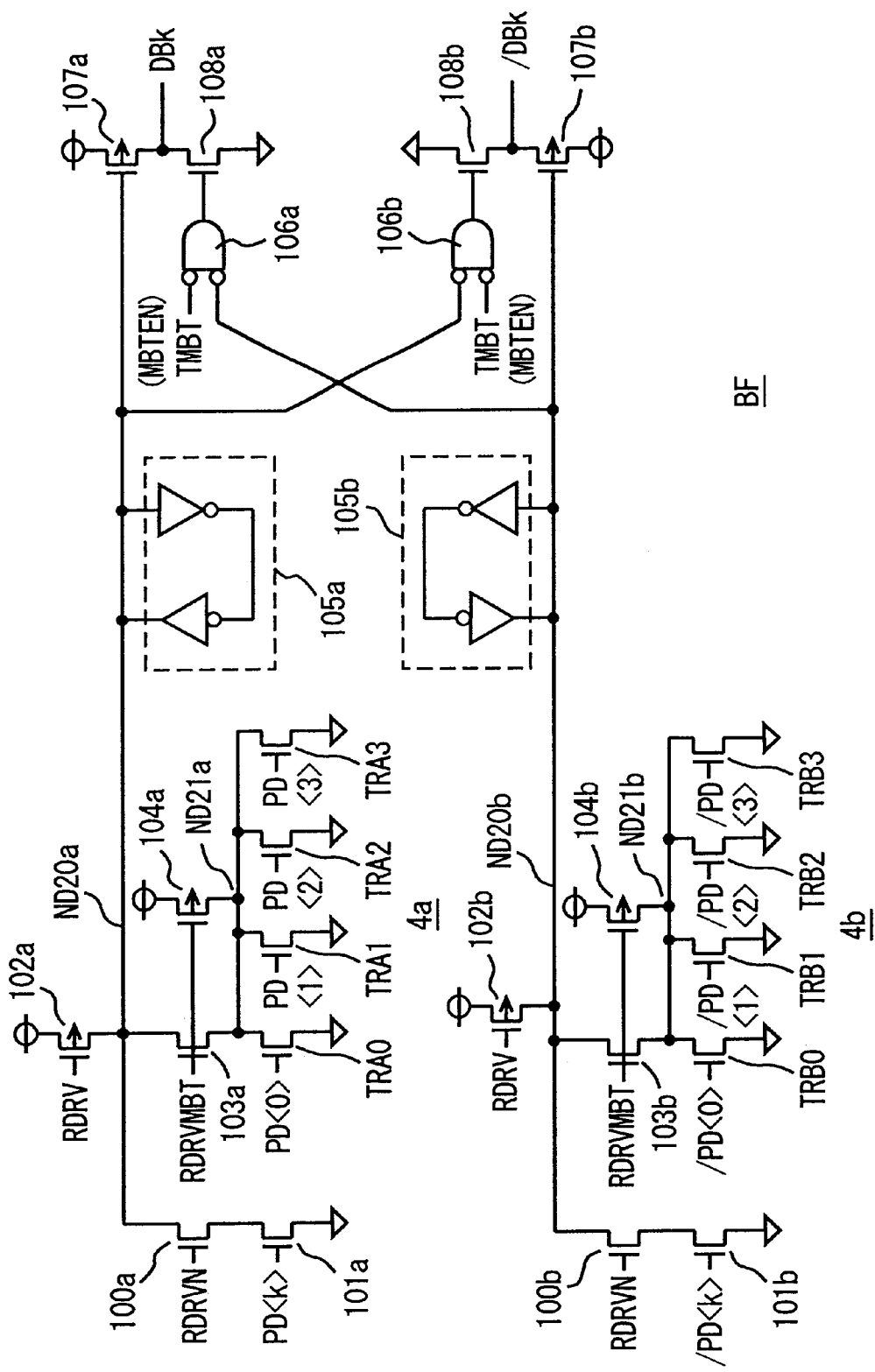
FIG. 33 is a diagram showing an example of the configuration of a buffer circuit with a compression function included in the preamplifier/write drive circuit.

FIG. 33 is a diagram showing the configuration of a data reading section in a buffer circuit having the compressing function out of the buffer circuits shown in FIGS. 24 to 31. Buffer circuits having the compressing function have the same configuration except that only output signals of preamplifiers to be supplied are different from each other. FIG. 33 generically shows one buffer circuit BF as a representative.

In FIG. 33, buffer circuit BF having the compressing function includes: N-channel MOS transistors 100a and 101a for driving an internal node ND20a to the ground voltage level in accordance with internal read data PD<k> from a corresponding preamplifier and a read activating signal RDRVN; a compression circuit 4a for driving internal node ND20a to the ground voltage level in accordance with internal read data PD<3:0> from preamplifiers of a compression object; N-channel MOS transistors 100b and 101b for driving an internal node ND20b in accordance with complementary internal read data /PD<k> from a corresponding preamplifier and read activating signal RDRVN; and a compression circuit 4b for driving internal node ND20b to the ground voltage level in accordance with complementary internal read data /PD<3:0> from preamplifiers of a compression object.

Although internal read data PD<k> is different according to the position of the buffer circuit, where the buffer circuit receives data of main data lines MIO0 to MIO7 and MIO10 to MIO17, internal read data PD<k> is the same as any of data PD<0> to PD<3> to be compressed. Where buffer circuit BF compresses data of main data lines MIOX0 to MIOX7 and MIOX10 to MIOX17, internal read data PD<k> is different from data PD<0> to PD<3>.

MOS transistors 100a and 101a are connected to each other in series between node ND20a and the ground node. MOS transistor 100a receives read activating signal RDRVN at its gate, and MOS transistor 101a receives internal read data PD<k> from a corresponding preamplifier at its gate.

Compression circuit 4a includes: N-channel MOS transistors TRA0 to TRA3 which are connected in parallel between node ND21a and the ground node and receive internal read data PD<0> to PD<3> from preamplifiers of a compression object at their respective gates; a P-channel MOS transistor 104a for precharging internal node ND21a to the power supply voltage level when a test mode read activating signal RDRVMBT is inactive; and an N-channel MOS transistor 103a which is made conductive when test mode read activate signal RDRVMBT is activated, to electrically connect nodes ND20a and ND21a with each other.

Each of MOS transistors 100b and 101b receives read activating signal RDRVN and complementary internal read data /PD<k> from a corresponding preamplifier at its gate. MOS transistors 100b and 101b are connected in this order in series between node ND20b and the ground node.

Compression circuit 4b includes: N-channel MOS transistors TRB0 to TRB3 which are connected in parallel between node ND21b and the ground node and receive complementary internal read data /PD<0> to /PD<3> from preamplifiers of a compression object at their respective gates; a P-channel MOS transistor 104b which is made conductive when test mode read activate signal RDRVNBT is inactivated, to precharge node ND21b to the power supply voltage level; and an N-channel MOS transistor 103b which is made conductive when test mode read activate signal RDRVNBT is activated, to electrically connect nodes ND20b and ND21b to each other.

Buffer circuit BF further includes: a P-channel MOS transistor 102a which is made conductive when read activating signal RDRV is made inactive, to precharge node ND20a to the power supply voltage level; a latch circuit 105a for latching a signal at node ND20a; a P-channel MOS transistor 102b which is made conductive when read activating signal RDRV is made inactive, to precharge node ND20b to the power supply voltage level; a latch circuit 105b for latching a signal at node ND20b; an NOR circuit 106a which receives a multi-bit test mode instruction signal TMBT (multi-bit test enable signal MBTEN) and a signal at node ND20b; an NOR circuit 106b which receives multi-bit test instruction signal TMBT (or multi-bit test enable signal MBTEN) and a signal at node ND20a; a P-channel MOS transistor 107a for driving a corresponding global data line DBk to the power supply voltage level in accordance with a signal at node ND20a; an N-channel MOS transistor 108a for discharging global data line DBk to the ground voltage level in accordance with an output signal of NOR circuit 106a; a P-channel MOS transistor 108b for driving complementary global data line /DBk to the power supply voltage level in accordance with a signal at node ND20b; and an N-channel MOS transistor 107b for discharging complementary global data line /DBk to the ground voltage level in accordance with an output signal of NOR circuit 106b.

In the normal operation mode, multi-bit test instruction signal TMBT (or multi-bit test enable signal MBTEN) is set to the L level. Therefore, NOR circuits 106a and 106b operate as inverters.

In the normal operation mode, test mode read activating signal RDRVMBT is set to the L level, MOS transistors 103*a* and 103*b* are in the off state, MOS transistors 104*a* and 104*b* are in the on state, and nodes ND21*a* and ND21*b* are charged to the power supply voltage level.

In the standby state, both of read activating signals RDRV and RDRVN are at the L level, MOS transistors 102*a* and 102*b* are in the on state, and MOS transistors 100*a* and 100*b* are in the off state. Therefore, nodes ND20*a* and ND20*b* are precharged to the power supply voltage level. In this state, output signals of NOR circuits 106*a* and 106*b* are at the L level, and MOS transistors 108*a* and 108*b* are in the off state. Since nodes ND20*a* and ND20*b* are at the power supply voltage level, MOS transistors 107*a* and 108*b* are also in the off state. That is, buffer circuit BF is held in an output high impedance state in the standby state.

In the data reading mode, complementary read data PD<k> and /PD<k> are transmitted from the corresponding preamplifier and subsequently, read activating signals RDRV and RDRVN are driven to the H level. It is now assumed that read data PD<k> is at the H level, and complementary read data /PD<k> is at the L level. In this state, MOS transistor 101*a* is turned on, and node ND20*a* is discharged to the ground voltage level. On the other hand, since MOS transistor 101*b* is in the off state, node ND20*b* maintains the power supply voltage level of the precharged voltage level. At this time, MOS transistors 103*a* and 103*b* are in the off state, and MOS transistors TRA0 to TRA3 and TRB0 to TRB3 are isolated from nodes ND20*a* and ND20*b*, respectively. Therefore, parasitic capacitance to nodes ND20*a* and ND20*b* is small, and the potential at node ND20*a* can be lowered at high speed.

When the voltage level of node ND20*a* drops, node ND20*a* is held at the ground voltage level by latch circuit 105*a*. On the other hand, node ND20*b* is maintained at the power supply voltage level by latch circuit 105*b*. An output signal of NOR circuit 106*a* attains the L level in response to the H-level signal of node ND20*b*. On the other hand, an output signal of NOR circuit 106*b* attains the H level in response to the L-level signal of node ND20*a*. Therefore, MOS transistors 107*a* and 108*b* turn conductive, and MOS transistors 108*a* and 107*b* are kept off. Thus, global data line DBk is driven to the power supply voltage level, and global data line /DBk is driven to the ground voltage level.

In the multi-bit test mode, multi-bit test instruction signal TMBT is set to the H level, and output signals of NOR circuits 106*a* and 106*b* are set to the L level. In the multi-bit test mode, therefore, MOS transistors 108*a* and 108*b* are in a normally off state.

In the multi-bit test mode, read activating signal RDRVN is always maintained in the inactive state, and MOS transistors 100*a* and 100*b* maintain the off state.

In the data reading mode, test mode read activating signal RDRVMBT attains the H level, and precharging of nodes ND21*a* and 21*b* is completed. Subsequently, internal read data PD<3:0> and /PD<3:0> from the preamplifiers are transmitted, and voltage levels of nodes ND21*a* and ND21*b* are set according to the transmitted internal read data. Data of the same logic level is written to memory cells of a compression object.

Therefore, when all the memory cells of a compression object are normal, internal read data bits PD<3> to PD<0> are at the same logic level, and internal read data bits /PD<3> to /PD<0> are also at the same logic level. It is now assumed that all of internal read data PD<3:0> are at the H level. In this state, all of MOS transistors TRA0 to TRA3 are turned on, node ND21*a* is driven to the ground voltage level, node ND20*a* is accordingly driven to the ground voltage level, and the data of L level is latched by latch circuit 105*a*.

On the other hand, all of complementary internal read data bits /PD<3> to /PD<0> are at the L level. Consequently, all of MOS transistors TRB0 to TRB3 are in the off state, node ND21*b* maintains the power supply voltage level of the precharged voltage level, and node ND20*b* also maintains the power supply voltage level.

In the case of reading the compressed data, since only the parasitic capacitance of MOS transistors 100*a* and 103*a* is associated with node ND20*a* and in addition, MOS transistors TRA0 to TRA3 are isolated from node ND20*a*, the parasitic capacitance at node ND20*a* is small. Thus, node 20*a* can be driven at high speed in accordance with internal read data PD<3:0>. This similarly holds for node 20*b*.

When node ND20*a* is set to the L level, MOS transistor 107*a* is turned on, and global data line DBk is driven to the power supply voltage level. On the other hand, MOS transistor 107*b* is in the off state, and therefore, global data line /DBk maintains the precharged voltage level. Thus, with global data lines DBk and /DBk precharged to the ground voltage level, when the logic levels of all the internal read data bits coincide with each other, one of global data lines DBk and /DBk attains the H level and the other attains the L level.

On the other hand, when a failure memory cell exists in memory cells of a compression object, the logic level of data in the failure memory cell is different from the logic levels of data in the other memory cells. Therefore, at least one of MOS transistors TRA0 to TRA3 is turned on, and at least one of MOS transistors TRB0 to TRB3 is turned on, and both nodes ND20*a* and ND20*b* are driven to the ground voltage level. Since both nodes ND20*a* and ND20*b* attain the L level, therefore, global data lines DBk and /DBk are driven to the power supply voltage level by MOS transistors 107*a* and 107*b*.

Therefore, in the compressing operation in the ×16 bit configuration, by externally identifying the voltage levels of signals on global data lines DBk and /DBk in accordance with external read data, whether a failure exists in the memory cells of four bits or not can be determined. Specifically, by correlating the voltage levels of global data lines DBk and /DBk, that is, (H, L), (L, H), or (H, H), to the logic levels of external read data at the H level, L level, and an output high impedance state respectively, or by correlating a normal state with the H level, and a failure state with the L level, compression result data is read out to identify whether a failure memory cell exists or not.

If all of the memory cells of four bits are defective, the logic level of read data of the compression result is different from that of test write data. For example, when H data is written and storage data in all the memory cells of four bits change to the L data, global data line DBk is at the precharged voltage level, and complementary global data line /DBk attains the H level. In the case where binary data is output to the data terminal, such defect could not be detected that the memory cells of all the bits are defective. However, since memory cells storing data compressed to 1-bit data are not adjacent to each other, as described above, the possibility that such a failure occurs is low. When a failure of the memory cells of all the bits occurs, such a failure can be detected by using another test pattern or by another function test, so that it does not cause a particular problem.

However, for example, if a configuration of reading tri-level data is employed, in which the output circuit is set into an output high impedance state when both global data lines DBk and /DBk are at the H level, the presence of a defective memory cell can be identified even in the case of all-bit failure.

In the ×32 bit configuration, compression result data read onto global data lines DBk and /DBk are further compressed in an output circuit section.

In compression circuits 4a and 4b shown in FIG. 33, N-channel MOS transistors receiving test mode read activate signal RDRVMBT at their gates may be connected in series with MOS transistors TRA0 to TRA3, respectively and similarly, N-channel MOS transistors receiving test mode read activate signal RDRVMBT at their gates may be connected in series with MOS transistors TRB0 to TRB3, respectively. At the time of generation of internal read data in the normal operation mode, even if read data changes, nodes ND21a and ND21b are not discharged. Thus, current consumption in compression circuits 4a and 4b can be reduced.

Alternately, internal read data PD<3:0> and /PD<3:0> may be configured to be transmitted to compression circuits 4a and 4b only when multi-bit test instruction signal TMBT or multi-bit test enable signal MBTEN is in an active state. In the case of such configuration, it is sufficient to supply, as internal read data, an logical product signal of internal read data bit and multi-bit test instruction signal TMBT or multi-bit test enable signal MBTEN to compression circuits 4a and 4b.

Figure 34:
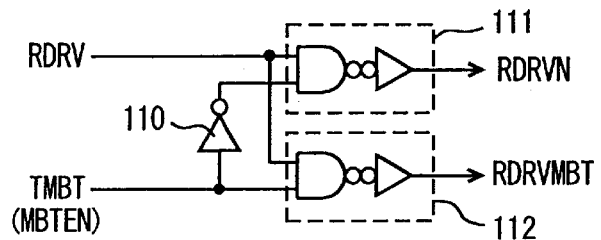
FIG. 34 is a diagram schematically showing the configuration of a section for generating a read operation activate signal shown in FIG. 33.

FIG. 34 is a diagram showing an example of the configuration of a portion for generating read activating signal RDRVN and test mode read activate signal RDRVMBT shown in FIG. 33. In FIG. 34, the read activating signal generating portion includes: an inverter 110 which receives multi-bit test mode instruction TMBT (or multi-bit test enable signal MBTEN); an AND circuit 111 receiving an output signal of inverter 110 and read activating signal RDRV and generating read activating signal RDRVN; and an AND circuit 112 receiving multi-bit test instruction signal TMBT and read activating signal RDRV and generating test mode read activating signal RDRVMBT.

In the multi-bit test mode, multi-bit test instruction signal TMBT (or multi-bit test enable signal MBTEN) is in an active state. According to read activating signal RDRV, test mode read activating signal RDRVMBT is made active. In an operation mode other than the multi-bit test, multi-bit test instruction signal TMBT (or multi-bit test enable signal MBTEN) is kept at the L level. In this state, therefore, according to read activating signal RDRV, read activating signal RDRVN is generated.

In the data reading mode, after a preamplifier enable signal for activating a preamplifier is activated, read activating signal RDRV is made active for a predetermined period.

Figure 35:
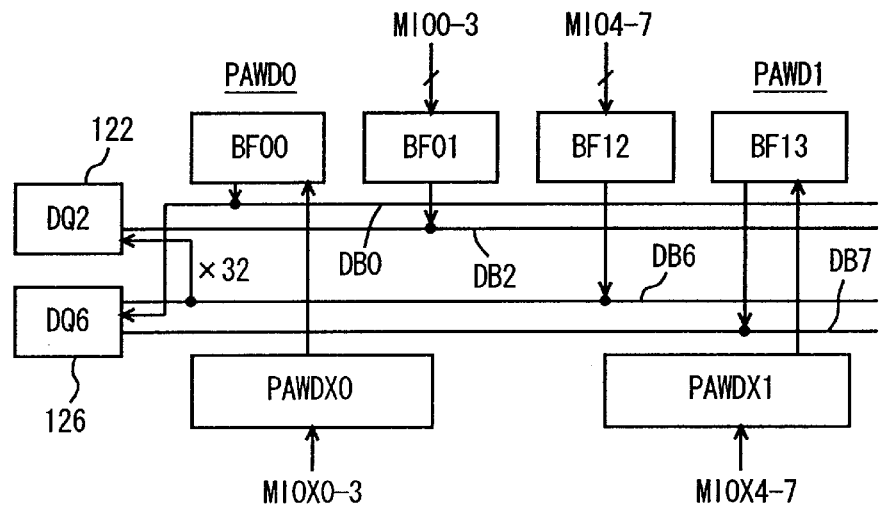
FIG. 35 is a diagram schematically representing the relationships among a buffer circuit, a global data line, and a main data line in a compressing operation.

FIG. 35 is a diagram schematically showing the configuration of a data output portion for outputting data externally. Referring to FIG. 35, in preamplifier/write drive circuit PAWD0, in the ×32 bit configuration, buffer circuit BF00 compresses 4-bit data from preamplifier/write drive circuit PAWDX0 and transmits data indicative of the compression result onto global data line DB0. Similarly, buffer circuit BF01 compresses 4-bit data from associated main data lines MIO0 to MIO3 and outputs 1-bit data indicative of a compression result onto global data line DB2.

In preamplifier/write drive circuit PAWD1, buffer circuit BF12 compresses 4-bit data from main data lines MIO4 to MIO7 into 1-bit data, and outputs the 1-bit data onto global data line DB6. Buffer circuit BF13 compresses 4-bit data from preamplifier/write drive circuit PAWDX1 that receives 4-bit data from main data lines MIOX4 to MIOX7 into 1-bit data, and transmits a compression result onto global data line DB7.

Global data lines DB2 and DB6 are coupled to a data output circuit 122, and global data lines DB0, DB7, and DB6 are coupled to a data output circuit 126. Data output circuit 122 is coupled to data terminal DQ2, and data output circuit 126 is coupled to data terminal DQ6.

In the ×16 bit configuration, data output circuit 122 buffers data received from global data line DB2, for output to data terminal DQ2. In the ×32 bit configuration, data output circuit 122 compresses data transmitted on global data lines DB2 and DB6 into 1-bit data and outputs the compression result to data terminal DQ2.

In the ×16 bit configuration, data output circuit 126 buffers 1-bit data transmitted onto global data line DB6, for output to data terminal DQ6. In the ×32 bit configuration, data output circuit 126 compresses data transmitted onto global data lines DB0 and DB7 into 1-bit data, and outputs the compressed 1-bit data to data terminal DQ6.

Therefore, in the configuration of data output circuits 122 and 126 as shown in FIG. 35, in the ×32 bit configuration, 8-bit data on main data lines MIO0 to MIO3 and MIO4 to MIO7 is compressed to 1-bit data, and the compressed 1-bit data is output to data terminal DQ2. On the other hand, 8-bit data of main data lines MIOX0 to MIOX3 and MIOX4 to MIOX7 is compressed to 1-bit data, and the compressed 1-bit data is output to data terminal DQ6.

Figure 36:
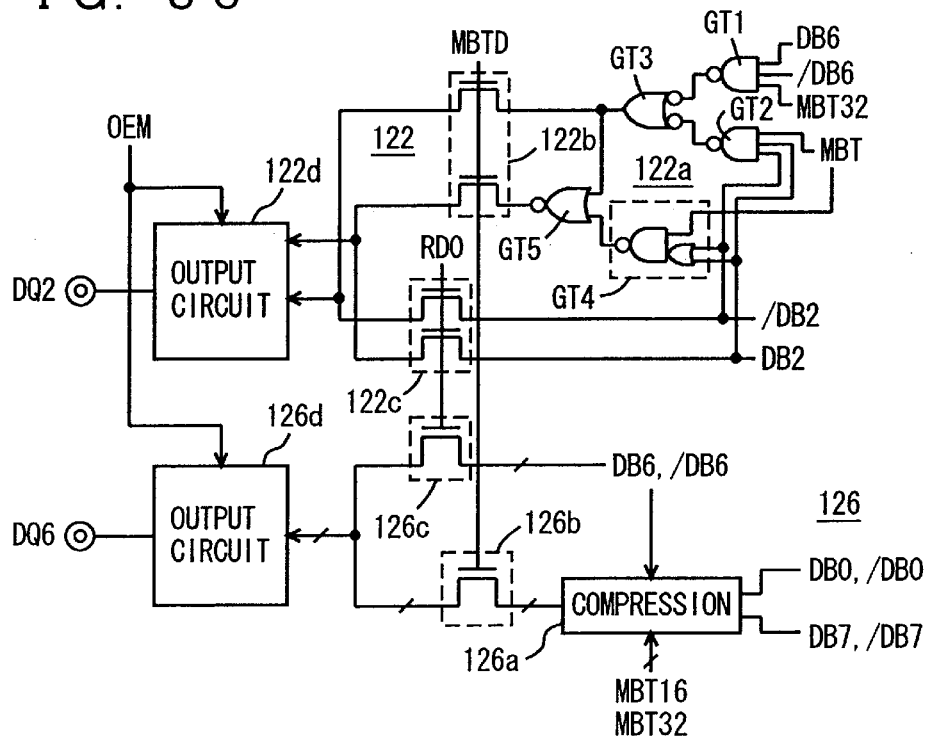
FIG. 36 is a diagram showing an example of the configuration of a data output circuit shown in FIG. 35.

FIG. 36 is a diagram schematically showing an example of the configuration of data output circuits 122 and 126 shown in FIG. 35. Data output circuits 122 and 126 have substantially the same configuration. Therefore, FIG. 36 shows a configuration of data output circuit 122 in detail, while showing schematically a configuration of data output circuit 126.

In FIG. 36, data output circuit 122 includes: a compression circuit 122a for compressing data on complementary global data lines DB2, /DB2 and DB6 and /DB6 and generating complementary data; a transfer gate 122b for transferring output data of compression circuit 122a in accordance with multi-bit test read instruction signal MBTD; and a transfer gate 122c for transferring data on complementary global data lines DB2 and /DB2 in accordance with a normal read instruction signal RDO. Transfer gates 122b and 122c each include N-channel MOS transistors disposed for complementary global data lines.

Compression circuit 122a includes: an NAND gate GT1 receiving a ×32 bit multi-bit test instruction signal MBT32 and signals of global data lines DB6 and /DB6; an NAND gate GT2 receiving multi-bit test instruction signal MBT and signals of global data lines DB2 and /DB2; an NAND gate GT3 receiving output signals of NAND gates GT1 and GT2; a composite gate GT4 receiving multi-bit test instruction signal MBT and signals of global data lines DB2 and /DB2; and an NOR gate GT5 receiving an output signal of NAND gate GT3 and an output signal of composite gate GT4.

An output signal of NAND gate GT3 and an output signal of NOR gate GT5 are transferred to an output circuit 122d via transfer gate 122b.

Composite gate GT4 equivalently includes an OR gate which receives the signals of global data lines DB2 and /DB2, and an NAND gate which receives multi-bit test instruction signal MBT and an output signal of OR gate.

×32 multi-bit test instruction signal MBT32 is set to the H level in a test mode of the ×32 bit configuration, and is set to the L level in a multi-bit test mode of the ×16 bit configuration.

Normal read instruction signal RDO is activated in a data reading mode other than the multi-bit test mode, and is maintained in an inactive state in the multi-bit test mode.

Multi-bit test read instruction signal MBTD is activated at the time of reading data in the multi-bit test mode. Read instruction signals RDO and MBTD are generated according to an internal read instruction signal and a bit width designation signal (for example, MBT32) for designating data bit width.

In the configuration of data output circuit 122, when a multi-bit test is performed, multi-bit test instruction signal MBT is set to the H level. In the case of the ×16 bit configuration, ×32 bit multi-bit test instruction signal MBT32 is maintained at the L level. In this state, the output signal of NAND gate GT1 is fixed at the H level, and gate circuit GT3 operates as an inverter, and composite gate GT2 operates as an inverter.

When the compressed data read onto global data lines DB2 and /DB2 is in a normal state, one of signals of global data lines DB2 and /DB2 is at the H level and the other signal is at the L level. Therefore, an output signal of NAND gate GT2 is at the H level, an output signal of NAND gate GT3 is at the L level, and an output signal of composite gate GT4 is at the L level. Since both output signals of gates GT3 and GT4 are at the L level, the output signal of NOR gate GT5 attains the H level. When an output signal of NAND gate GT3 is at the L level and the output signal of NOR gate GT5 is at the H level, output circuit 122d outputs a signal of the H level.

On the other hand, when the signals transmitted onto global data lines DB2 and /DB2 indicate presence of a defective memory cell, both of the signals on data lines DB2 and /DB2 are at the H level. In this state, the output signal of NAND gate GT2 is at the L level and the output signal of NAND gate GT3 is accordingly at the H level. Even if an output signal of composite gate GT4 attains the L level, since the output signal of NAND gate GT3 is at the H level, the output signal of NOR gate GT5 is at the L level.

In output circuit 122d, when the output signals of gates GT3 and GT5 are at the H and L levels, respectively, a signal of the L level is output. When a defective memory exists in memory cells of a compression object, a signal of the L level is output. When a defective memory does not exist, a signal of the H level is output. Thus, the presence or absence of a defective memory cell can be detected.

In the multi-bit test under the ×32 bit configuration, ×32 bit multi-bit test instruction signal MBT32 is set to the H level. When the signals transmitted onto global data lines DB2 and /DB2 are in a normal state, the output signal of NAND gate GT1 attains the H level, and a signal at the same logic level as that in the ×16 bit configuration is output from NAND gate GT1. Therefore, when the signals on global data lines DB2 and /DB2 are in the normal state, a signal of the H level is output from output circuit 122d. In the case where the signals indicate the presence of a defective memory cell, a signal of the L level is output.

On the other hand, when the signals on global data lines DB6 and /DB6 indicate the presence of a defective memory cell, both of the signals on global data lines DB2 and /DB2 is at the H level, and an output signal of NAND gate GT1 attains the L level. In this state, irrespective of the logic levels of the signals on global data lines DB2 and /DB2, an output signal of NAND gate GT3 attains the H level, and an output signal of NOR gate GT5 attains the L level. Therefore, the output signal of output circuit 122d attains the L level, so that the presence of a defective memory cell in memory cells of a compression object can be detected.

Data output circuit 126 includes: a transfer gate 126c for transferring the signals on global data lines DB6 and /DB6 in accordance with normal read instruction signal RDO; a compression circuit 126a which is selectively activated according to multi-bit test instruction signals MBT16 and MBT32, to selectively perform the compressing operation in accordance with the data bit configuration; a transfer gate 126b for transferring an output signal of compression circuit 126a in accordance with multi-bit test read instruction signal MBTD; and an output circuit 126d for driving an output terminal DQ6 in accordance with complementary signals transferred from transfer gate 126b or 126c.

In data output circuit 126 as well, complementary data signals are transferred via the global data lines. However, to simplify the drawing, FIG. 36 shows a bus constructed by a complementary signal line pair for the output circuit 126d.

Multi-bit test instruction signal MBT16 is activated in the case of the ×16 bit configuration, and multi-bit test instruction signal MBT32 is activated in the case of the ×32 bit configuration.

Compression circuit 126a has the configuration similar to that of compression circuit 122a. In the multi-bit test mode, in the ×32 bit configuration, compression circuit 126a generates compressed signals from complementary signals on global data lines DB0 and /DB0, generate compressed signals from complementary signals on global data lines DB7 and /DB7, and generates complementary signals indicative of match/mismatch of the logic levels of data of global data lines DB0 and DB7 in accordance with the logic levels of the generated compressed signals. In the ×16 bit configuration, compression circuit 126a adjusts the logic levels of complementary signals of global data lines DB6 and /DB6, to generate complementary signals. By adjusting the logic levels, in the ×16 bit configuration, when a defective memory cell exists, a signal of the L level is output from the output circuit, while a signal of the H level is output from the output circuit when no defective memory cell is present.

In the ×16 bit configuration, compression circuit 126a adjusts the logic level in accordance with signals on global data lines DB6 and /DB6. In the ×32 bit configuration, compression circuit 126a performs a compressing operation in accordance with signals on global data lines DB0 and /DB0 and global data lines DB7 and /DB7. Any configuration may be employed for compression circuit 126a, as far as the above-described function is implemented.

For example, the following configuration can be employed. Data on global data lines DB7 and /DB7 are compressed by a first NAND gate for generating an output signal in accordance with the signals on global data lines DB0 and /DB0 when multi-bit instruction signal MBT32 is made active, a second NAND gate for generating an output signal in accordance with signals on the global data lines DB7 and /DB7 upon activation of multi-bit test instruction signal MBT32, and a third NAND gate receiving output signals of the first and second NAND gates. In the ×32 bit configuration, output circuit 126d is driven according to an output signal of the third NAND gate and an inverted signal of the output signal.

In the ×16 bit configuration, the logic levels of the signals on global data lines DB6 and /DB6 are adjusted by a fourth NAND gate which is enabled in response to the activation of multi-bit test instruction signal MBT16 and an inverter for inverting an output signal of the fourth NAND gate, and the output circuit 126d is driven according to an output signal of the inverter and an inverted signal of the output signal. In such configuration, if an OR circuit which receives an output signal of the third NAND gate and an output signal of the inverter is disposed, a path for driving output circuit 126d can be shared between ×16 bit configuration and ×32 bit configuration. According to an output signal of the OR circuit and its inverted signal, output circuit 126*d* is driven. The configuration is provided by way of example, and other configurations can be used.

According to the above exemplary configuration of compression circuit, in the ×16 bit configuration, when a defective memory cell exists, the output signal of the fourth NAND gate attains the L level while an output signal of the inverter attains the H level in accordance with the signals on global data lines DB6 and /DB6. In contrast, in a normal state, the output signal of the fourth NAND gate attains the H level, and an output signal of the inverter attains the L level. By driving output circuit 126*d* in accordance with these signals, when a defective memory cell exists, an output signal of output circuit 126*d* attains the L level and in the normal state, a signal of the H level is outputted to output terminal DQ6. Therefore, by checking the logic level of the output signal of output circuit 126*d* externally, in the ×16 bit configuration, whether a memory cell is good or not can be determined according to the signals transmitted to global data lines DB6 and /DB6.

According to the above exemplary configuration, in the ×32 bit configuration, in the normal state, both output signals of the first and second NAND gates attain the H level, and the output signal of the third NAND gate attains the L level. Since output circuit 126*d* is driven according to the output signal of the third NAND gate and an inverted signal of the output signal, the signal of the data terminal attains the H level. On the other hand, when a defective memory cell exists in memory cells related to global data lines DB0, /DB0 and DB7 and /DB7, an output signal of at least one of the first and second NAND gates attains the L level, and the output signal of the third NAND gate attains the H level. Therefore, the signal output from output circuit 126*d* attain the L level, and the presence of a defective memory cell can be identified.

Figure 37:
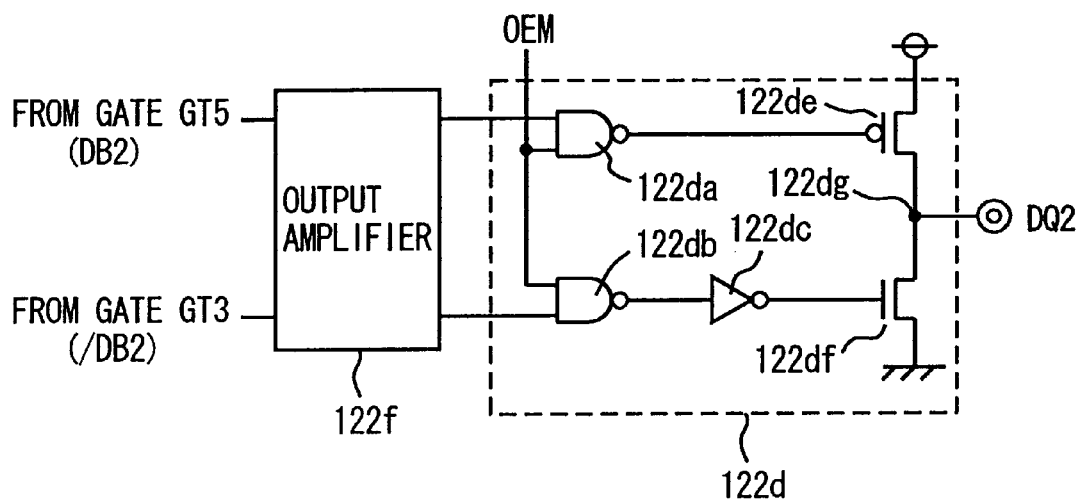
FIG. 37 is a diagram schematically showing the configuration of the output circuit shown in FIG. 36.

FIG. 37 is a diagram schematically showing an example of the configuration of output circuit 122*d* shown in FIG. 36. In FIG. 37, a signal transfer path from compression circuit 122*a* is also shown. One of the output signal of the gate GT5 and the signal on global data line DB2 and one of the output signal of gate GT3 and the signal on global data line /DB2 are transmitted to output circuit 122*d* via an output amplifier 122*f*. Output amplifier 122*f* amplifies an internal data signal to output circuit 122*d*.

Output circuit 122*d* includes: an NAND gate 122*da* which receives an output permission signal OEM and an output signal of NOR gate GT5 or a signal on global data line DB2 transferred via output amplifier 122*f*; an NAND gate 122*db* which receives output permission signal OEM and the output signal of NAND gate GT3 or the signal on global data line /DB2 transferred via output amplifier 122*f*; an inverter 122*dc* for inverting an output signal of NAND gate 122*dc*; a P-channel MOS transistor 122*de* for driving an output node 122*dg* to the power supply voltage level in accordance with an output signal of NAND gate 122*da*; and an N-channel MOS transistor 122*df* for driving output node 122*dg* to the ground voltage level in accordance with an output signal of inverter 122*dc*.

When output permission signal OEM is at the L level, both MOS transistors 122*de* and 122*df* are in the off state, and output circuit 122*d* is in an output high impedance state. When output permission signal OEM attains the H level, NAND gates 122*da* and 122*db* operate as inverters.

It is now assumed that all of memory cells of a compression object are normal. In this state, an output signal of NOR gate GT5 is at the H level, an output signal of NAND gate GT3 is at the L level and accordingly, output signals of NAND gates 122*da* and 122*db* are at the L and H levels, respectively. Therefore, MOS transistor 122*de* is turned on, MOS transistor 122*df* is turned off, and a signal of the H level is outputted to data terminal DQ2. In this case, output amplifier 122*f* merely amplifies an internal signal and does not convert the logic level of the internal signal.

On the other hand, when a failure exists in memory cells of a compression object, both of the signal voltage levels of complementary data line pair of global data lines DB2 and DB6 is kept at the H level. In this state, the output signal of NOR gate GT5 attains the L level, and the output signal of NAND gate GT3 attains the H level. In this state, the output signal of NAND gate 122*da* attains the H level, the output signal of NAND gate 122*db* attains the L level, an output signal of inverter 122*dc* attains the H level, MOS transistor 122*de* is turned off, and MOS transistor 122*df* is turned on. That is, when a failure memory cell exists, output node 122*dg* is driven to the H level.

In a normal data reading mode, when output permission signal OEM is activated, NAND gates 122*da* and 122*db* generate complementary signals according to the signals on global data lines DB2 and /DB2, an output signal of NAND gate 122*dc* is inverted by inverter 122*dc*. Therefore, the signals of the same logic level are supplied to the gates of MOS transistors 122*de* and 122*df*. Responsively, one of MOS transistors 122*de* and 122*df* is turned on, the other is turned off, and output node 122*dg* is driven to a corresponding voltage level in accordance with internal read data.

In output circuit 122*d* shown in FIG. 37, usually, a configuration such as a level converting circuit is used according to the voltage level of an output power supply voltage. However, in FIG. 37, only the functional configuration of output circuit 122*d* is shown by way of example. The detailed configuration of output circuit 122*d* may be any. Output circuit 126*d* has the configuration similar to that of output circuit 122*d*.

Figure 38:
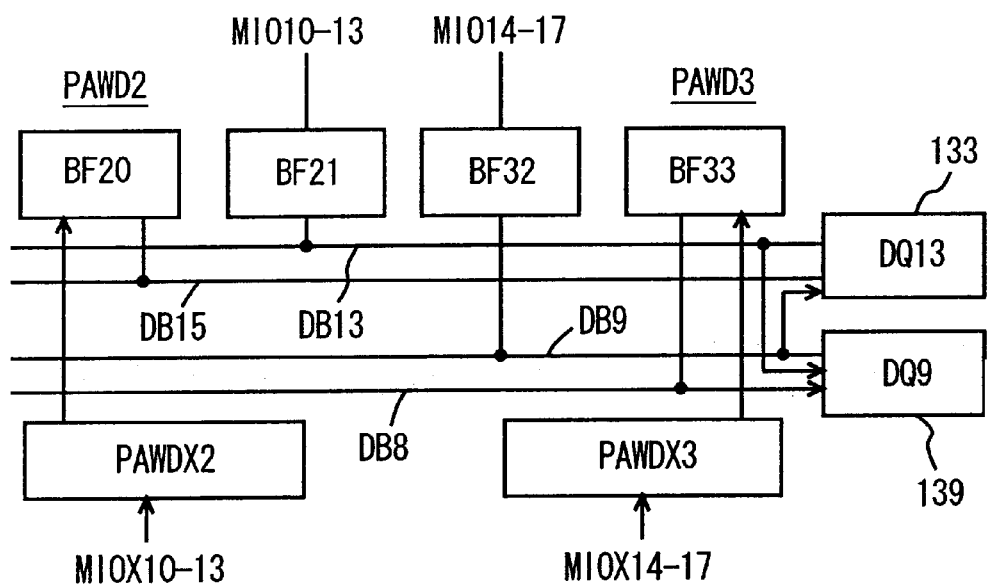
FIG. 38 is a diagram schematically showing the connection among the buffer circuit with the compression function, a main data line, and a global data line.

FIG. 38 is a diagram schematically showing bus connection of preamplifer/write drive circuits PAWD2, PAWD3, PAWDX2, and PAWDX3. In FIG. 38, in preamplifier/write drive circuit PAWD2, buffer circuit BF20 compresses 4-bit data from preamplifier/write drive circuit PAWDX2 into 1-bit data for transmission to global data line DB15. Buffer circuit BF21 compresses 4-bit data from main data lines MIO10 to MIO13 into 1-bit data, and the compressed 1-bit data is output to global data line DB13.

In preamplifer/write drive circuit PAWD3, buffer circuit BF32 compresses 4-bit data from main data lines MIO14 to MIO17 into 1-bit data, and transmits the compressed 1-bit data to global data line DB9. Buffer circuit BF33 compresses 4-bit data from main data lines MIOX14 to MIOX17 from preamplifier/write drive circuit PAWDX3 into 1-bit data, and transmits the compressed 1-bit data to global data line DB8.

Corresponding to global data line DB13, a data output circuit 133 is disposed, and a data output circuit 139 is disposed corresponding to global data line DB9. Data output circuit 133 is coupled to data terminal DQ13, and data output circuit 139 is coupled to data terminal DQ9.

In the layout shown in FIG. 38, in the ×16 bit configuration and in the normal mode, data output circuits 133 and 139 drive data terminals DB13 and DB9 in accordance with signals on global data lines DB13 and DB9.

On the other hand, in the multi-bit test mode in the ×32 bit configuration, data output circuit 133 compresses data on global data lines DB13 and DB9 into 1-bit data and outputs the compressed 1-bit data to data terminal DQ13. In the multi-bit test mode under the ×32 bit configuration, data output circuit 139 compresses data appearing on global data lines DB15 and DB8 into 1-bit data, and transmits the compressed 1-bit data to data terminal DQ9.

Therefore, 8-bit data on main data lines MIO10 to MIO17 is compressed to 1-bit data, 8-bit data on main data lines MIOX10 to MIOX17 is compressed to 1-bit data, and the compressed 1-bit data is output to data terminal DQ9 both in ×16 bit configuration and ×32 bit configuration.

Figure 39:
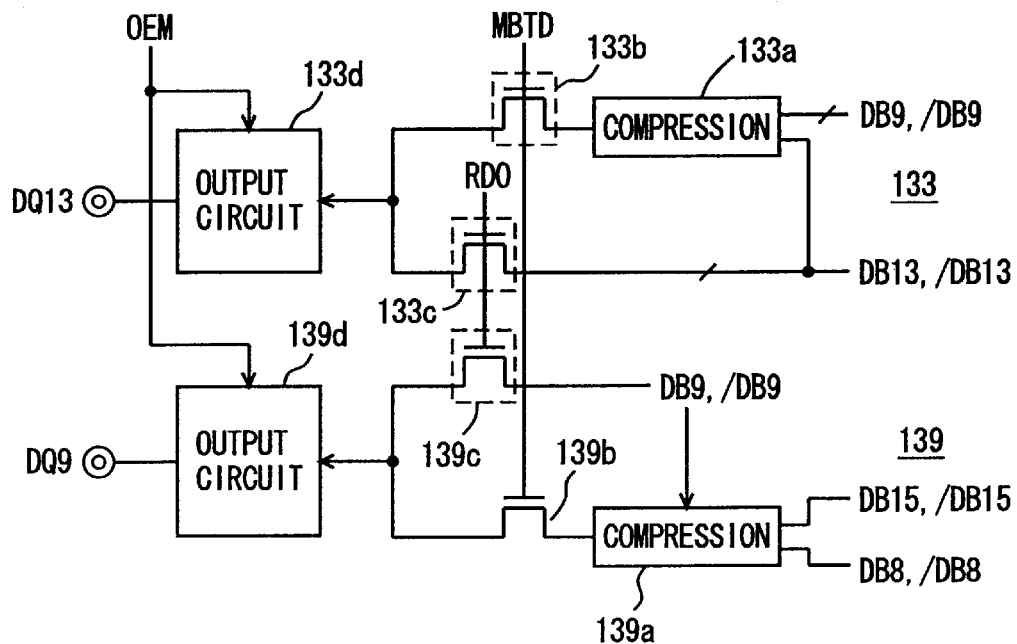
FIG. 39 is a diagram showing an example of the configuration of a data output circuit shown in FIG. 38.

FIG. 39 is a diagram schematically showing an example of the configuration of data output circuits 133 and 139 shown in FIG. 38. In FIG. 39, data output circuit 133 includes: a compression circuit 133*a* which receives signals on global data lines DB9 and /DB9 and signals on global data lines DB13 and /DB13, and performs a compressing operation or adjusts the logic level in the multi-bit test mode; a transfer gate 133*b* for selectively transmitting an output signal of compression circuit 133*a* in accordance with multi-bit test read instruction signal MBTD; a transfer gate 133*c* which is selectively made conductive in response to normal read instruction signal ROD, to transmit the signals on global data lines DB13 and /DB13; and an output circuit 133*d* for buffering a signal from transfer gate 133*b* or 133*c* in accordance with output permission signal OEM for transmission to data terminal DQ13.

Compression circuit 133*a* has the configuration similar to that of compression circuit 122*a* shown in FIG. 36. In the ×32 bit configuration, the signals on global data lines DB9, /DB9, and DB13 and /DB13 are compressed, and a signal indicative of a compression result is output. In the ×16 bit configuration, compression circuit 133*a* adjusts the logic level of each of the signals of global data lines DB13 and/DB13 for output.

Data output circuit 139 includes: a compression circuit 139*a* which receives signals on global data lines DB13 and /DB13 and signals on global data lines DB15, /DB15, DB8, and /DB8 and performs a predetermined compressing operation in the multi-bit test mode; a transfer gate 139*b* for transmitting an output signal of compression circuit 139*a* in accordance with multi-bit read instruction signal MBTD; a transfer gate 139*c* for transmitting a signal on global data line DB9 in accordance with normal read instruction signal ROD; and an output circuit 139*d* which is activated in accordance with output permission signal OEM and, when activated, buffers a signal supplied from transfer gate 139*b* or 139*c* for output to data terminal DQ9.

Compression circuit 139*a* has the configuration similar to that of compression circuit 126*a* shown in FIG. 36. In the ×16 bit configuration, according to the signals on global data lines DB9 and /DB9, compression circuit 139*a* generates a signal indicative of a compression result. In the ×32 bit configuration, compression circuit 139*a* further compresses the signals indicative of the compression results transmitted to global data lines DB8, /DB8, and DB15, /DB15, to generate a signal indicative of a final compression result.

The compressing operations of compression circuits 133*a* and 139*a* are the same as those of compression circuits 122*a* and 126*a* shown in FIG. 36, and therefore, their detailed description will not be repeated.

To compression circuits 133*a* and 139*a*, multi-bit test instruction signals MBT, MBT32, and MBT16 for changing the signal processing contents in the multi-bit test are applied, although not shown in FIG. 39. These signals are set to predetermined logic levels according to the bit configuration of data, and a processing contents according to the data bit width is set.

As shown in FIG. 39, in the multi-bit test mode under the ×16 bit configuration, data output circuit 133 drives data terminal DQ13 in accordance with the signals on global data lines DB13 and /DB13. In the ×32 bit configuration, in the multi-bit test mode, data output circuit 133 drives data terminal DQ13 in accordance with the signals on global data lines DB9, /DB9, DB13, and /DB13. Therefore, in the multi-bit test in the ×32 bit configuration, compressed data of 8-bit data on main data lines MIO10 to MIO17 is output to data terminal DQ13.

In data output circuit 139, in the multi-bit test mode of the ×16 bit configuration, the logic levels of the signals on global data lines DB9 and /DB9 are adjusted by compression circuit 139*a*, a result of the adjusting process is buffered by output circuit 139*d*, to be transmitted to data terminal DQ9.

On the other hand, in the ×32 bit configuration, data output circuit 139 compresses the signals on global data lines DB8, /DB8, DB15, and /DB15 by compression circuit 139*a*, and drives data terminal DQ9 in accordance with the compression processing result. In the ×32 bit configuration, therefore, 8-bit data on main data lines MIOX10 to MIOX17 is compressed to 1-bit data, and the compressed 1-bit data is output to data terminal DQ9.

The configurations of output circuits 136*d* and 139*d* are similar to that of output circuit 122*d* shown in FIG. 37. Therefore, in the multi-bit test, if a defective memory cell exists, a signal of the L level is output to a corresponding output terminal. If no defective memory cell exists, a signal of the H level is output.

Modification of Compression

Figure 40:
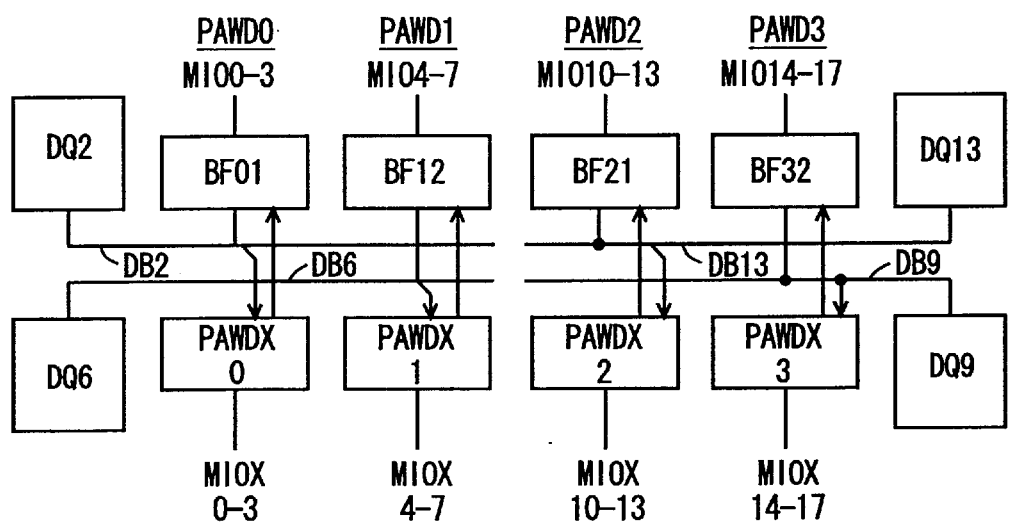
FIG. 40 is a diagram showing a modification for performing data compression.

FIG. 40 is a diagram schematically showing a path of compression data in a modification of the compressing operation according to the invention. In FIG. 40, global data line DB2 is coupled to buffer circuit BF01, and global data line DB6 is coupled to buffer circuit BF12. Buffer circuit BF21 is coupled to global data line DB13, and buffer circuit BF32 is coupled to global data line DB9.

In the ×32 bit configuration, in writing test data, preamplifier/write drive circuit PAWDX generates 4-bit data in accordance with data on global data line DB2, and transmits the 4-bit data onto main data lines MIOX0 to MIOX3. Preamplifier/write drive circuit PAWDX1 expands data on global data line DB6 to generate 4-bit data, and transmits the 4-bit data to main data lines MIOX4 to MIOX7.

Preamplifier/write drive circuit PAWDX2 expands 1-bit data on global data line DB13 to generate 4-bit data, and transmits the 4-bit data onto main data lines MIOX10 to MIOX13, respectively. Preamplifier/write drive circuit PAWDX3 expands data on global data line DB9 to 4-bit data, and transmits the 4-bit data to main data lines MIOX14 to MIOX17, respectively.

In the compressing operation, buffer circuit BF01 compresses 4-bit data (supplied via corresponding preamplifiers) from main data lines MIO0 to MIO3 and 4-bit data supplied from preamplifier/write drive circuit PAWDX0 into 1-bit data, and outputs the compressed 1-bit data to global data line DB2. Buffer circuit BF12 compresses 4-bit data from main data lines MIO4 to MIO7 and 4-bit data from preamplifier/write drive circuit PAWDX1 into one-bit data, and transmits the compressed one-bit data to global data line DB6.

Buffer circuit BF21 compresses 4-bit data from main data lines MIO11 to MIO13 and 4-bit data from preamplifier/write drive circuit PAWDX2, to generate and transmit 1-bit data to global data line DB13.

Buffer circuit BF32 compresses 4-bit data supplied from main data lines MIO14 to MIO17 via preamplifiers and 4-bit data from preamplifier/write drive circuit PAWDX3, and transmits the compression result to global data line DB9.

In the configuration shown in FIG. 40, 8-bit data is compressed to 1-bit data, and the respective compression results are transmitted to the global data line pairs DB2, DB6, DB13, and DB9. Therefore, in the case of the configuration shown in FIG. 40, in a compressing operation, it is unnecessary to switch the correspondence relation between the global data line and the data terminal in accordance with the data bit width. By performing 4-bit compression and 8-bit compression in the ×16 bit and ×32 bit configurations, respectively, compression results can be easily output to the same data terminals. Consequently, as the data output circuit, any of the output circuits shown in FIGS. 36 and 39 can be used, and thus, the configuration of the data output circuit can be simplified.

Figure 41:
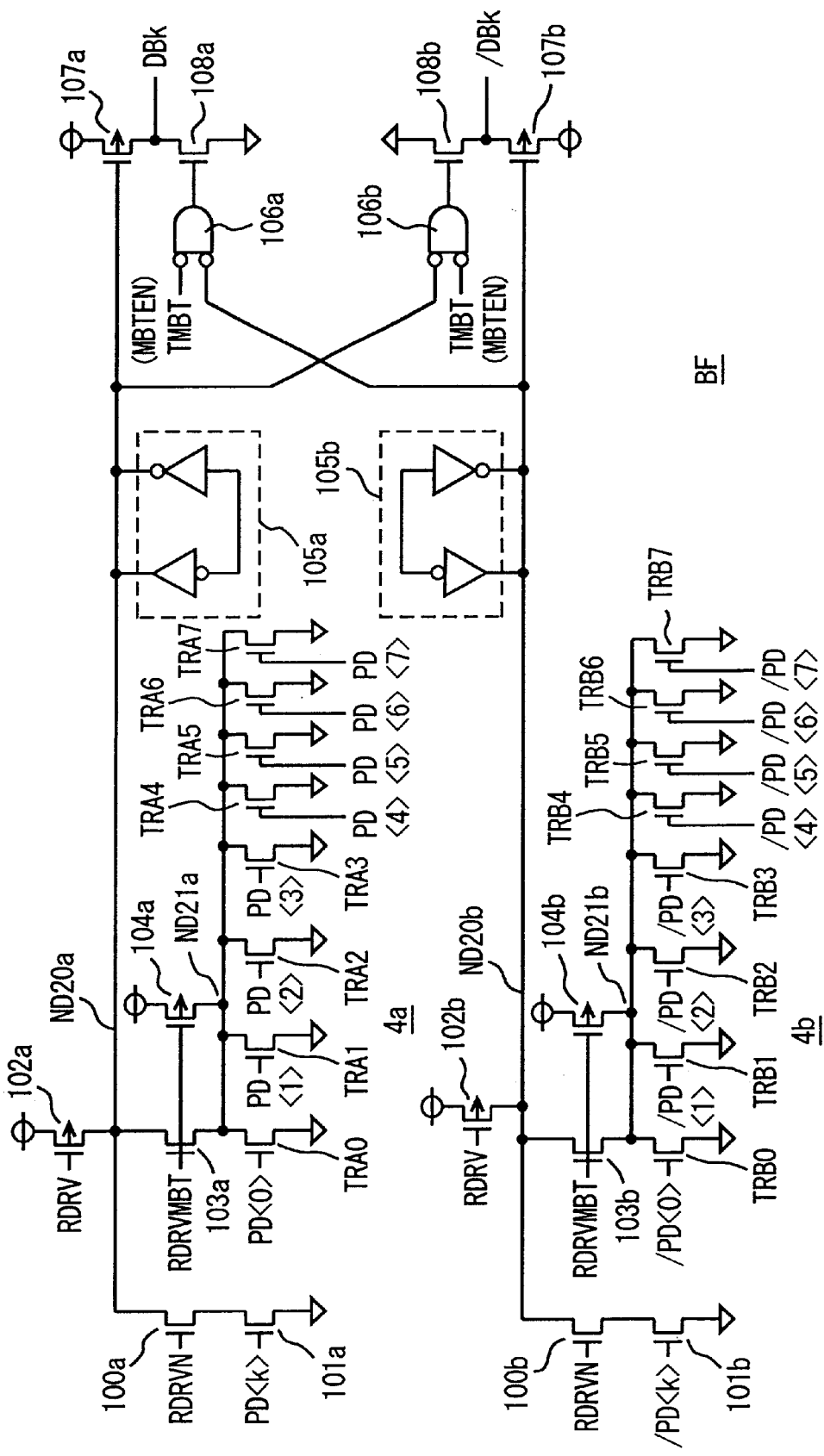
FIG. 41 is a diagram showing the configuration of a buffer circuit with the compression function shown in FIG. 40.

FIG. 41 is a diagram showing an example of the configuration of buffer circuits BF01, BF12, BF21, and BF32 shown in FIG. 40. Since the buffer circuits have the same configuration, FIG. 41 shows buffer circuit BF generically.

The configuration of buffer circuit BF shown in FIG. 41 is different from that of buffer circuit BF shown in FIG. 33 in the following points. In compression circuit 4*a*, N-channel MOS transistors TRA4 to TRA7 which receive read data bits PD<4> to PD<7> from preamplifiers of compression object (included in preamplifier/write drive circuit PWADX) are connected in parallel between node ND21*a* and the ground node. In compression circuit 4*b*, between node ND21*b* and the ground node, N-channel MOS transistors TRB4 to TRB7 which receive complementary internal read signals /PD<4> to /PD<7> from corresponding preamplifiers at their gates are connected in parallel. The other configuration of buffer circuit BF shown in FIG. 41 is the same as that of buffer circuit BF shown in FIG. 33. Corresponding parts are designated by the same reference numerals and their detailed description will not be repeated.

To the gates of MOS transistors TRA4 to TRA7 and TRB4 to TRB7, internal read data are transferred from the corresponding preamplifier/write drive circuit disposed dedicatedly to the 32-bit configuration. Therefore, in each of compression circuits 4*a* and 4*b*, the signals of eight bits are compressed to a signal of one bit, and the generated signal of one bit is transmitted to global data lines DBk and /DBk. The operation of detecting whether a memory cell is good or not is the same as the four-bit compressing operation.

To each of nodes ND21*a* and ND21*b*, eight transistors are connected in parallel. In the data reading mode, however, nodes ND21*a* and ND21*b* are coupled to nodes ND20*a* and ND20*b* via MOS transistors 103*a* and 103*b*, respectively. Consequently, the parasitic capacitance on each of nodes ND20*a* and ND20*b* is small, so that nodes ND20*a* and ND20*b* can be driven according to internal read data at high speed.

In the ×16 bit configuration, preamplifier/write drive circuit PAWDX disposed dedicatedly to the ×32 bit configuration is maintained in the inactive state, and the internal read data is at the L level. Therefore, in compression circuit 4*a*, all of MOS transistors TRA4 to TRA7 are in the off state, and in compression circuit 4*b*, all of MOS transistors TRB4 to TRB7 are in the off state.

Therefore, even if compression circuits 4*a* and 4*b* are constructed so as to receive 4-bit data from the preamplifier/write drive circuit disposed dedicatedly to ×32 bit configuration, no adverse influence is exerted on the 4-bit compressing operation in the ×16 bit configuration.

The logical product signals of internal read data bits PD<7:4> and /PD7<7:4> from the preamplifier/write drive circuit dedicated to the ×32 bit configuration and data bit width instruction signal MOD32 may be applied to the gates of MOS transistors TRA7 to TRA4 and TRB7 to TRB4, respectively.

In the configurations shown in FIGS. 40 and 41, 4-bit compression on main data lines MIO0 to MIO3 and 4-bit compression on main data lines MIOX0 to MIOX3 may be performed, followed by compression of two compressed data bits into one bit data in the data output circuit. The same construction applies to each of the set of main data lines MIO4 to MIO7 and MIOX4 to MIOX7, the set of main data lines MIO10 to MIO13 and MIOX10 to MIOX13, and the set of MIO14 to MIO17 and MIOX14 to MIOX17.

In the ×32 bit configuration, in the case of inverting write data, inverted data is transferred to a common row block. Therefore, as shown in FIG. 40, in the case of generating 8-bit data from one-bit data, it is necessary to invert the bit value of the whole 8-bit data. In the compressing operation, therefore, the inverted 8-bit data is transferred to buffer circuit BF or non-inverted 8-bit data is transferred to buffer circuit BF. Therefore, even when 8-bit data is compressed to 1-bit data at a time by the buffer circuit shown in FIG. 41, whether a memory cell is good or not can be accurately determined.

In the configuration shown in FIG. 40, for the configuration of the write driver, a configuration similar to the configuration shown in FIG. 22 can be used. Each of preamplifier/write drive circuits PWAD and PWADX has write drivers of four bits. Therefore, even in the case where inversion of bit values is performed on an 8-bit basis, by performing bit inversion in the write drivers which receive the same test data in the test with the configuration shown in FIG. 22 utilized, inversion data of eight bits can be generated.

Although the configuration in which the data bit width is switched between 16 bits and 32 bits is described so far, the data bit width is not limited to 16 bits and 32 bits, but may be another data bit width.

In the foregoing configuration, the data terminal is disposed commonly to output data and input data. However, an output data terminal and an input data terminal may be separately disposed.

As described above, according to the invention, a first main data line used commonly in first and second data bit widths, and a second main data line dedicated to the second data bit width are disposed, so that the data bit width can be easily changed. By disposing the second main data line dedicated to the second data bit width, in the multi-bit test mode, without changing the set of main data lines of compression object, the compressing operation can be easily performed. In addition, by combining the compression result of the first main data line and that of the second main data line, the compression result can be output to the same data terminal.

Although the present invention has been described and shown in detail, it is clearly understood that the same is by way of illustration and example only and is not to be taken by way of limitation, the spirit and scope of the present invention being limited only by the terms of the appended claims.

What is claimed is:

1. A semiconductor memory device having a data bit width settable selectively to a first bit width and a second bit width wider than said first bit width, comprising:

first data terminals of the first bit width used in both of a mode of said first bit width and a mode of said second bit width;

first main data lines, having said first bit width, disposed corresponding to said first data terminals, a correspondence relationship between said first main data lines and said first data terminals being the same between the mode of said first bit width and the mode of said second bit width;

one or more second data terminals, non-used in the mode of said first bit width, having a bit width equal to a difference between the first and second bit widths; and one or more second main data lines, disposed corresponding to said one or more second data terminals, having a bit width equal to a bit width of said one or more second data terminals.

2. The semiconductor memory device according to claim 1, further comprising a compression circuit for, in the mode of said first bit width in a test mode, compressing data on said first main data lines into a predetermined number of bits and outputting compressed data bits from first data terminals of the predetermined number out of said first data terminals, and in the mode of said second bit width, compressing data on the first and one or more second main data lines to said predetermined number of bits, and outputting compressed data from said first data terminals of said predetermined number.

3. The semiconductor memory device according to claim 2, further comprising global data lines of said second bit width disposed corresponding to said first and one or mare second main data lines and disposed corresponding to the first and one or more second data terminals, wherein said compression circuit comprises:

a plurality of first compression circuits, each disposed corresponding to a predetermined number of said first main data lines, each for compressing data on corresponding first main data lines into one-bit data for outputting compressed data to a predetermined global data line when activated in the modes of the first and second bit widths;

a plurality of second compression circuits, each disposed corresponding to the one or more second main data lines of said predetermined number, each for compressing data on corresponding one or more second main data lines to outputting compressed data to a pre-assigned global data line, the first and second compression circuits outputting corresponding compression data onto global data lines different from each other; and third compression circuits, each disposed corresponding to a prescribed global data line in the global data lines to which the first and second compression circuits are connected out of said global data lines, each for compressing output data of the first and second compression circuits on corresponding global data lines and outputting a compression result to a predetermined data terminal in the mode of said second bit width, said predetermined data terminal being a data terminal used in both of the modes of the first and second bit widths.

4. The semiconductor memory device according to claim 2, wherein said compression circuit compresses, in said test mode, data on correlated data lines with each other in the first main data lines and the one or more second main data lines in thc mode of said second bit width.

5. The semiconductor memory device according to claim 2, wherein in a test in the mode of said second bit width, said compression circuit comprises:

a first compression circuit for compressing data on the first main data lines;

a second compression circuit for compressing data on the one or more second main data lines; and a third compression circuit for compressing output data of correlated compression circuits with each other in the first and second compression circuits, and outputting data indicative of a result of compression to the first data terminals of the predetermined number, and in the mode of said first bit width, compression result of said first compression circuit is outputted to respective first data terminals of said predetermined number.

6. The semiconductor memory device according to claim 5, wherein said first Compression circuit Comprises a plurality of first sub compression circuits, each disposed corresponding to a predetermined number of first main data tines of the first main data lines, each for compressing data of corresponding first main data lines into data of one bit, said second compression circuit comprises a plurality of second sub compression circuits, each disposed corresponding to a predetermined number of one or more second main data lines of the one or more second main data lines, each for compressing data of a corresponding second main data line to data of one bit, and said third compression circuit comprises a plurality of third sub compression circuits, each disposed corresponding to a predetermined set of the first and second sub compression circuits, each for compressing, in the mode of said second bit width, output data of a corresponding set of the first and second sub compression circuits into data of one bit to output data indicative of a result of compression to an associated data terminal of the first data terminals of said predetermined number.

7. The semiconductor memory device according to claim 1, further comprising a circuit for inverting and transferring an externally applied test data bit to a predetermined main data line in the first and one or more second main data lines in the mode of said second bit width in a test mode.

8. The semiconductor memory device according to claim 2, wherein said Compression circuit comprises a plurality of data compressing circuits, each disposed corresponding to a predetermined number of main data tines in the first and one or more second main data lines, each for compressing and outputting data of corresponding main data lines, and each of said data compressing circuits includes a plurality of read transistors, connected in parallel between a first node and a reference voltage node supplying a predetermined voltage, each selectively made conductive in accordance with data of an associated main data Line of the corresponding main data lines, and a drive transistor for driving a second node in accordance with a voltage of said first node in response to an operation mode instruction signal and a test mode instruction signal instructing said test mode, data indicative of a compression result being generated at said second node.

9. The semiconductor memory device according to claim 1, further comprising:

a plurality of memory blocks each having a plurality of memory cells arranged in rows and columns;

a plurality of local data lines disposed corresponding to said plurality of memory blocks, the local data tines disposed per memory block being equal in number to a common divider of said first bit width and said second bit width; and IO selection circuitry for selectively connecting a local data line disposed to a selected memory block and the first and one or more second main data lines in accordance with a memory block selection signal designating said selected memory block and a designated data bit width.

10. The semiconductor memory device according to claim 9, wherein a local data line in the local data lines is shared between adjacent memory blocks, and said IO selection circuitry comprises a changing circuit disposed to a predetermined memory block in said plurality of memory blocks, for changing connection between corresponding local data lines and the main data lines of the first and one or more second main data lines in accordance with said block selection signal when the mode of said second bit width is designated.

11. The semiconductor memory device according to claim 10, wherein said predetermined memory block includes a first and second memory blocks and said changing circuit includes a switching circuit for connecting said corresponding local data lines to corresponding first main data lines in said first main data lines when the first memory block of the predetermined memory block is selected, and for connecting said corresponding local data line to corresponding one or more second main data lines in said one or more second main data lines when said second memory block is selected.

12. The semiconductor memory device according to claim 9, wherein said IO selection circuit comprises a circuit disposed corresponding to a predetermined memory block in said plurality of memory blocks, for connecting corresponding local data lines to common main data lines out of said first main data lines, when the predetermined memory block is selected, in both of the mode of said first bit width and the mode of said second bit width.

* * * * *

UNITED STATES PATENT AND TRADEMARK OFFICE
CERTIFICATE OF CORRECTION

PATENT NO.    : 6,650,582 B2
DATED         : November 18, 2003
INVENTOR(S)   : Junko Matsumoto et al.

It is certified that error appears in the above-identified patent and that said Letters Patent is hereby corrected as shown below:

<u>Title page,</u>
Item [73], Assignee, the name of the assignee should be changed from "Mitsubishi Denki Kabushiki Kaisha" to -- Renesas Technology Corp. --.

Signed and Sealed this

Seventeenth Day of February, 2004

JON W. DUDAS
*Acting Director of the United States Patent and Trademark Office*